(12) United States Patent
Diaz et al.

(10) Patent No.: US 11,716,859 B2
(45) Date of Patent: Aug. 1, 2023

(54) MEMORY DEVICE, SEMICONDUCTOR DEVICE, AND METHOD OF FABRICATING SEMICONDUCTOR DEVICE

(71) Applicant: Taiwan Semiconductor Manufacturing Company, Ltd., Hsinchu (TW)

(72) Inventors: Carlos H. Diaz, Los Altos Hills, CA (US); Shy-Jay Lin, Hsinchu County (TW); Ming-Yuan Song, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 96 days.

(21) Appl. No.: 17/319,115

(22) Filed: May 13, 2021

(65) Prior Publication Data
US 2022/0367566 A1 Nov. 17, 2022

(51) Int. Cl.
| | | |
|---|---|---|
| H10B 61/00 | (2023.01) | |
| H01L 23/522 | (2006.01) | |
| H01L 23/528 | (2006.01) | |
| H10N 50/01 | (2023.01) | |
| H10N 50/80 | (2023.01) | |

(52) U.S. Cl.
CPC ......... *H10B 61/20* (2023.02); *H01L 23/5226* (2013.01); *H01L 23/5283* (2013.01); *H10N 50/01* (2023.02); *H10N 50/80* (2023.02)

(58) Field of Classification Search
CPC ............... H01L 27/226; H01L 23/5226; H01L 23/5283; H01L 43/02; H01L 43/12; H10B 61/20; H10N 50/80; H10N 50/01
USPC ........................................................ 257/421
See application file for complete search history.

(56) References Cited

U.S. PATENT DOCUMENTS

| | | | | |
|---|---|---|---|---|
| 8,212,233 | B2 * | 7/2012 | Wang | ..................... H01L 45/145 438/238 |
| 2010/0301303 | A1 * | 12/2010 | Wang | .................. H01L 27/2436 438/238 |
| 2013/0221417 | A1 * | 8/2013 | Lee | ........................ H01L 27/222 257/295 |

\* cited by examiner

*Primary Examiner* — Tu-Tu V Ho
(74) *Attorney, Agent, or Firm* — JCIPRNET

(57) ABSTRACT

A semiconductor device including a semiconductor substrate and an interconnect structure is provided. The semiconductor substrate includes a transistor, wherein the transistor has a source region and a drain region. The interconnect structure is disposed over the semiconductor substrate, wherein the interconnect structure includes a plurality of interlayer dielectric layers, a first via and a memory cell. The plurality of interlayer dielectric layers are over the semiconductor substrate. The first via is embedded in at least two interlayer dielectric layers among the plurality of interlayer dielectric layers and electrically connected with the drain region of the transistor. The memory cell is disposed over the at least two interlayer dielectric layers among the plurality of interlayer dielectric layers and electrically connected with the first via.

20 Claims, 34 Drawing Sheets

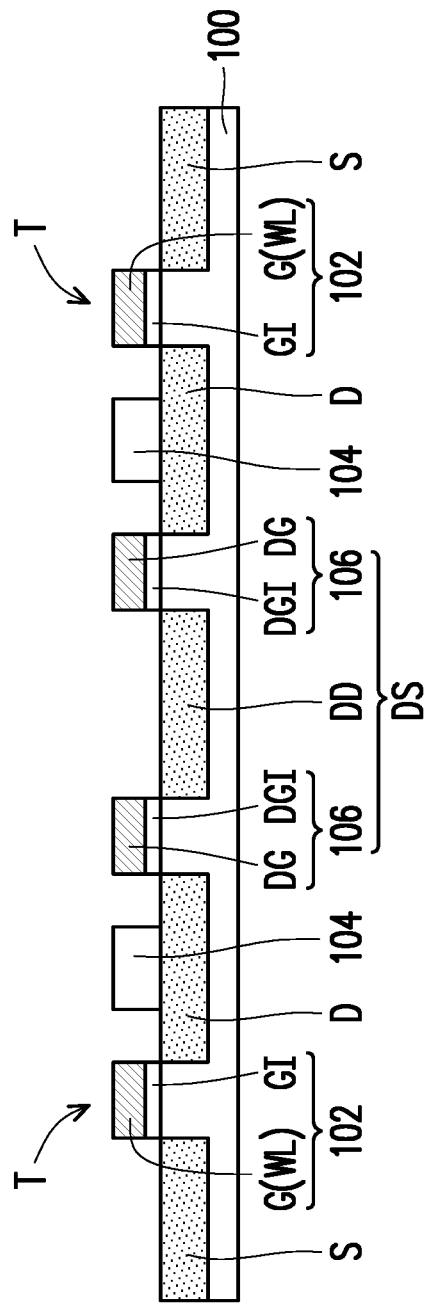
FIG. 10A
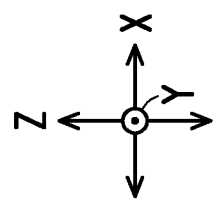

MEMORY DEVICE, SEMICONDUCTOR DEVICE, AND METHOD OF FABRICATING SEMICONDUCTOR DEVICE

BACKGROUND

Some integrated circuit manufacturing processes include manufacturing steps associated with making data storage circuit elements. Data storage elements such as Dynamic Random Access Memory (DRAM), Static Random Access Memory (SRAM), flash memory (a form of non-volatile memory), place data storage circuit elements in an integrated circuit in tightly-packed arrays of elements, to minimize the amount of die area occupied by data storage elements. Magnetoresistive Random Access Memory (MRAM) is a type of data storage element in which information is stored based on the orientation of a magnetic field in a circuit element. MRAM uses the magnetic field to store information rather than the presence/absence of electrical charge in a storage circuit element, or with the quantity of electronic charge stored in a data storage circuit element.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10A through FIG. 10G are schematic cross-sectional views of structures produced at various stages of a fabricating method of a semiconductor device in accordance with some alternative embodiments of the disclosure.

DETAILED DESCRIPTION

Figure 1:
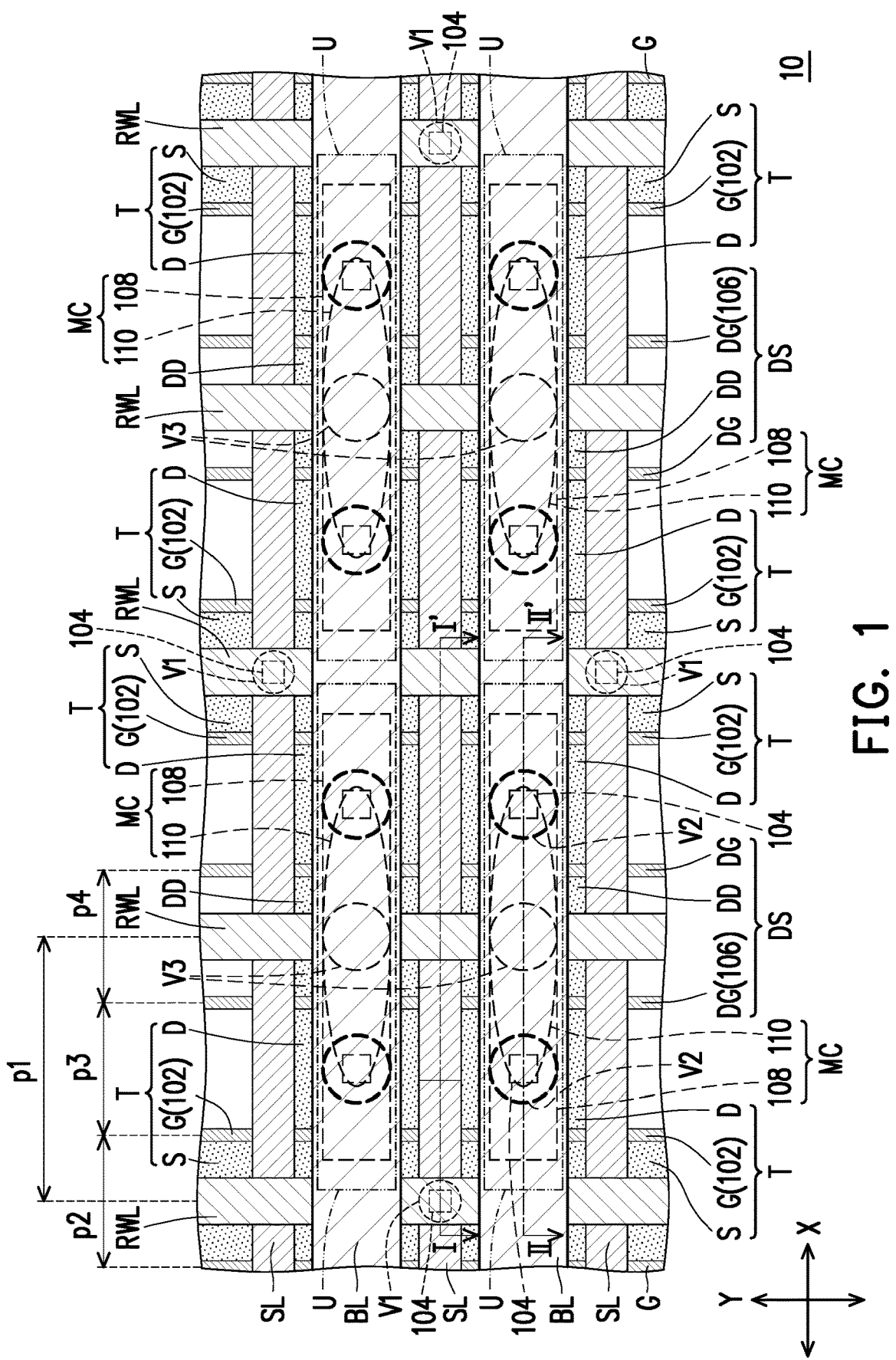
FIG. 1 is a schematic top view of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

MRAM cell is a form of data storage element for integrated circuits. In comparison with other devices, MRAM cell uses small amounts of power to read and write data. MRAM cell also has long data retention times in comparison with other devices. In some embodiments, MRAM cells have multi-year data retention times, while the power consumption for reading and writing data is similar to single read or write operations for DRAM cells. However, in contrast to DRAM cells, MRAM cells are able to store data without regular refreshing of cells in order to preserve stored data.

MRAM cells include magnetic tunnel junctions (MTJs) that enable the use of tunneling magnetoresistance (TMR) to determine the information state of an MRAM cell. A magnetic tunnel junction includes a stack of at least three layers, including a dielectric tunneling barrier layer and two ferromagnetic layers separated by the dielectric tunneling barrier layer. The two ferromagnetic layers includes a reference layer (also called a magnetic pinned layer) and a free layer (also called a magnetic storage layer). The reference layer has a layer of magnetizable material with a locked magnetic field orientation, and the free layer has a layer of magnetizable material where the magnetic field orientation changes between different orientations.

When the magnetic field of the reference layer and the free layer are aligned having the same orientation, the MRAM cell allows a large amount of current to flow in comparison to the allowed amount of current flowing through the MRAM cell when the magnetic field of the reference layer and the magnetic field of the free layer have opposite orientations. The different amounts of current are associated with different information states (e.g., a high amount of current is associated with a "1" bit, and a low amount of current is associated a "0" bit, or vice versa) of the MRAM cell.

MRAM cells are of increasing interest in integrated circuit and semiconductor manufacturing because the magnetic fields of MRAM cells are able to provide long-term data storage. In some embodiments, the magnetization of the reference layer and/or the free layer of an MTJ in an MRAM cell retain the magnetic field orientations associated with a stored bit of information for up to several years, or longer, before thermally-induced field flipping occurs. The read time and the write time of MRAM cells are fast (on the order of DRAM cell reading speed), but the data retention time is at orders of magnitude longer than data retention time of DRAM cells without refreshing.

A stored bit of information may be written into the free layer by applying charge current passing through an MTJ of an MRAM cell. The applied charge current passing through the reference layer becomes spin polarized and exerts a torque on the free layer. The direction of the applied charge current and magnetization of the reference layer determines the direction of generated torque. A large enough torque can switch the magnetic field of the free layer. When performing a "write" procedure of the MRAM cell, a bidirectional charge current is required to determine the information state (i.e. magnetic field) of the free layer such that a "0" bit or a "1" bit may be stored in the MTJ of the MRAM cell.

Figure 2:
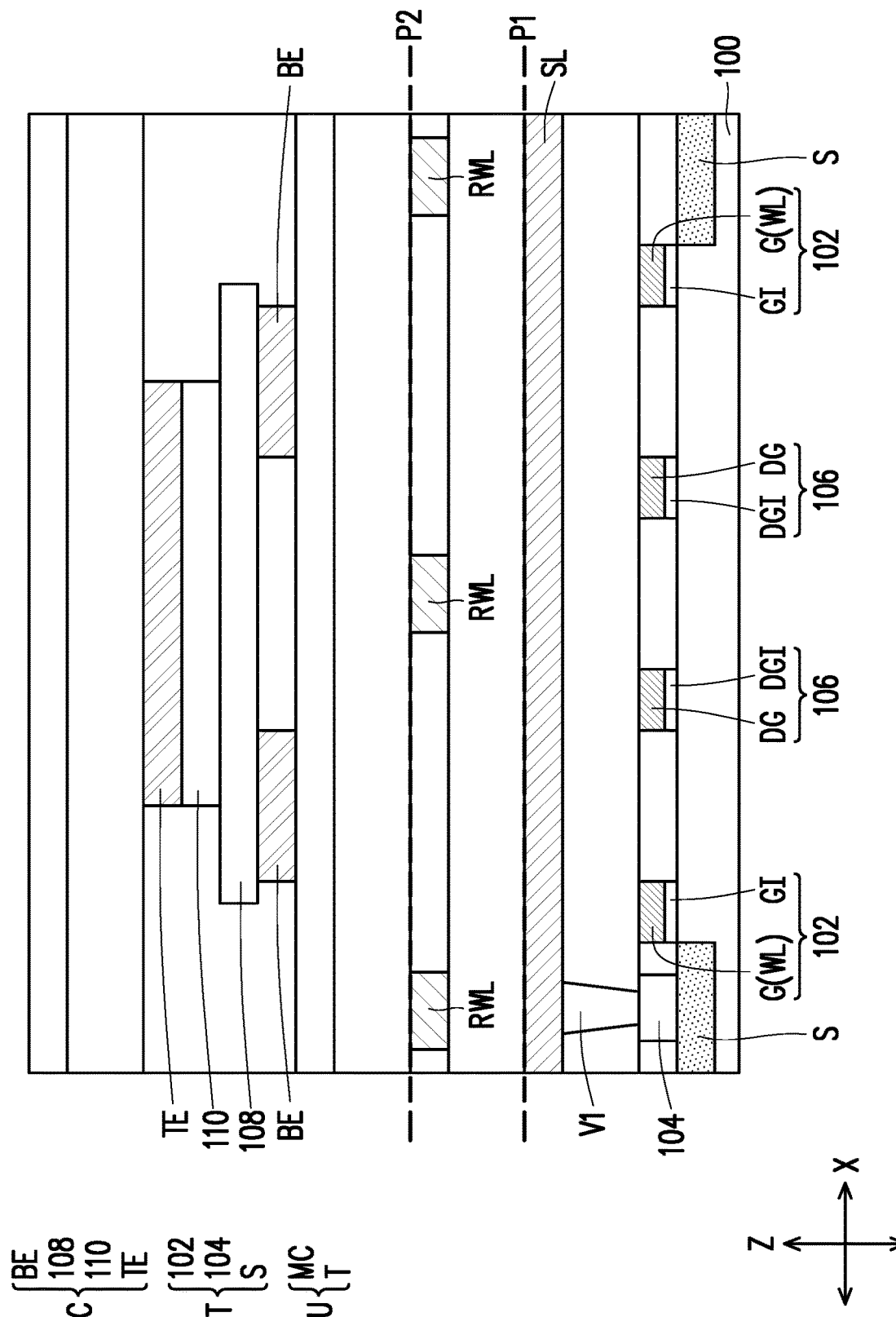
FIG. 2 is a schematic cross-sectional view of a semiconductor device in accordance with some embodiments of the disclosure.
Figure 3:
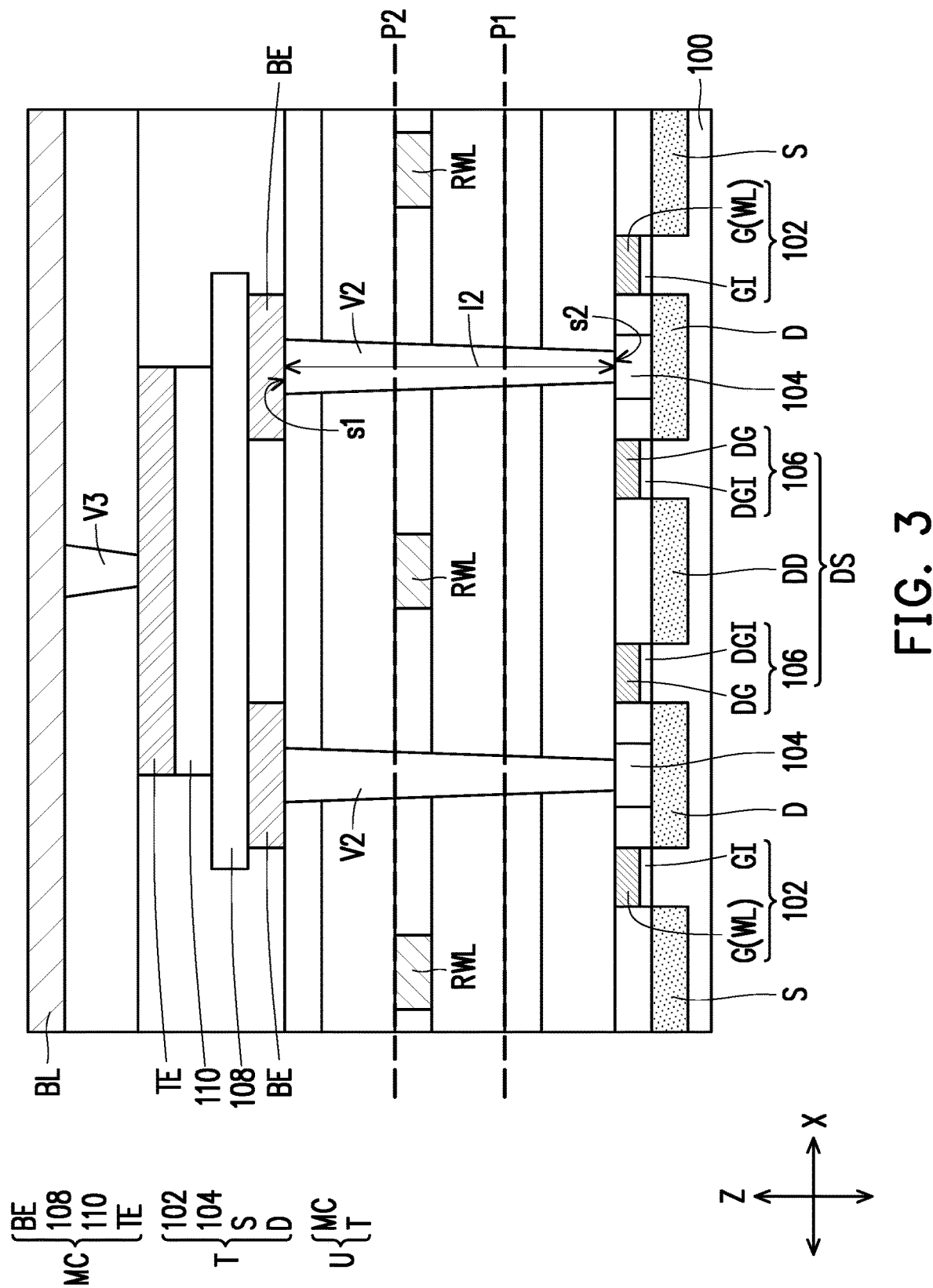
FIG. 3 is a schematic cross-sectional view of a semiconductor device in accordance with some embodiments of the disclosure.

FIG. 1 is a schematic top view of a semiconductor device 10 in accordance with some embodiments of the disclosure, having a cross-section line I-I' and a cross-section line II-II' in a direction X. FIG. 2 is a schematic cross-sectional view of a semiconductor device 10 in accordance with some embodiments of the disclosure. FIG. 3 is a schematic cross-sectional view of a semiconductor device 10 in accordance with some embodiments of the disclosure. FIG. 2 is a schematic cross-sectional view taken along the cross-section line I-I' of FIG. 1, and FIG. 3 is a schematic cross-sectional view taken along the cross-section line II-II' of FIG. 1. It should be noted that the semiconductor device 10 of the disclosure is not limited by the illustration of FIG. 1, and those skilled in the art should understand that the semiconductor device 10 includes other elements, such as driving elements, not shown in FIG. 1. It should be noted that for simplicity and clarity of illustration, some elements of the semiconductor device 10 are omitted in the simplified top view of FIG. 1, such as dielectric layers, electrodes of the memory cell, gate dielectric layers.

Referring to FIG. 1, FIG. 2 and FIG. 3, the semiconductor device 10 includes a semiconductor substrate 100, a plurality of memory cells MC, a plurality of source lines SL, a plurality of rerouting word lines RWL, and a plurality of bit lines BL.

In some embodiments, the semiconductor substrate 100 is a bulk semiconductor substrate. A "bulk" semiconductor substrate refers to a substrate that is entirely composed of at least one semiconductor material. In some embodiments, the bulk semiconductor substrate includes a semiconductor material or a stack of semiconductor materials such as, for example, silicon (Si), germanium (Ge), silicon germanium (SiGe), carbon doped silicon (Si:C), silicon germanium carbon (SiGeC); or an III-V compound semiconductor such as, for example, gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the bulk semiconductor substrate includes a single crystalline semiconductor material such as, for example, single crystalline silicon. In some embodiments, the bulk semiconductor substrate is doped depending on design requirements. In some embodiments, the bulk semiconductor substrate is doped with p-type dopants or n-type dopants. The term "p-type" refers to the addition of impurities to an intrinsic semiconductor that creates deficiencies of valence electrons. Exemplary p-type dopants, i.e., p-type impurities, include, but are not limited to, boron, aluminum, gallium, and indium. "N-type" refers to the addition of impurities that contribute free electrons to an intrinsic semiconductor. Exemplary n-type dopants, i.e., n-type impurities, include, but are not limited to, antimony, arsenic, and phosphorous. If doped, the semiconductor substrate 100, in some embodiments, has a dopant concentration in a range from $1.0 \times 10^{14}$ atoms/cm$^3$ to $1.0 \times 10^{17}$ atoms/cm$^3$. In some embodiments, the semiconductor substrate 100 is a semiconductor-on-insulator (SOI) substrate including a top semiconductor layer formed on an insulator layer (not shown). The top semiconductor layer includes the above-mentioned semiconductor material such as, for example, Si, Ge, SiGe, Si:C, SiGeC; or an III-V compound semiconductor including GaAs, GaP, InP, InAs, InSb, GaAsP, AlInAs, AlGaAs, GaInAs, GaInP, or GaInAsP. The insulator layer is, for example, a silicon oxide layer, or the like. The insulator layer is provided over a base substrate, typically a silicon or glass substrate. In some embodiments, the semiconductor substrate 100 is in wafer form.

In some embodiments, the semiconductor substrate 100 includes a plurality of transistors T. Although eight transistors T are presented in FIG. 1 for illustrative purposes, those skilled in the art can understand that number of the transistors T may be more than what is depicted in FIG. 1, and may be designated based on demand and/or design layout. In some embodiments, the transistor T is a metal-oxide-semiconductor field-effect transistor (MOSFET). Although the transistor T is illustrated in FIG. 2 and FIG. 3 as one type of the MOSFET, the disclosure is not limited thereto. In some alternative embodiments, the transistor T may be a FinFET device, a tunnel FET (TFET) device, a gate-all-around (GAA) device or a suitable device depending on circuitry design. In some embodiments, the transistor T is a lateral transistor, a vertical transistor or a suitable semiconductor device, like a bipolar device.

In some embodiments, the transistor T includes a gate structure 102. In some embodiments, as shown in FIG. 1, the adjacent transistors T arranged along the direction Y share the same gate structure 102. That is to say, the transistors T arranged in one column along the direction Y share the same gate structure 102. In some embodiments, as shown in FIG. 1, the gate structure 102 extends along a direction Y perpendicular to the direction X. Although four gate structures 102 are presented in FIG. 1 for illustrative purposes, those skilled in the art can understand that number of the gate structures 102 may be more than what is depicted in FIG. 1, and may be designated based on demand and/or design layout. In some embodiments, the gate structures 102 are substantially paralleled with one another.

In some embodiments, as shown in FIG. 2 and FIG. 3, the gate structure 102 includes a gate dielectric layer GI and a gate electrode G over the gate dielectric layer GI. In some embodiments, the gate dielectric layer GI includes a high-k material having a dielectric constant (k) greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or a combination thereof. In some embodiments, the gate dielectric layer GI optionally includes a silicate such as HfSiO, LaSiO, AlSiO, or a combination thereof.

In some embodiments, the gate electrode G includes a metal material suitable for forming a metal gate or portion thereof. In some embodiments, the gate electrode G includes a work function metal layer (not shown) and a fill metal layer (not shown) on the work function metal layer. In some embodiments, the work function metal layer is an N-type work function metal layer and/or a P-type work function metal layer. In some embodiments, the N-type work function metal layer includes TiAl, TiAlN, TaCN, conductive metal oxide, and/or a suitable material. In some embodiments, the P-type work function metal layer includes TiN, WN, TaN, conductive metal oxide, and/or a suitable material. In some embodiments, the fill metal layer includes copper, aluminum, tungsten, or a suitable material. In some embodiments, the gate electrode G functions as a word line WL.

Although the gate structure 102 presented in FIG. 1 to FIG. 3 includes the gate dielectric layer GI and the gate electrode G, the disclosure is not limited thereto. In some alternative embodiments, the gate structure 102 may further include a spacer (not shown) aside the gate electrode G. The spacer may include a nitrogen-containing dielectric material, a carbon-containing dielectric material or both. In some embodiments, the spacer includes SiN, SiCN, SiOCN, SiOR (wherein R is an alkyl group such as $CH_3$, $C_2H_5$ or $C_3H_7$), SiC, SiOC, SiON, the like, or a combination thereof.

In some embodiments, the transistor T has a source region S and a drain region D in the semiconductor substrate 100 at opposite sides of the gate structure 102. That is to say, the gate structure 102 is sandwiched and located between the source region S and the drain region D. In some embodiments, as shown in FIG.1, the adjacent transistors T arranged along the direction Y share the same source region S, and the adjacent transistors T arranged along the direction X share the same source region S. In some embodiments, as shown in FIG. 1, the source region S extends along the direction Y. In some embodiments, as shown in FIG.1, the source region S is located between two adjacent gate structures 102. Although three source regions S are presented in FIG. 1 for illustrative purposes, those skilled in the art can understand that number of the source regions S may be more than what is depicted in FIG. 1, and may be designated based on demand and/or design layout. In some embodiments, the source regions S are substantially paralleled with one another. In some embodiments, the source regions S are substantially paralleled with the gate structures 102.

In some embodiments, as shown in FIG. 1, the drain regions D of the transistors T are physically separated from one another. That is to say, the drain regions D are spaced apart from one another. Although eight drain regions D are presented in FIG. 1 for illustrative purposes, those skilled in the art can understand that number of the drain regions D may be more than what is depicted in FIG. 1, and may be designated based on demand and/or design layout.

In some embodiments, each of the source region S and drain region D is a heavily doped region. In such embodiments, the source region S and drain region D are implanted with a P-type dopant or an N-type dopant. However, the disclosure is not limited thereto. In some embodiments, each of the source region S and drain region D includes SiGe for a P-type device. In some alternative embodiments, each of the source region S and drain region D includes silicon carbon (SiC), silicon phosphate (SiP), SiCP or a SiC/SiP multi-layer structure for an N-type device. In some embodiments, the source region S and drain region D is optionally implanted with a P-type dopant or an N-type dopant as needed.

In some embodiments, as shown in FIG. 1 to FIG. 3, the transistor T further has a contact layer 104 disposed on the source region S and the drain region D, as a source/drain structure. However, the disclosure is not limited thereto. In some alternative embodiments, the contact layer 104 is omitted from the transistor T. In some embodiments, the material of the contact layer 104 includes SiGe, SiP, SiC, SiCP or combinations thereof. In some embodiments, the contact layer 104 is optionally doped with an N-type dopant to increase the charge carrier concentrations, and the N-type dopant includes phosphorus. The doping operation may be carried out by in-situ deposition or ion implantation. In this way, the contact layer 104 may be a phosphorus doped silicon layer. In the case that the contact layer 104 is the P doped Si layer, the contact resistance at the interface between a metal layer such as via V2 (shown in FIG. 1 and FIG. 3; described hereinafter) and the contact layer 104 can be reduced. In some alternative embodiments, the material of the contact layer 104 includes metal material. In some embodiments, the contact layer 104 is epitaxially grown on the source regions S and the drain regions D by a method including low pressure chemical vapor deposition (LPCVD), plasma enhanced CVD (PECVD), physical vapor deposition (PVD), atomic layer deposition (ALD), or other suitable process, such as epitaxy methods including vapor-phase epitaxy (VPE), molecular-beam epitaxy (MBE), liquid-phase epitaxy (LPE). In some alternative embodiments, the contact layer 104 may be formed by a plating process. The contact layer 104 has a thickness to apply stress/strain in the structure. For example, but not limited to, the contact layer 104 has a thickness of about 30 nm to about 70 nm.

In some embodiments, the semiconductor substrate 100 further includes a plurality of dummy structures DS. As shown in FIG. 1, the dummy structure DS is disposed between two drain regions D of the two adjacent transistors T along the direction X. In some embodiments, the dummy structure DS includes a plurality of dummy gate structures 106 and a plurality of dummy doped regions DD disposed between any two adjacent dummy gate structures 106. In some embodiments, as shown in FIG. 1, in the dummy structure DS, the dummy gate structures 106 are substantially paralleled with one another and each of the dummy gate structures 106 extends along the direction Y. From another point of view, as shown in FIG. 1, the dummy gate structures 106 are substantially paralleled with the gate structures 102. Although the dummy structure DS is presented in FIG. 1 to include two dummy gate structures 106 for illustrative purposes, those skilled in the art can understand that number of the dummy gate structures 106 in one dummy structure DS may be more than what is depicted in FIG. 1, and may be designated based on demand and/or design layout. However, the disclosure is not limited thereto. In some alternative embodiments, the dummy structure DS includes one dummy gate structure 106 and without including dummy doped region.

In some embodiments, the dummy gate structures 106 are formed during the formation of the transistors T. That is to say, the formation of the dummy gate structures 106 and the gate structures 102 of the transistors T is carried out in the same chamber. However, the disclosure is not limited thereto. In some alternative embodiments, the dummy gate structures 106 and the gate structures 102 of the transistors T are formed in separate processes which are carried out in the same chamber or in different chambers through a wafer translation mechanism. In some embodiments, as shown in FIG. 2 and FIG. 3, the dummy gate structure 106 includes a dummy gate dielectric layer DGI and a dummy gate electrode DG over the dummy gate dielectric layer DGI. In some embodiments, the dummy gate dielectric layer DGI includes a high-k material having a dielectric constant greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or a combination thereof. In some embodiments, the dummy gate dielectric layer DGI optionally includes a silicate such as HfSiO, LaSiO, AlSiO, or a combination thereof. In some embodiments, the material of the dummy gate dielectric layer DGI is the same as the material of the gate dielectric layer GI. In some alternative embodiments, the material of the dummy gate dielectric layer DGI is different from the material of the gate dielectric layer GI.

In some embodiments, the dummy gate electrode DG includes a metal material suitable for forming a metal gate or portion thereof. In some embodiments, the dummy gate electrode DG includes a work function metal layer (not shown) and a fill metal layer (not shown) on the work function metal layer. In some embodiments, the work function metal layer is an N-type work function metal layer and/or a P-type work function metal layer. In some embodiments, the N-type work function metal layer includes TiAl, TiAlN, TaCN, conductive metal oxide, and/or a suitable material. In some embodiments, the P-type work function metal layer includes TiN, WN, TaN, conductive metal oxide, and/or a suitable material. In some embodiments, the fill metal layer includes copper, aluminum, tungsten, or a suitable material. In some embodiments, the material of the dummy gate electrode DG is the same as the material of the gate electrode G. In some alternative embodiments, the material of the dummy gate electrode DG is different from the material of the gate electrode G.

Although the dummy gate structure 106 presented in FIG. 1 to FIG. 3 includes the dummy gate dielectric layer DGI and the dummy gate electrode DG, the disclosure is not limited thereto. In some alternative embodiments, the dummy gate structure 106 may further include a spacer (not shown) aside the dummy gate electrode DG. The spacer may include a nitrogen-containing dielectric material, a carbon-containing dielectric material or both. In some embodiments, the spacer includes SiN, SiCN, SiOCN, SiOR (wherein R is an alkyl group such as $CH_3$, $C_2H_5$ or $C_3H_7$), SiC, SiOC, SiON, the like, or a combination thereof.

In some embodiments, the dummy doped regions DD are disposed in the semiconductor substrate 100 and are physically separated from one another. Although the dummy structure DS is presented in FIG. 1 to include two dummy doped regions DD for illustrative purposes, those skilled in the art can understand that number of the dummy doped regions DD in one dummy structure DS may be more than what is depicted in FIG. 1, and may be designated based on demand and/or design layout. However, the disclosure is not limited thereto. As mentioned above, in some alternative embodiments, the dummy structure DS does not include dummy doped region. In some embodiments, the dummy doped regions DD are formed during the formation of the transistors T. That is to say, the formation of the source regions S and drain regions D of the transistors T and the dummy doped regions DD is carried out in the same chamber. However, the disclosure is not limited thereto. In some alternative embodiments, the source regions S and drain regions D of the transistors T and the dummy doped regions DD are formed in separate processes which are carried out in the same chamber or in different chambers through a wafer translation mechanism. In some embodiments, the dummy doped region DD is a heavily doped region. In such embodiments, the dummy doped region DD is implanted with a P-type dopant or an N-type dopant. However, the disclosure is not limited thereto. In some embodiments, the dummy doped region DD includes SiGe for a P-type device. In some alternative embodiments, the dummy doped region DD includes SiC, SiP, SiCP or a SiC/SiP multi-layer structure for an N-type device. In some embodiments, the dummy doped region DD is optionally implanted with a P-type dopant or an N-type dopant as needed. Further, in some embodiments, the material of the dummy doped region DD is the same as the material of the source region S and the drain region D. In some alternative embodiments, the material of the dummy doped region DD is different from the material of the source region S and the drain region D.

In some embodiments, the drain region D and the dummy doped region DD located at opposite sides of the dummy gate structure 106 along with the said dummy gate structure 106 constitutes a dummy transistor. In some embodiments, the dummy gate structure 106 of the dummy transistor is electrically grounded or electrically floated during the operation of the semiconductor device 10.

In some embodiments, the memory cells MC are disposed over the semiconductor substrate 100. In some embodiments, as shown in FIG. 2 and FIG. 3, the memory cell MC includes bottom electrodes BE, a spin-orbit torque (SOT) layer 108, a magnetic tunnel junction (MTJ) stack 110 and a top electrode TE. However, the disclosure is not limited thereto. In some embodiments, the bottom electrodes BE and the top electrode TE can be omitted from the memory cell MC. In alternative embodiments, the bottom electrodes BE can be omitted from the memory cell MC, while the top electrode TE is included in the memory cell MC. In yet alternative embodiments, the top electrode TE can be omitted from the memory cell MC, while the bottom electrodes BE are included in the memory cell MC.

In some embodiments, the MTJ stack 110 includes ferromagnetic layers (not shown) and an insulating layer (or referred as a tunneling barrier layer) (not shown) sandwiched between the ferromagnetic layers. In some embodiments, the ferromagnetic layers include a reference layer (or referred as a magnetic pinned layer) (not shown) and a free layer (or referred as a magnetic storage layer) (not shown). Magnetization direction of the free layer can be switched by an external magnetic field, whereas magnetization direction of the magnetic pinned layer is fixed. If the magnetizations of the free layer and the magnetic pinned layer are in a parallel orientation, it is more likely that electrons will tunnel through the insulating layer than if the magnetizations are in oppositional (antiparallel) orientation. Consequently, the MTJ stack 110 can be switched between a high resistance state and a low resistance state. In this way, the MTJ stack 110 can be functioned as a storage element. In some embodiments, the MTJ stack 110 has a thickness of about 15 nm to about 30 nm.

In some embodiments, the SOT layer 108 is made of a heavy metal (e.g., W, Pt, Ta, Ru, Co, Fe, Cu, or combinations thereof), a topological insulator (e.g., $Bi_2Se_3$, or MgO) or other suitable materials. The SOT layer 108 may be formed as a conductive patch, and the MTJ stack 110 stands on the SOT layer 108. In some embodiments, as shown in FIG. 2 and FIG. 3, the two bottom electrodes BE are disposed below and in physical contact with two edge portions of the SOT layer 108, while exposes the central portion of the SOT layer 108. In some embodiments, as shown in FIG. 2 and FIG. 3, the SOT layer 108 extends beyond the edges of the bottom electrodes BE. However, the disclosure is not limited thereto. In alternative embodiments, the edge of the SOT layer 108 is aligned with the edges of the bottom electrodes BE. In some embodiments, the SOT layer 108 has a thickness of about 2 nm to about 10 nm. In some embodiments, the material of the bottom electrodes BE includes a metal material. The metal material may include Al, Cu, AlCu, Au, Ti, TiN, Ta, TaN, W, WN, Co or a combination thereof. In some embodiments, the top electrode TE is disposed on the MTJ stack 110. In some embodiments, the material of the top electrode TE includes a metal material. The metal material may include Al, Cu, AlCu, Au, Ti, TiN, Ta, TaN, W, WN, Co or a combination thereof.

In some embodiments, the memory cell MC is electrically connected with two of the transistors T through two vias V2. As such, the memory cell MC and the two transistors T electrically connected with the memory cell MC are collectively referred to as a memory unit U. In other words, the memory unit U of the disclosure is a two-transistor/one-resistor (2T1R) configuration. In some embodiments, the memory units U are arranged in an array. Although four memory units U are presented in FIG. 1 for illustrative purposes, those skilled in the art can understand that number of the memory units U may be more than what is depicted in FIG. 1, and may be designated based on demand and/or design layout.

In some embodiments, as shown in FIG. 1 and FIG. 3, in the memory unit U, each of the two vias V2 continuously extends from the memory cell MC toward the contact layer 104 disposed on the corresponding drain region D to render an electrical connection between the memory cell MC and the corresponding transistor T. Since the electrical connection between the memory cell MC and each corresponding transistor T is provided by the via V2 continuously extending therebetween, a lot of spaces may be saved between the memory cell MC and the corresponding transistors T for the arrangement of routing lines, which includes, for example, the source lines SL (described hereinafter), the rerouting word lines RWL (described hereinafter) and/or other signal lines. As such, more flexibility is provided for the design of the layout of the semiconductor device 10, and the routing capacity of the semiconductor device 10 is improved.

In detail, as shown in FIG. 3, the illustrated top surface s1 of the via V2 is in direct and physical contact with the corresponding bottom electrode BE of the memory cell MC, and the illustrated bottom surface s2 of the via V2 is in direct and physical contact with the contact layer 104 disposed on the corresponding drain region D. That is to say, in the memory unit U, each of the two vias V2 is connected to one of the bottom electrodes BE of the memory cell MC in a one-to-one relationship, and also is connected to one of the two transistors T electrically connected with the memory cell MC in a one-to-one relationship. However, the disclosure is not limited thereto. In some embodiments that the contact layer 104 is omitted from the transistor T, the illustrated bottom surface s2 of the via V2 is in direct and physical contact with the corresponding drain region D. And, in some embodiments that the bottom electrodes BE are omitted from the memory cell MC, the illustrated top surface s1 of the via V2 is in direct and physical contact with the SOT layer 108. In some embodiments, the via V2 has a length 12 of about 200 nm to about 400 nm. In some embodiments, as shown in FIG. 1, the via V2 has a circular shape from a top view. In other words, a cross-section of the via V2 parallel to the top surface s1 or the bottom surface s2 is a circle. However, the disclosure is not limited thereto. In some alternative embodiments, from a top view, the via V2 may have an elliptical shape, a polygonal shape or other suitable shapes. In some embodiments, the material of the via V2 includes a metal material. The metal material may include Al, Cu, AlCu, Au, Ti, TiN, Ta, TaN, W, WN, Co or a combination thereof.

In some embodiments, as shown in FIG. 1, in the memory unit U, the span of the via V2 falls within the span of the SOT layer 108 of the memory cell MC from the top view. That is to say, along a thickness direction Z perpendicular to the direction X and the direction Y, the whole vertical projection of the via V2 is overlapped with the vertical projection of the SOT layer 108. However, the disclosure is not limited thereto. In some alternative embodiments, along the thickness direction Z, the vertical projection of the via V2 may be partially overlapped with the vertical projection of the SOT layer 108. Further, in some embodiments, as shown in FIG. 1, in the memory unit U, the positions of the vias V2 correspond to the two ends of the long axis of the MTJ stack 110. That is to say, the memory cell MC presented in FIG. 1 is an x-type memory cell. However, the disclosure is not limited thereto. In some alternative embodiments, the memory cell MC may be a y-type memory cell or a z-type memory cell.

In some embodiments, the source lines SL are disposed over the semiconductor substrate 100 and between the semiconductor substrate 100 and the memory cells MC. In some embodiments, as shown in FIG. 1, the source lines SL are substantially paralleled with one another and each of the source lines SL extends along the direction X. From another point of view, as shown in FIG. 1, the source lines SL continuously extend to intersect the word lines WL (i.e., the gate electrodes G in the gate structures 102), the dummy gate structures 106 and the source region S. Although three source lines SL are presented in FIG. 1 for illustrative purposes, those skilled in the art can understand that number of the source lines SL may be more than what is depicted in FIG. 1, and may be designated based on demand and/or design layout. In some embodiments, the material of the source line SL includes a metal material. The metal material may include Al, Cu, AlCu, Au, Ti, TiN, Ta, TaN, W, WN, Co or a combination thereof.

In some embodiments, the source lines SL are electrically connected with the source regions S through vias V1. As shown in FIG. 2, the via V1 continuously extends from the source line SL toward the contact layer 104 disposed on the corresponding source region S to render an electrical connection between the source line SL and the corresponding source region S. In other words, the via V1 is in direct and physical contact with the corresponding source line SL and the contact layer 104 disposed on the corresponding source region S. However, the disclosure is not limited thereto. In some embodiments that the contact layer 104 is omitted from the transistor T, the via V2 is in direct and physical contact with the corresponding source region S. In some embodiments, as shown in FIG. 1, the via V1 has a circular shape from a top view. However, the disclosure is not limited thereto. In some alternative embodiments, from a top view, the via V1 may have an elliptical shape, a polygonal shape or other suitable shapes. In some embodiments, the material of the via V1 includes a metal material. The metal material may include Al, Cu, AlCu, Au, Ti, TiN, Ta, TaN, W, WN, Co or a combination thereof.

In some embodiments, as shown in FIG. 1, the adjacent transistors T belonging to the different memory units U and arranged along the direction Y share the same source region S, and the adjacent transistors T belonging to the different memory units U and arranged along the direction X share the same source region S. As such, the source line SL may be shared by the adjacent transistors T belonging to the different memory units U and arranged along the direction Y, and shared by the adjacent transistors T belonging to the different memory units U and arranged along the direction X. Further, in some embodiments, in the memory unit U, the two transistors T are electrically connected with two source lines SL. That is to say, in the memory unit U, the memory cell MC is electrically connected with two source lines SL and two word lines WL. In detail, as shown in FIG. 1, the two source lines SL electrically connected with the memory unit U are located at opposite sides of the memory unit U. From another point of view, the two source lines SL electrically connected with the memory unit U are located aside the two vias V2. That is to say, a virtual plane P1 extending from the illustrated top surface of the source line SL passes through the via V2.

In some embodiments, the rerouting word lines RWL are disposed over the semiconductor substrate 100 and between the source lines SL and the memory cells MC. In some embodiments, as shown in FIG. 1, the rerouting word lines RWL are substantially paralleled with one another and each of the rerouting word lines RWL extends along the direction Y. From another point of view, as shown in FIG. 1, the rerouting word lines RWL continuously extend to intersect the source lines SL, and the rerouting word lines RWL are substantially paralleled with the word lines WL (i.e., the gate electrodes G in the gate structures 102), the dummy gate structures 106 and the source region S. Although five rerouting word lines RWL are presented in FIG. 1 for illustrative purposes, those skilled in the art can understand that number of the rerouting word lines RWL may be more than what is depicted in FIG. 1, and may be designated based on demand and/or design layout. In some embodiments, the material of the rerouting word line RWL includes a metal material. The metal material may include Al, Cu, AlCu, Au, Ti, TiN, Ta, TaN, W, WN, Co or a combination thereof. In some embodiments, the rerouting word lines RWL are electrically connected with the word lines WL (i.e., the gate electrodes G in the gate structures 102) for rerouting the electrical signals of the word lines WL. Although not shown, the rerouting word lines RWL may be electrically connected with the word lines WL in a one-to-one relationship. In some embodiments, the pitch p1 between the most two adjacent rerouting word lines RWL is greater than the pitch p2 between the most two adjacent word lines WL, the pitch p4 between the most two adjacent dummy gate electrodes DG, or the pitch p3 between the word line WL and the dummy gate electrode DG most adjacent to each other. In some embodiments, the pitch p2, the pitch p3 and the pitch p4 are the same as one another. In some embodiments, as shown in FIG. 1 and FIG. 3, the rerouting word lines RWL are located aside the vias V2. That is to say, a virtual plane P2 extending from the illustrated top surface of the rerouting word line RWL passes through the via V2.

In some embodiments, the bit lines BL are disposed over the memory cells MC. In some embodiments, as shown in FIG. 1, the bit lines BL are substantially paralleled with one another and each of the bit lines BL extends along the direction X. From another point of view, as shown in FIG. 1, the bit lines BL continuously extend to intersect the word lines WL (i.e., the gate electrodes G in the gate structures 102), the dummy gate structures 106 and the source region S, and the bit lines BL are substantially paralleled with the source lines SL. Although two bit lines BL are presented in FIG. 1 for illustrative purposes, those skilled in the art can understand that number of the bit lines BL may be more than what is depicted in FIG. 1, and may be designated based on demand and/or design layout. In some embodiments, the material of the bit lines BL includes a metal material. The metal material may include Al, Cu, AlCu, Au, Ti, TiN, Ta, TaN, W, WN, Co or a combination thereof.

In some embodiments, the bit lines BL are electrically connected with the memory cells MC through vias V3. As shown in FIG. 3, the via V3 continuously extends from the bit line BL toward the top electrode TE of the corresponding memory cell MC to render an electrical connection between the bit line BL and the corresponding memory cell MC. In other words, the via V3 is in direct and physical contact with the corresponding bit line BL and the top electrode TE of the corresponding memory cell MC. However, the disclosure is not limited thereto. In some embodiments that the top electrode TE is omitted from the memory cell MC, the via V3 is in direct and physical contact with the MTJ stack 110. In some embodiments, as shown in FIG.1, the via V3 has a circular shape from a top view. However, the disclosure is not limited thereto. In some alternative embodiments, from a top view, the via V3 may have an elliptical shape, a polygonal shape or other suitable shapes. In some embodiments, the material of the via V3 includes a metal material. The metal material may include Al, Cu, AlCu, Au, Ti, TiN, Ta, TaN, W, WN, Co or a combination thereof.

In some embodiments, as shown in FIG. 1, the adjacent memory cells MC arranged along the direction X share the same bit line BL. That is to say, the memory cells MC arranged in one row along the direction X share the same bit line BL. From another point of view, as shown in FIG. 1, each of the memory units U is electrically connected with one bit line BL in a one-to-one relationship. As such, in one memory unit U of the disclosure, five signal lines (i.e., two word lines WL, two source lines SL and one bit line BL) are electrically connected with one memory cell MC for read and write operations. In detail, during a read operation of one memory unit U, one of the two word lines WL is enabled, and a read current passes through one of the two source lines SL electrically connected with the enabled word line WL, the SOT layer 108, the MTJ stack 110 and the bit line BL. And, during a write operation of one memory unit U, the two word lines WL are enabled, and a write current passes through the two source lines SL and the SOT layer 108.

Further, in some embodiments, as shown in FIG. 1, the span of the SOT layer 108 and the span of the MTJ stack 110 fall within the span of the corresponding bit line BL from the top view. That is to say, along the thickness direction Z, the whole vertical projection of the SOT layer 108 and the whole vertical projection of the MTJ stack 110 are overlapped with the vertical projection of the corresponding bit line BL. However, the disclosure is not limited thereto. In some alternative embodiments, along the thickness direction Z, the vertical projection of the SOT layer 108 may be partially overlapped with the vertical projection of the corresponding bit line BL, and the vertical projection of the MTJ stack 110 may be partially overlapped with the vertical projection of the corresponding bit line BL.

The method of manufacturing the semiconductor device 10 will be described in details below with reference to FIG. 4A to FIG. 4G and FIG. 5A to FIG. 5G. FIGS. 4A-4G are schematic cross-sectional views of structures produced at various stages of a fabricating method of the semiconductor device 10 in accordance with some embodiments of the disclosure. FIGS. 5A-5G are schematic cross-sectional views of structures produced at various stages of a fabricating method of the semiconductor device 10 in accordance with some embodiments of the disclosure. FIGS. 4A-4G are schematic cross-sectional views taken along the cross-section line I-I' of FIG. 1, and FIGS. 5A-5G are schematic cross-sectional views taken along the cross-section line II-II' of FIG. 1.

Figure 4A:
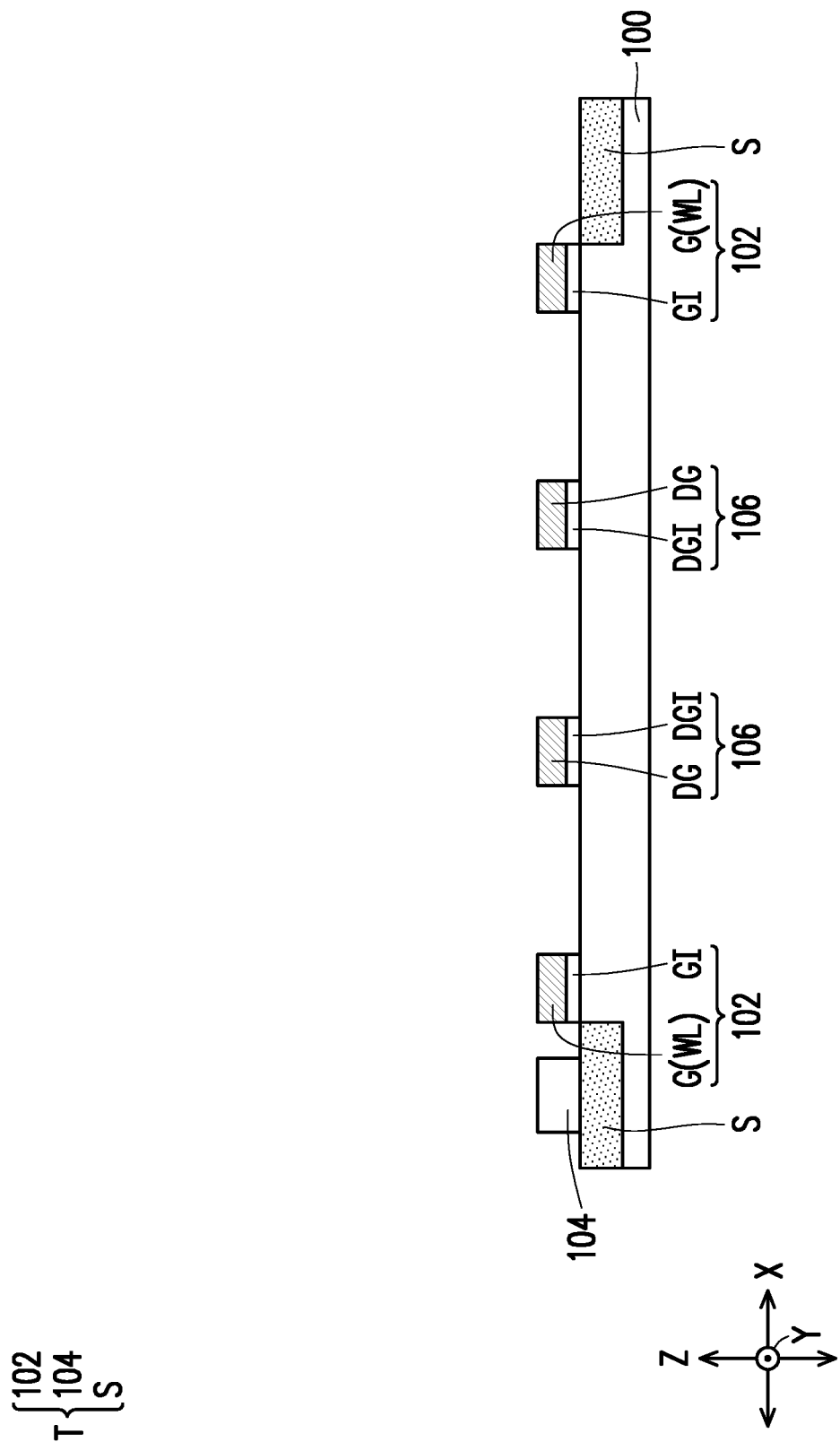
FIG. 4A through FIG. 4G are schematic cross-sectional views of structures produced at various stages of a fabricating method of a semiconductor device in accordance with some embodiments of the disclosure.
Figure 5A:
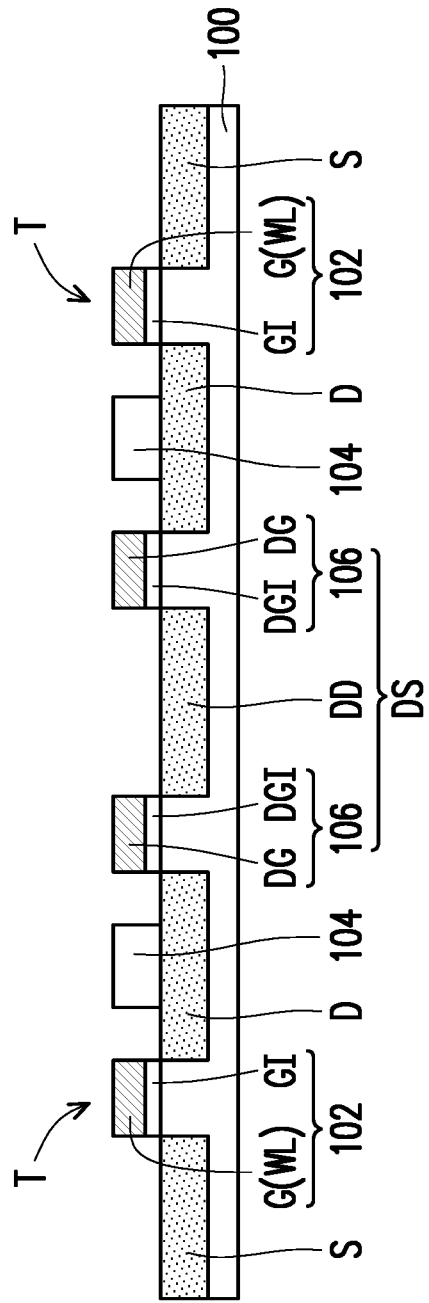
FIG. 5A through FIG. 5G are schematic cross-sectional views of structures produced at various stages of a fabricating method of a semiconductor device in accordance with some embodiments of the disclosure.

Referring to FIG. 1, FIG. 4A and FIG. 5A, a semiconductor substrate 100 including a plurality of transistors T is provided. In some embodiments, the transistor T includes a gate structure 102, a source region S and a drain region D. In some embodiments, the gate structure 102 includes a gate dielectric layer GI and a gate electrode G over the gate dielectric layer GI. In some embodiments, the transistor T further includes a contact layer 104 disposed on the source region S and the drain region D. In some embodiments, the semiconductor substrate 100 further includes a plurality of dummy structures DS. In some embodiments, the dummy structure DS includes a plurality of dummy gate structures 106 and a plurality of dummy doped regions DD disposed between any two adjacent dummy gate structures 106. Details or descriptions (e.g. the materials, formation processes, positioning configurations, etc.) of the semiconductor substrate 100, the gate dielectric layer GI, the gate electrode G, the source region S, the drain region D, the contact layer 104, the dummy gate structure 106 and the dummy doped region DD have been described in conjunction with FIG. 1 to FIG. 3 above, and will not be iterated herein again. Accordingly, for details or descriptions of the semiconductor substrate 100, the gate dielectric layer GI, the gate electrode G, the source region S, the drain region D, the contact layer 104, the dummy gate structure 106 and the dummy doped region DD not iterated herein, please refer to the aforesaid embodiments.

Figure 4B:
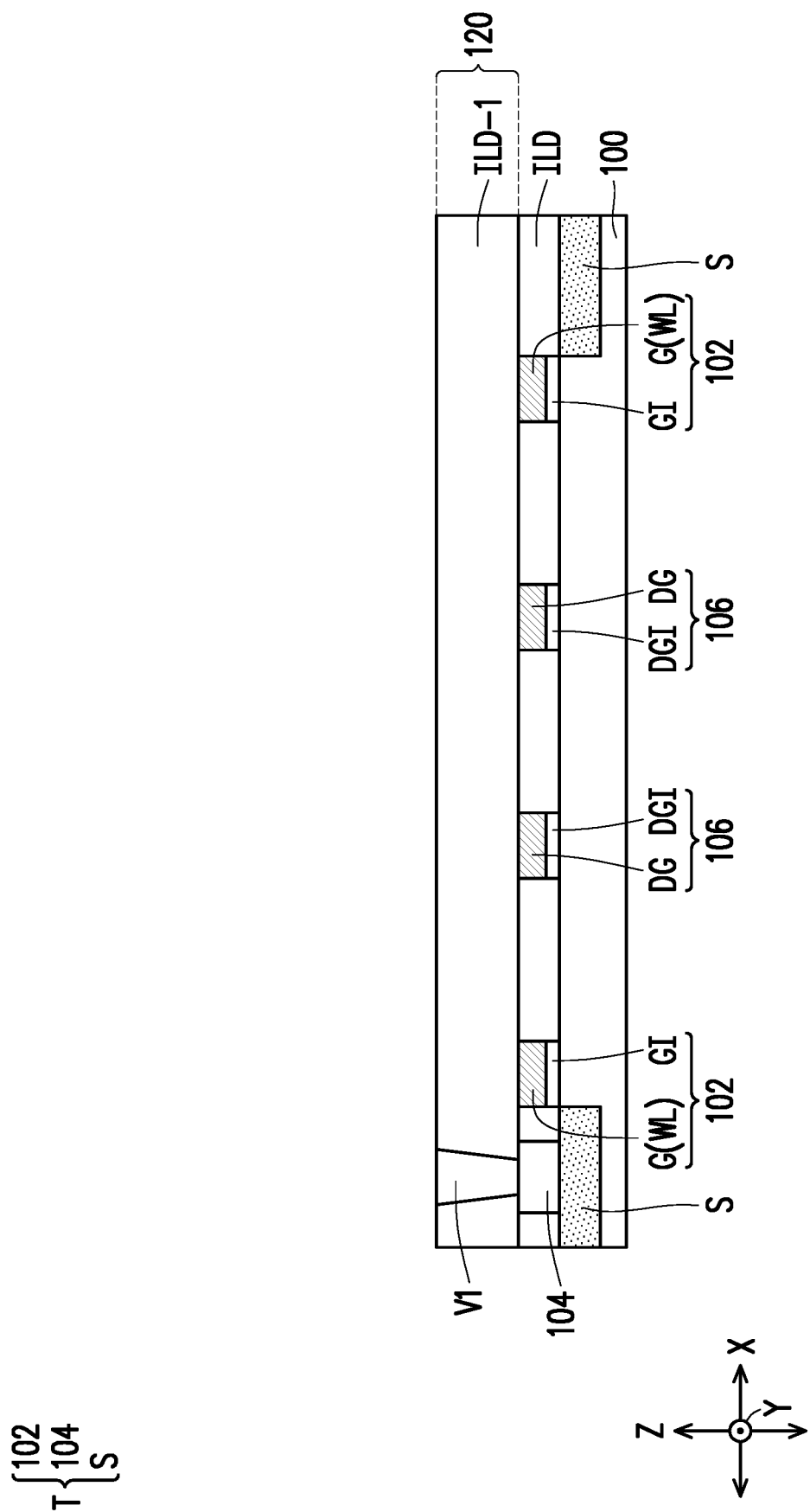
Figure 5B:
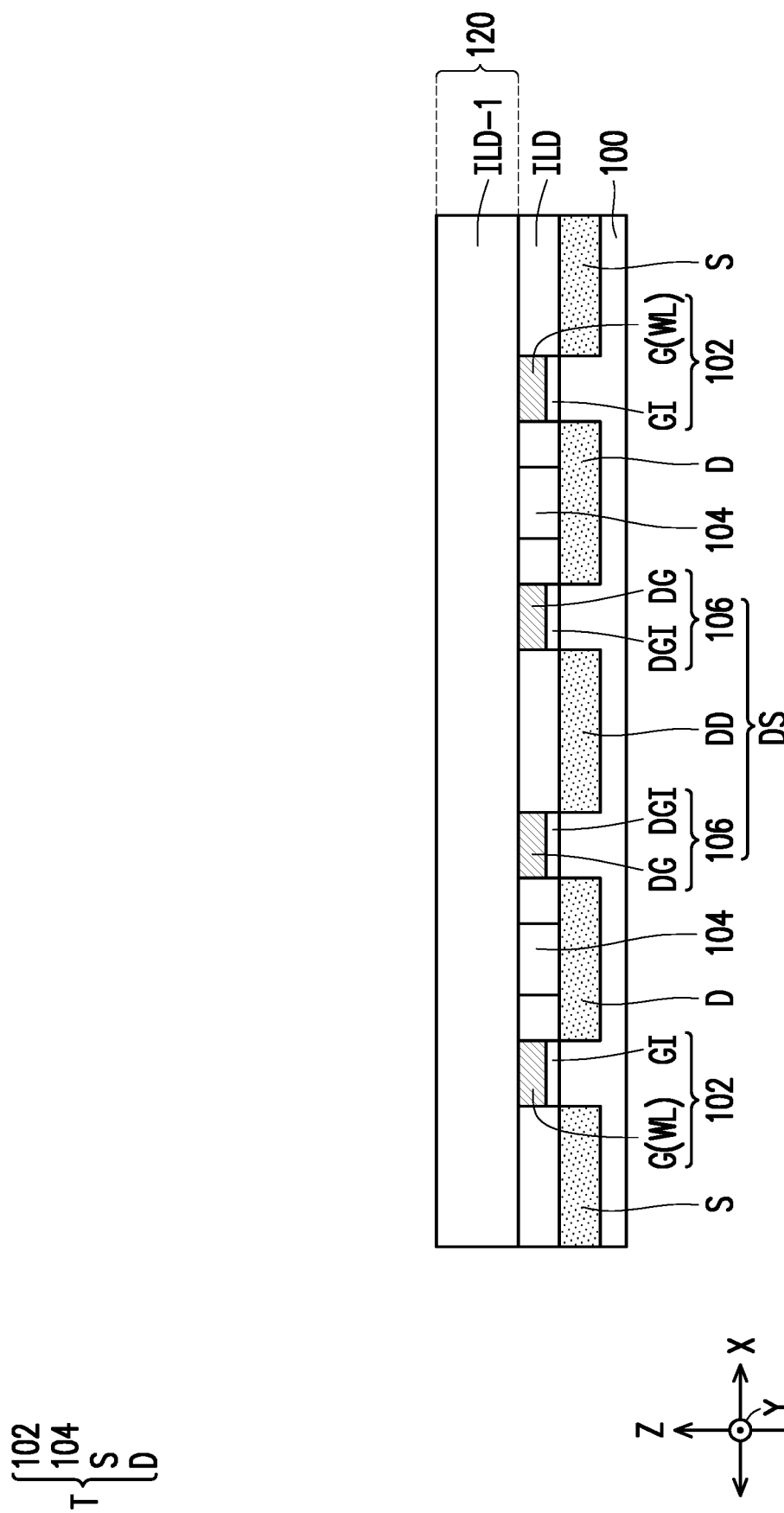

Referring to FIG. 1, FIG. 4B and FIG. 5B, after providing the semiconductor substrate 100, an interlayer dielectric layer ILD is formed over the semiconductor substrate 100. In some embodiments, the interlayer dielectric layer ILD includes silicon oxide. Alternatively, in some embodiments, the interlayer dielectric layer ILD includes a low-k dielectric material having a dielectric constant less than 4. In some embodiments, the low-k dielectric material has a dielectric constant from about 1.2 to about 3.5. In some embodiments, the interlayer dielectric layer ILD includes tetraethylorthosilicate (TEOS) formed oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the interlayer dielectric layer ILD is deposited by CVD, PECVD, PVD, or spin coating. In some embodiments, the interlayer dielectric layer ILD is deposited to have a top surface above the top surface of the gate structures 102 and the top surface of the dummy gate structures 106. The interlayer dielectric layer ILD is subsequently planarized, for example, by a chemical mechanical polishing (CMP) process and/or a recess etch using the gate structures 102 and the dummy gate structures 106 as a polishing and/or etch stop layer. After the planarization, the interlayer dielectric layer ILD has a surface substantially flush or coplanar with the illustrated top surfaces of the gate structures 102 and the illustrated top surfaces of the dummy gate structures 106, as shown in FIG. 4B and FIG. 5B. Further, in some embodiments, as shown in FIG. 4B and FIG. 5B, the surface substantially flush or coplanar with the illustrated top surfaces of the gate structures 102 and the illustrated top surfaces of the dummy gate structures 106 of the interlayer dielectric layer ILD is also substantially flush or coplanar with the illustrated top surface of the contact layer 104.

After the interlayer dielectric layer ILD is formed over the semiconductor substrate 100, an interconnect structure 120 is formed over the semiconductor substrate 100 and the interlayer dielectric layer ILD. The method of forming the interconnect structure 120 will be described in details below with reference to FIG. 4B to FIG. 4G and FIG. 5B to FIG. 5G.

Continue referring to FIG. 4B and FIG. 5B, after forming the interlayer dielectric layer ILD, an interlayer dielectric layer ILD-1 is formed to cover the interlayer dielectric layer ILD. In some embodiments, the interlayer dielectric layer ILD-1 includes silicon oxide. Alternatively, in some embodiments, the interlayer dielectric layer ILD-1 includes a low-k dielectric material having a dielectric constant less than 4. In some embodiments, the low-k dielectric material has a dielectric constant from about 1.2 to about 3.5. In some embodiments, the interlayer dielectric layer ILD-1 includes TEOS formed oxide, undoped silicate glass, or doped silicate glass such as BPSG, FSG, PSG, BSG, and/or other suitable dielectric materials. In some embodiments, the interlayer dielectric layer ILD-1 is deposited by CVD, PECVD, PVD, or spin coating. In some embodiments, the interlayer dielectric layer ILD-1 is deposited to have a top surface. In some embodiments, the material of the interlayer dielectric layer ILD-1 is the same as the material of the interlayer dielectric layer ILD. In some alternative embodiments, the material of the interlayer dielectric layer ILD-1 is different from the material of the interlayer dielectric layer ILD. In some embodiments, an etch stop layer is formed included in the interlayer dielectric layer ILD-1, and the etch stop layer includes SiN, SiC or the like.

After forming the interlayer dielectric layer ILD-1, the interlayer dielectric layer ILD-1 is patterned to form via openings for exposing portions of the contact layer 104 disposed on the source regions S. In some embodiments, the operation of forming the via openings in the interlayer dielectric layer ILD-1 includes removing portions of the interlayer dielectric layer ILD-1 by using an etching technique, such as dry etching method, photolithographic and etching method, directional etching method, or cyclotron resonance plasma etching method. Then, metallic material fills into the via openings in the interlayer dielectric layer ILD-1 to form vias V1 in contact with the exposed portions of the contact layer 104 disposed on the source regions S. In some embodiments, the method of filling metallic material into the via openings in the interlayer dielectric layer ILD-1 includes LPCVD, PECVD, ALD, non-conformal PVD (such as pulsed laser deposition (PLD)), sputtering, evaporative deposition, cathodic arc deposition, e-beam physical vapor deposition, or other suitable process. In some embodiments, a planarization process is performed to remove the metallic material outside the via openings in the interlayer dielectric layer ILD-1. In this way, the illustrated top surface of the via V1 and the illustrated top surface of the interlayer dielectric layer ILD-1 are substantially flush or coplanar with each other. In some embodiments, the planarization process includes a CMP process or a mechanical grinding process. In FIG. 4B, one via V1 is shown for simplicity. Based on the descriptions of FIG. 1 to FIG. 3 mentioned above, those skilled in the art can understand that multiple vias V1 corresponding to the source regions S are formed within the interlayer dielectric layer ILD-1.

In some embodiments, the via V1 is a through via that penetrate through the interlayer dielectric layer ILD-1. That is to say, the via V1 continuously extends through the interlayer dielectric layer ILD-1 along the thickness direction Z. In other words, the via V1 is embedded in and laterally surrounded by the interlayer dielectric layer ILD-1. Other details or descriptions (e.g. the materials, positioning configurations, electrical connection relationships, etc.) of the via V1 have been described in conjunction with FIG. 1 to FIG. 3 above, and will not be iterated herein again. Accordingly, for details or descriptions of the via V1 not iterated herein, please refer to the aforesaid embodiments. Although not shown, in some embodiments, other vias also are formed in the interlayer dielectric layer ILD-1. The material and the fabrication process of the other vias are similar to those of the vias V1 described above, so the details are not iterated herein. The formation of the other vias and the vias V1 may be carried out in the same chamber or in different chambers through a wafer translation mechanism.

Figure 4C:
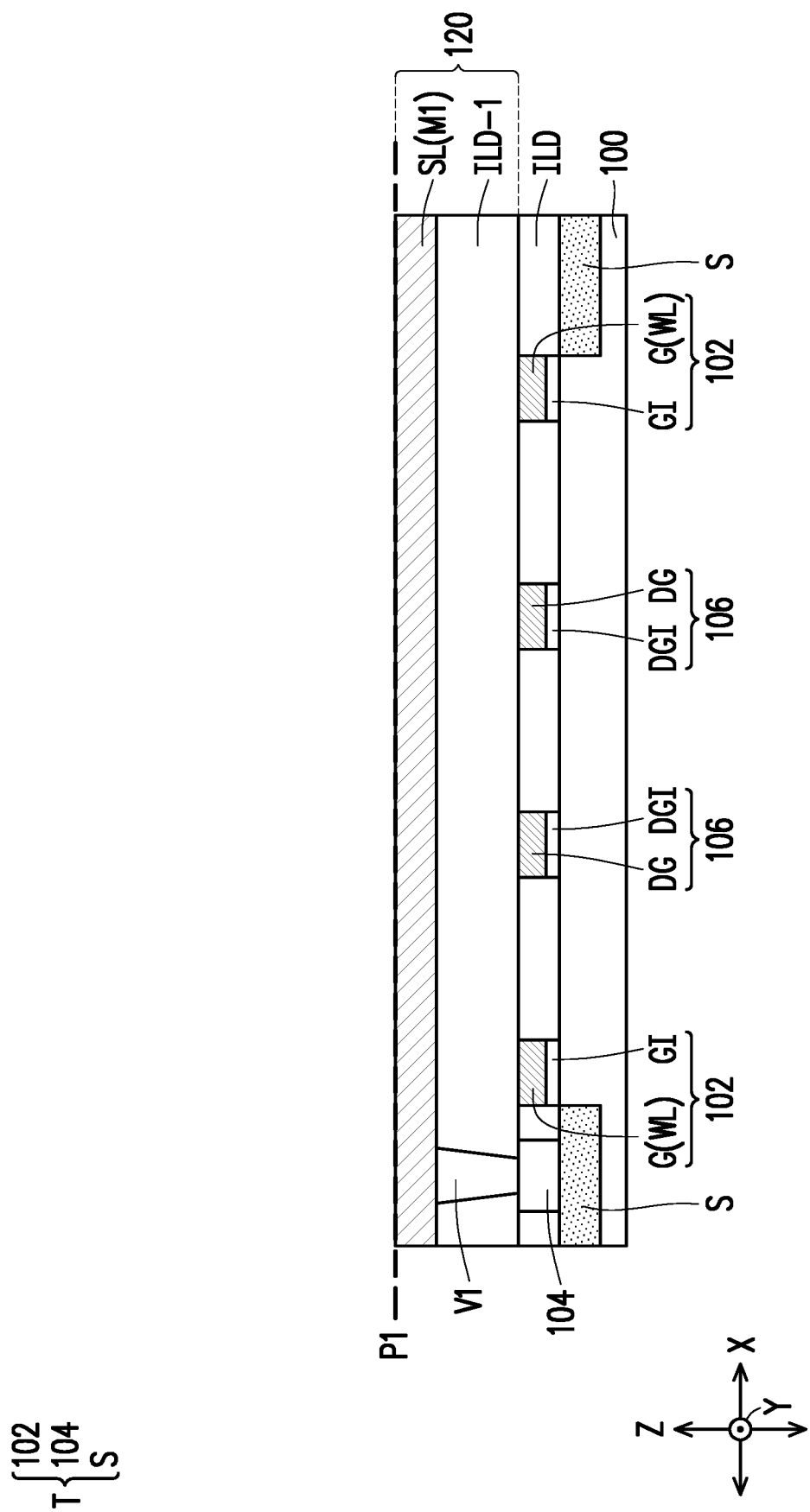
Figure 5C:
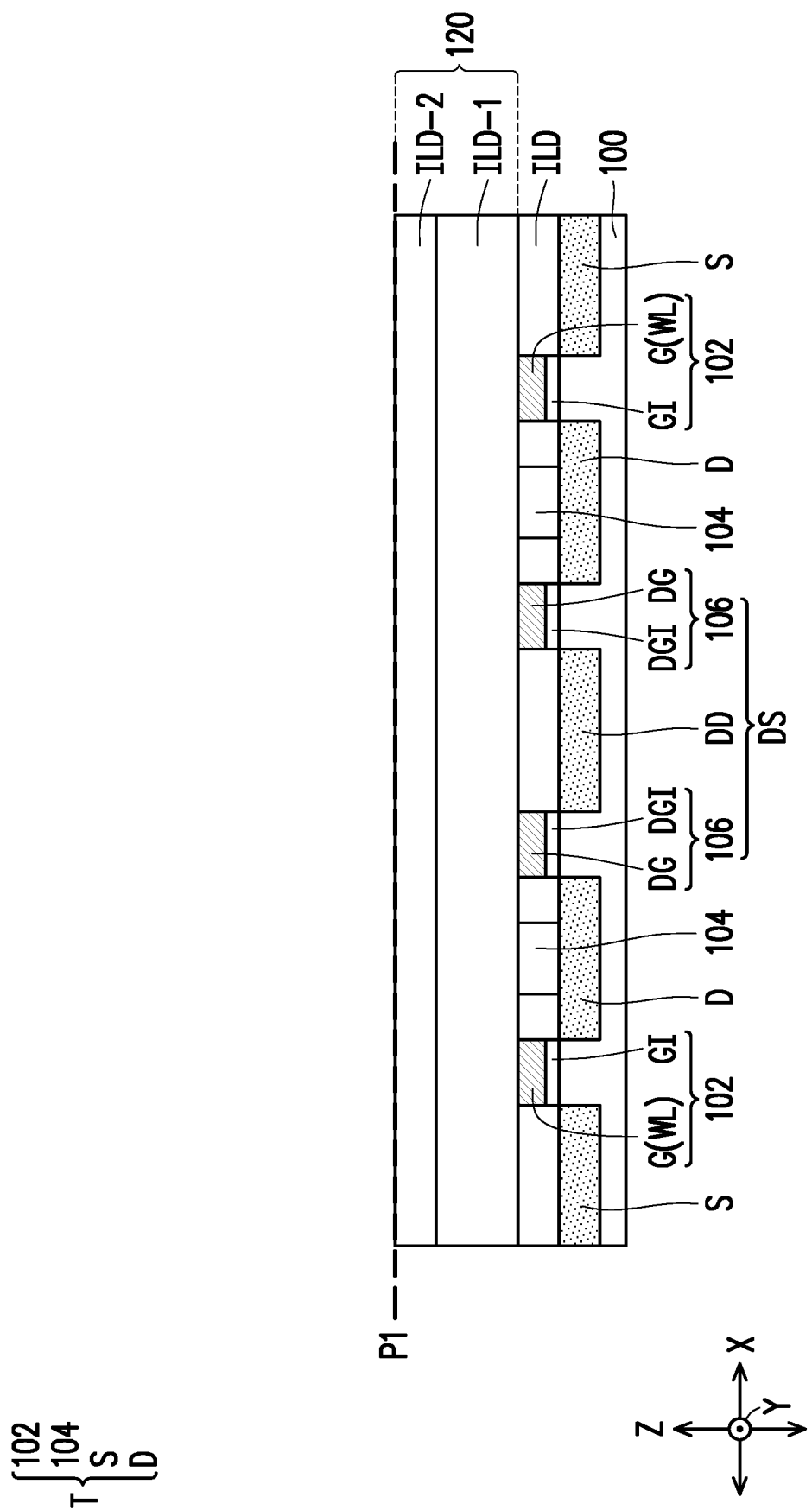

Referring to FIG. 4C and FIG. 5C, an interlayer dielectric layer ILD-2 is formed over the interlayer dielectric layer ILD-1. Since the interlayer dielectric layer ILD-1 is located between the interlayer dielectric layer ILD-2 and the interlayer dielectric layer ILD, the interlayer dielectric layer ILD-1 is referred to as a bottommost interlayer dielectric layer of the interconnect structure 120. The material of the interlayer dielectric layer ILD-2 is similar to the material of the interlayer dielectric layer ILD-1 mentioned above. Therefore, the detailed description related to the material is thus omitted. Also, the fabrication process of the interlayer dielectric layer ILD-2 is similar with the fabrication process of the interlayer dielectric layer ILD-1, and thus the detailed description related to the fabrication process is thus omitted.

After forming the interlayer dielectric layer ILD-2, the interlayer dielectric layer ILD-2 is patterned to formed trenches to be filled by metallic material to form a metal layer M1. In some embodiments, the patterning technique is photolithographic and etching method such as deep ultraviolet (DUV) photolithography using a mask and plasma etching. In some embodiments, the method of filling metallic material into the trenches in the interlayer dielectric layer ILD-2 includes LPCVD, PECVD, ALD, non-conformal PVD (such as PLD), sputtering, evaporative deposition, cathodic arc deposition, e-beam physical vapor deposition, or other suitable process. In some embodiments, a planarization process is performed to remove the metallic material outside the trenches in the interlayer dielectric layer ILD-2, such that the illustrated top surface of the metal layer M1 and the illustrated top surface of the interlayer dielectric layer ILD-2 are substantially flush or coplanar with each other. With such configuration, the metal layer M1 is embedded in the interlayer dielectric layer ILD-2. From another point of view, a virtual plane P1 extending from the illustrated top surface of the metal layer M1 is substantially flush or coplanar with the illustrated top surface of the interlayer dielectric layer ILD-2. In some embodiments, the planarization process includes a CMP process or a mechanical grinding process. In some embodiments, as shown in FIG. 4B to FIG. 4C and FIG. 5B to FIG. 5C, the metal layer M1 and the vias V1 are formed in separate processes. In such embodiments, the formation of the metal layer M1 and the vias V1 may be carried out in the same chamber or in different chambers through a wafer translation mechanism. However, the disclosure is not limited thereto. In some alternative embodiments, a dual damascene method is applied to form the metal layer M1 and the vias V1. In such case, the trenches for the metal layer M1 are patterned in the interlayer dielectric layer ILD-2 before filling the via openings to form the vias V1, so that the metal layer M1 and the vias V1 are formed at the same time. In some embodiments, the material of the metal layer M1 is the same as the material of the vias V1. In some alternative embodiments, the material of the metal layer M1 is different from the material of the vias V1.

In some embodiments, the metal layer M1 includes a plurality of source lines SL. In FIG. 4C, one source line SL is shown for simplicity. Based on the descriptions of FIG. 1 to FIG. 3 mentioned above, those skilled in the art can understand that multiple source lines SL are formed within the interlayer dielectric layer ILD-2. In some embodiments, as shown in FIG. 4C, the source line SL extends horizontally on the illustrated top surface of the interlayer dielectric layer ILD-2 along the direction X. Other details or descriptions (e.g. the materials, positioning configurations, electrical connection relationships, etc.) of the source line SL have been described in conjunction with FIG. 1 to FIG. 3 above, and will not be iterated herein again. Accordingly, for details or descriptions of the source line SL not iterated herein, please refer to the aforesaid embodiments. Although not shown, in some embodiments, the metal layer M1 further includes other routing lines (including other signal lines), conductive pads or a combination thereof.

Figure 4D:
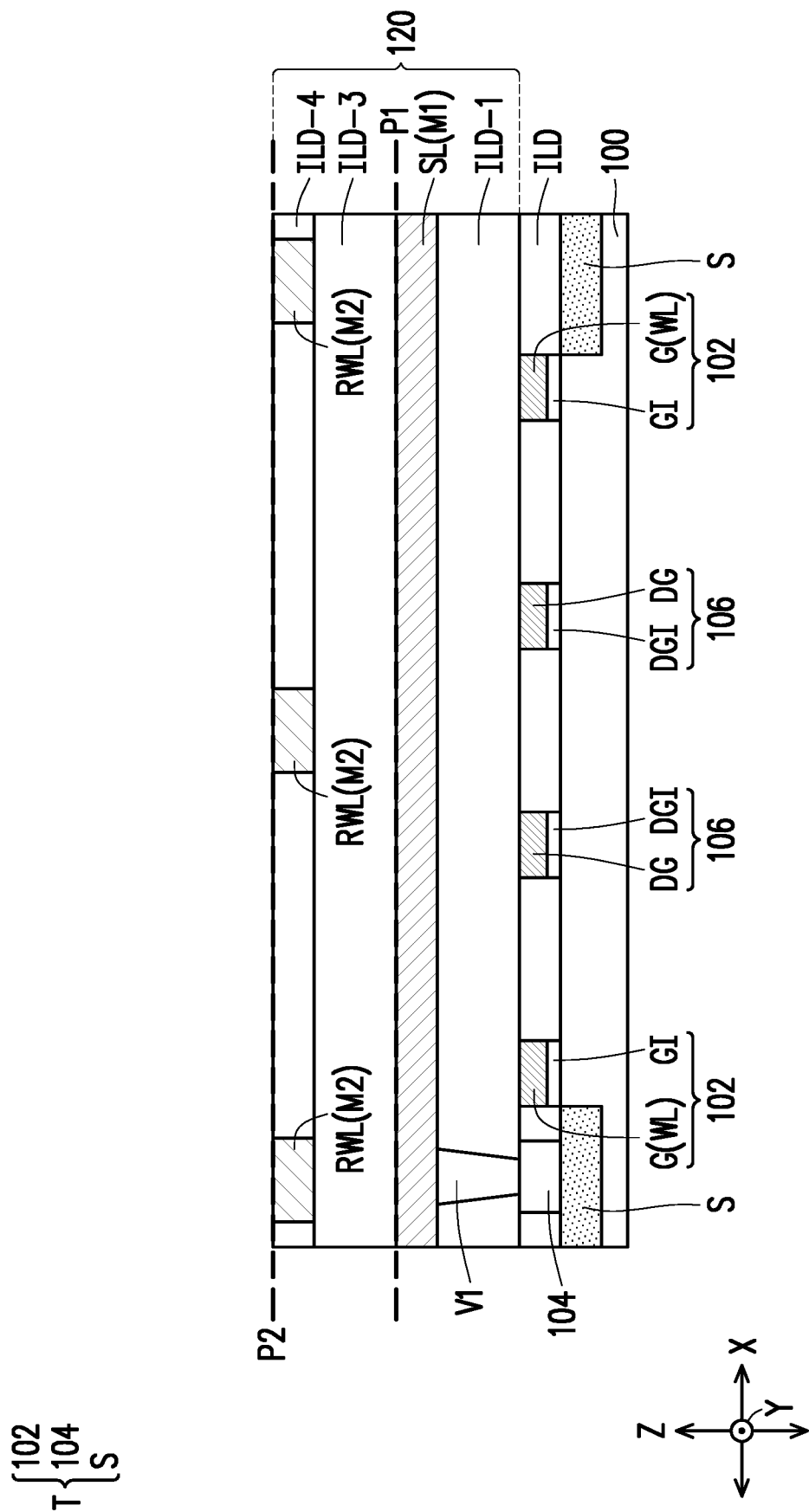
Figure 5D:
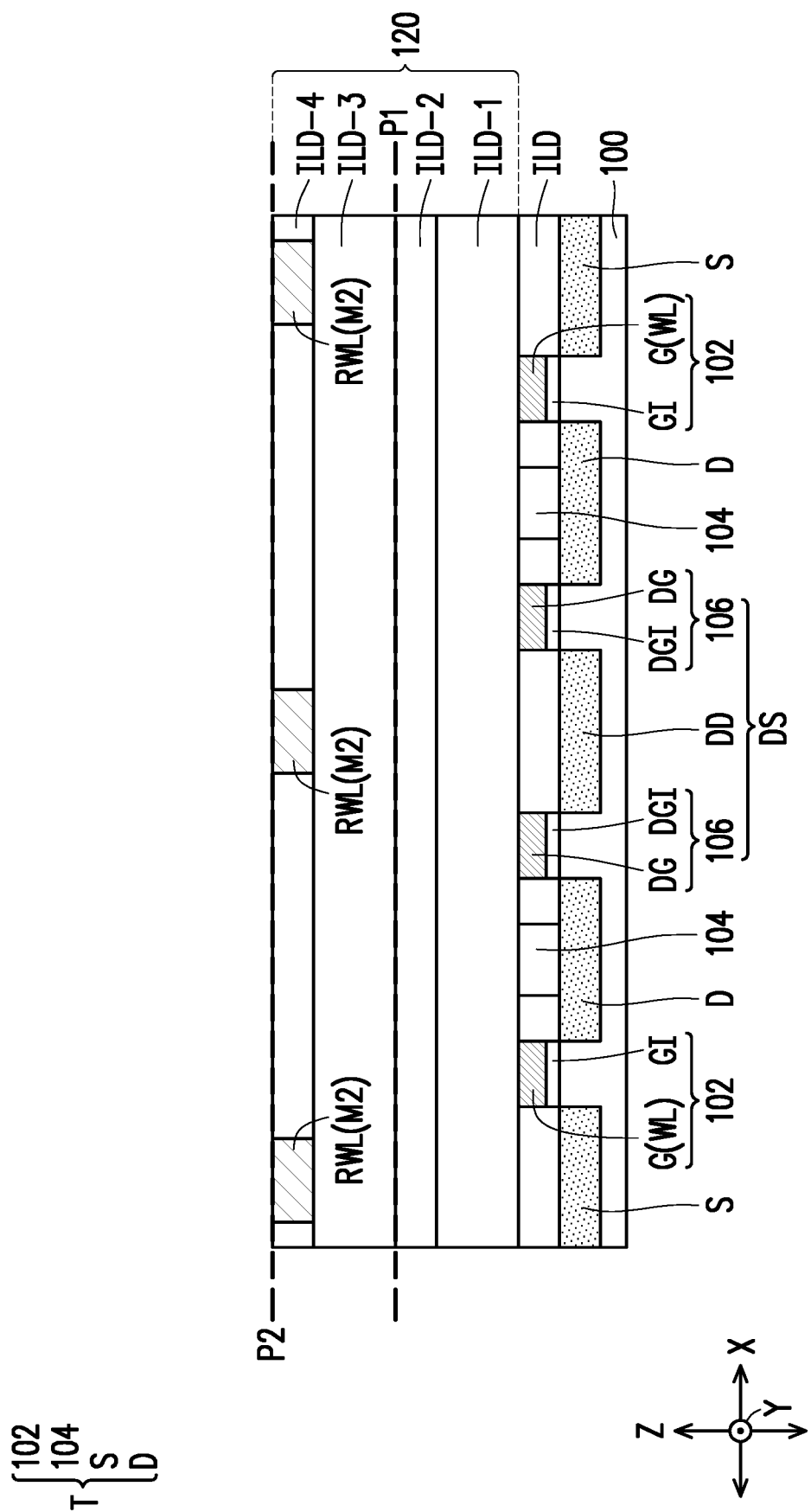

Referring to FIG. 4D and FIG. 5D, an interlayer dielectric layer ILD-3 is formed over the interlayer dielectric layer ILD-2. The material and the fabrication process of the interlayer dielectric layer ILD-3 are similar to those of the interlayer dielectric layer ILD-1 described above, so the details are not iterated herein. Although not shown, in some embodiments, some vias are embedded in the interlayer dielectric layer ILD-3. The material and the fabrication process of the said some vias are similar to those of the vias V1 described above, so the details are not iterated herein.

Continue referring to FIG. 4D and FIG. 5D, after forming the interlayer dielectric layer ILD-3, an interlayer dielectric layer ILD-4 is formed to cover the interlayer dielectric layer ILD-3. The material and the fabrication process of the interlayer dielectric layer ILD-4 are similar to those of the interlayer dielectric layer ILD-1 described above, so the details are not iterated herein. After forming the interlayer dielectric layer ILD-4, the interlayer dielectric layer ILD-4 is patterned to form trenches to be filled by metallic material to form a metal layer M2. In some embodiments, the patterning technique is photolithographic and etching method such as DUV photolithography using a mask and plasma etching. In some embodiments, the method of filling metallic material into the trenches in the interlayer dielectric layer ILD-4 includes LPCVD, PECVD, ALD, non-conformal PVD (such as PLD), sputtering, evaporative deposition, cathodic arc deposition, e-beam physical vapor deposition, or other suitable process. In some embodiments, a planarization process is performed to remove the metallic material outside the trenches in the interlayer dielectric layer ILD-4, such that the illustrated top surface of the metal layer M2 and the illustrated top surface of the interlayer dielectric layer ILD-4 are substantially flush or coplanar with each other. With such configuration, the metal layer M2 is embedded in the interlayer dielectric layer ILD-4. From another point of view, a virtual plane P2 extending from the illustrated top surface of the metal layer M2 is substantially flush or coplanar with the illustrated top surface of the interlayer dielectric layer ILD-4. In some embodiments, the planarization process includes a CMP process or a mechanical grinding process.

In some embodiments, the metal layer M2 includes a plurality of rerouting word lines RWL. In FIG. 4D and FIG. 5D, three rerouting word lines RWL are shown for simplicity. Based on the descriptions of FIG. 1 to FIG. 3 mentioned above, those skilled in the art can understand that more than three rerouting word lines RWL are formed within the interlayer dielectric layer ILD-4. In some embodiments, as shown in FIG. 1, FIG. 4D and FIG. 5D, the rerouting word line RWL extends horizontally on the illustrated top surface of the interlayer dielectric layer ILD-3 along the direction Y. Other details or descriptions (e.g. the materials, positioning configurations, electrical connection relationships, etc.) of the rerouting word line RWL have been described in conjunction with FIG. 1 to FIG. 3 above, and will not be iterated herein again. Accordingly, for details or descriptions of the rerouting word line RWL not iterated herein, please refer to the aforesaid embodiments. Although not shown, in some embodiments, the metal layer M2 further includes other routing lines (including other signal lines), conductive pads or a combination thereof.

Figure 4E:
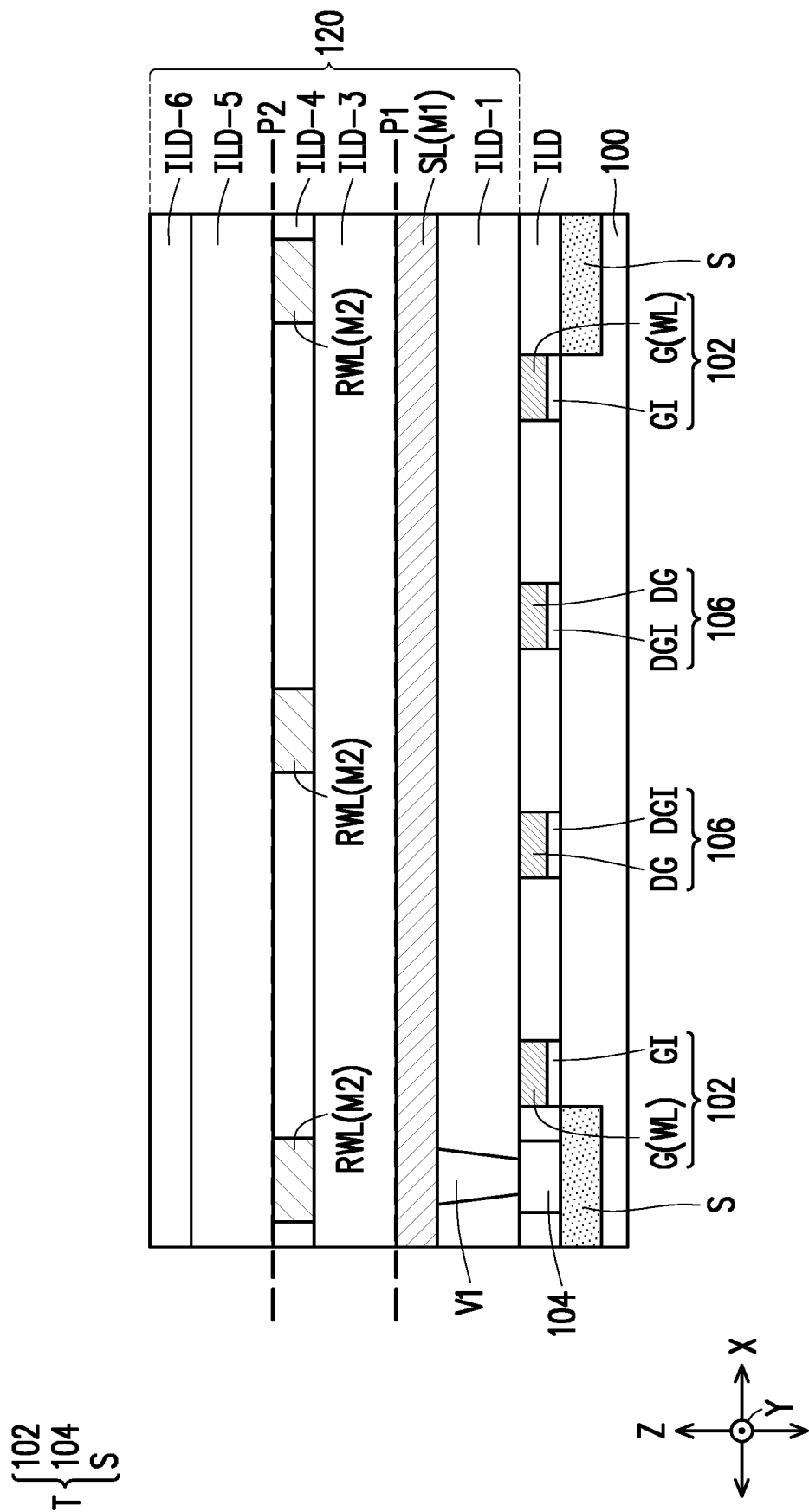
Figure 5E:
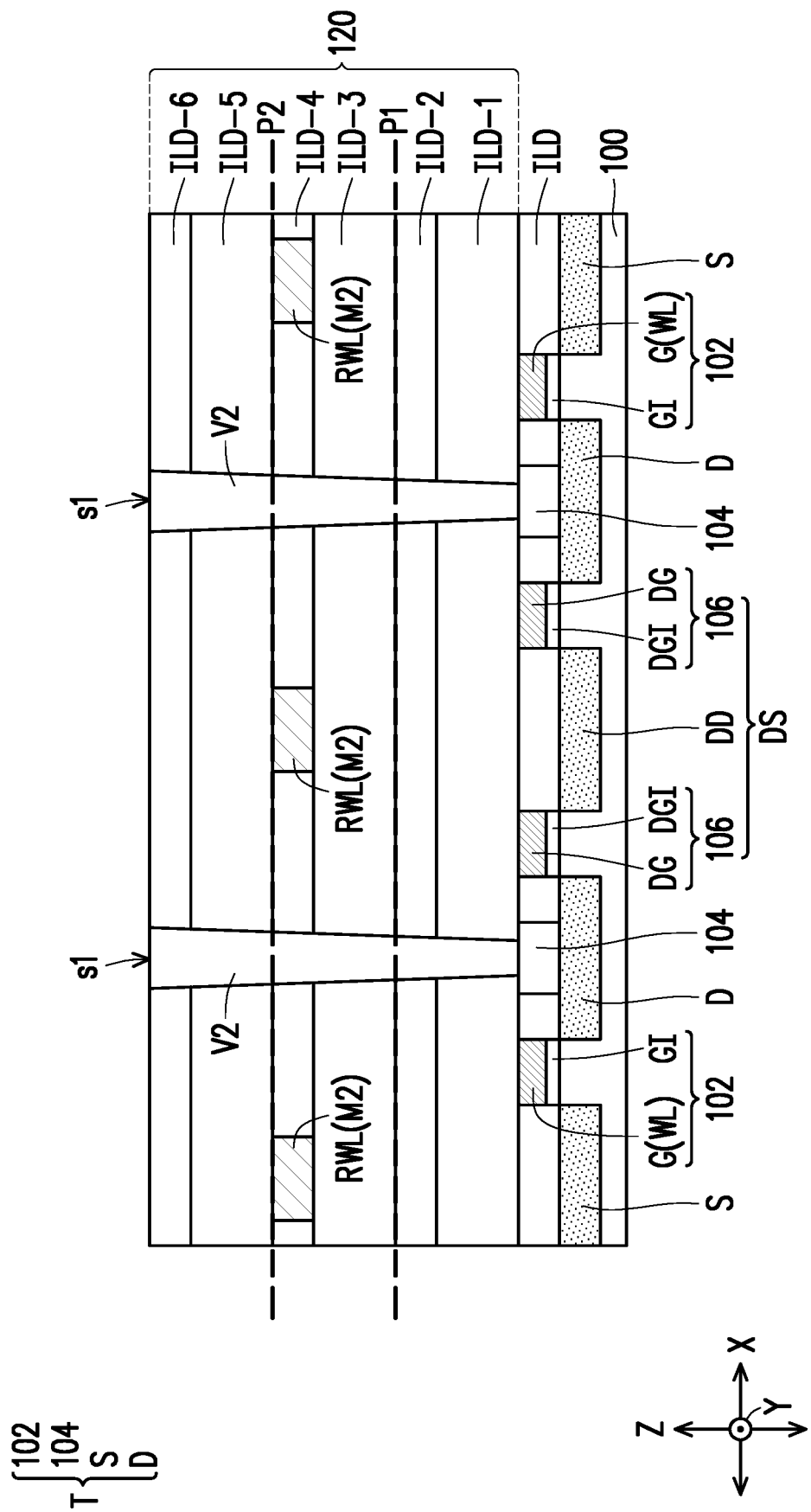

Referring to FIG. 4E and FIG. 5E, an interlayer dielectric layer ILD-5 is formed over the interlayer dielectric layer ILD-4. The material and the fabrication process of the interlayer dielectric layer ILD-5 are similar to those of the interlayer dielectric layer ILD-1 described above, so the details are not iterated herein. Although not shown, in some embodiments, some vias are embedded in the interlayer dielectric layer ILD-5. The material and the fabrication process of the said some vias are similar to those of the vias V1 described above, so the details are not iterated herein.

Continue referring to FIG. 4E and FIG. 5E, after forming the interlayer dielectric layer ILD-5, an interlayer dielectric layer ILD-6 is formed to cover the interlayer dielectric layer ILD-5. The material and the fabrication process of the interlayer dielectric layer ILD-6 are similar to those of the interlayer dielectric layer ILD-1 described above, so the details are not iterated herein. After forming the interlayer dielectric layer ILD-6, the interlayer dielectric layer ILD-6, the interlayer dielectric layer ILD-5, the interlayer dielectric layer ILD-4, the interlayer dielectric layer ILD-3, the interlayer dielectric layer ILD-2 and the interlayer dielectric layer ILD-1 are patterned to form via openings for exposing portions of the contact layer 104 disposed on the drain regions D. In some embodiments, the operation of forming the via openings includes removing portions of the interlayer dielectric layers ILD-1 to ILD-6 by using an etching technique, such as dry etching method, photolithographic and etching method, directional etching method, or cyclotron resonance plasma etching method. Then, metallic material fills into the via openings in the interlayer dielectric layers ILD-1 to ILD-6 to form vias V2 in contact with the exposed portions of the contact layer 104 disposed on the drain regions D. In some embodiments, the method of filling metallic material into the via openings in the interlayer dielectric layers ILD-1 to ILD-6 includes LPCVD, PECVD, ALD, non-conformal PVD (such as PLD), sputtering, evaporative deposition, cathodic arc deposition, e-beam physical vapor deposition, or other suitable process. In some embodiments, a planarization process is performed to remove the metallic material outside the via openings in the interlayer dielectric layers ILD-1 to ILD-6. In this way, the illustrated top surface s1 of the via V2 and the illustrated top surface of the interlayer dielectric layer ILD-6 are substantially flush or coplanar with each other. In some embodiments, the planarization process includes a CMP process or a mechanical grinding process. In FIG. 5E, two vias V2 are shown for simplicity. Based on the descriptions of FIG. 1 to FIG. 3 mentioned above, those skilled in the art can understand that more than two vias V2 are formed within the interlayer dielectric layers ILD-1 to ILD-6.

In some embodiments, the via V2 is a through via that penetrate through the interlayer dielectric layers ILD-1 to ILD-6. That is to say, the via V2 continuously extends through six interlayer dielectric layers of the interconnect structure 120 along the thickness direction Z. In other words, the via V2 is embedded in and laterally surrounded by six interlayer dielectric layers of the interconnect structure 120. Although the via V2 presented in FIG. 5E penetrates through six interlayer dielectric layers of the interconnect structure 120 for illustrative purposes, the disclosure is not limited thereto. The number of the interlayer dielectric layers through which the via V2 penetrates is not limited thereto, and may be equal to or greater than 2 based on design requirements. In some embodiments, as shown in FIG. 1, FIG. 4D to FIG. 4E and FIG. 5D to FIG. 5E, the via V2 embedded in the interlayer dielectric layers ILD-1 to ILD-6 is spaced apart from the source line SL by the interlayer dielectric layer ILD-2 along the direction Y, and is spaced apart from the rerouting word line RWL by the interlayer dielectric layer ILD-4 along the direction X. Other details or descriptions (e.g. the materials, positioning configurations, electrical connection relationships, etc.) of the via V2 have been described in conjunction with FIG. 1 to FIG. 3 above, and will not be iterated herein again. Accordingly, for details or descriptions of the via V2 not iterated herein, please refer to the aforesaid embodiments. Although not shown, in some embodiments, a metal layer including routing lines (e.g., signal lines), conductive pads or a combination thereof is formed in the interlayer dielectric layer ILD-6. The material and the fabrication process of the said metal layer are similar to those of the metal layer M1 described above, so the details are not iterated herein.

Figure 4F:
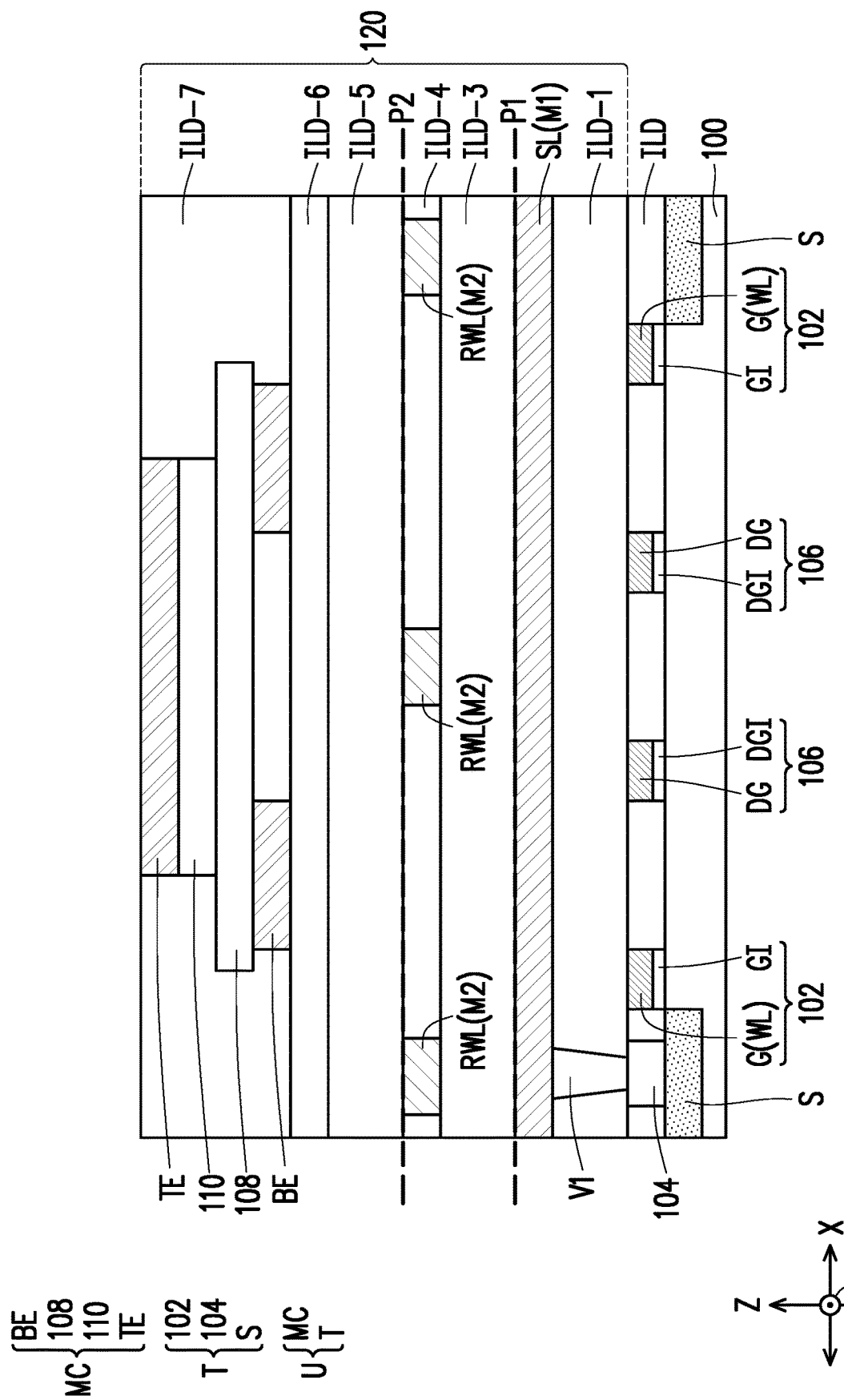
Figure 5F:
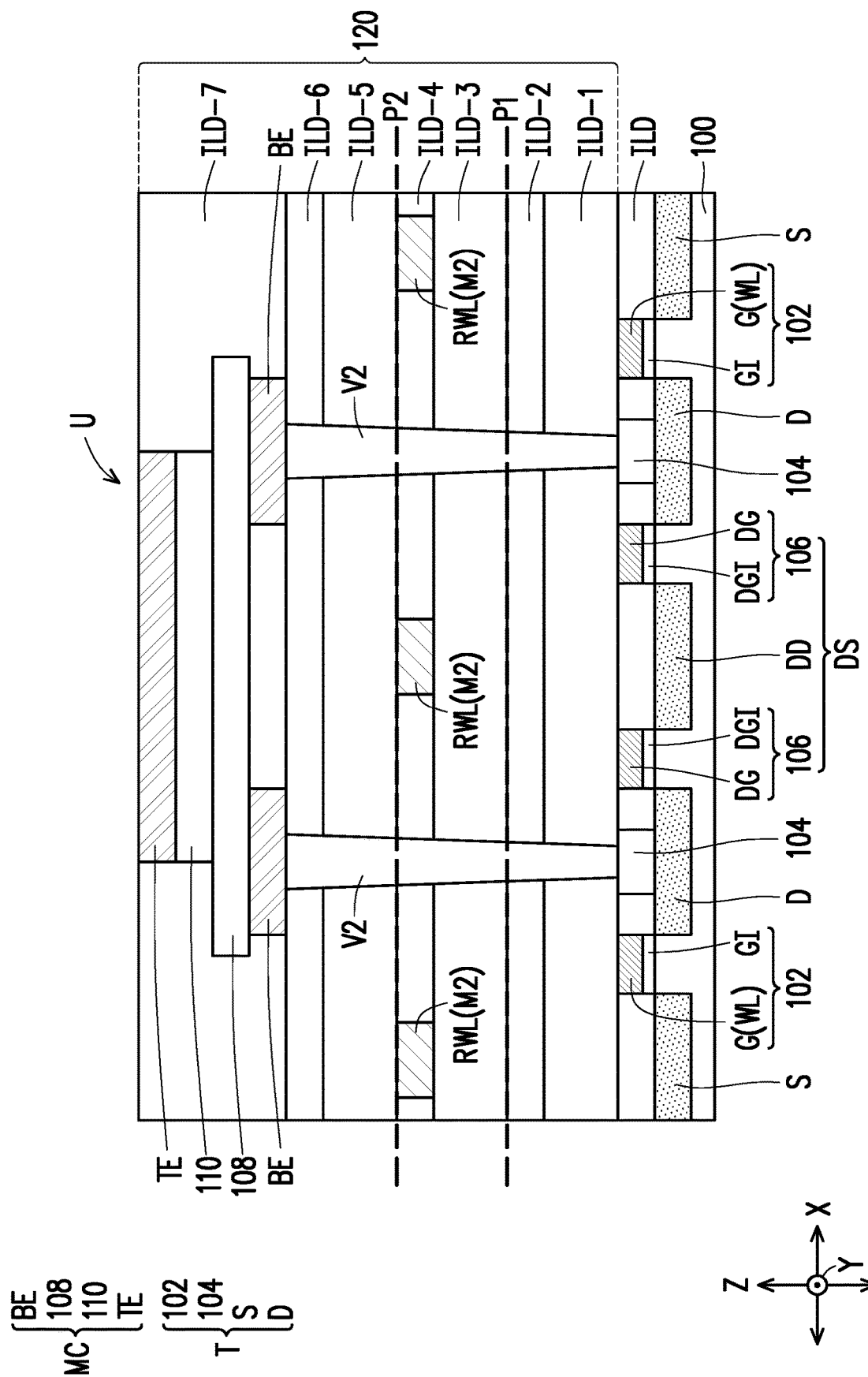

Referring to FIG. 1, FIG. 4F and FIG. 5F, a plurality of memory cells MC arranged in array are formed over the interlayer dielectric layer ILD-6 such that each of the memory cells MC is in contact with the two corresponding vias V2. In some embodiments, the memory cell MC includes bottom electrodes BE, a SOT layer 108, a MTJ stack 110 and a top electrode TE. In some embodiments, the SOT layer 108 is formed on the bottom electrodes BE, the MTJ stack 110 is formed on the SOT layer 108, and the top electrode TE is formed on the MTJ stack 110. That is to say, the bottom electrodes BE, the SOT layer 108, the MTJ stack 110 and the top electrode TE are sequentially formed on the interlayer dielectric layer ILD-6, and are stacked on top of each other along the thickness direction Z. In some embodiments, the method of forming the bottom electrodes BE, the SOT layer 108, the MTJ stack 110 and the top electrode TE includes forming multiple films over the interlayer dielectric layer ILD-6 and patterning the films. Each of the multiple films is formed by a suitable technique such as sputtering, electroless plating, electro plating, PVD, CVD, or ALD, and the patterning operation includes photolithographic and etching method. Other details or descriptions (e.g. the materials, positioning configurations, electrical connection relationships, etc.) of the bottom electrodes BE, the SOT layer 108, the MTJ stack 110 and the top electrode TE have been described in conjunction with FIG. 1 to FIG. 3 above, and will not be iterated herein again. Accordingly, for details or descriptions of the bottom electrodes BE, the SOT layer 108, the MTJ stack 110 and the top electrode TE not iterated herein, please refer to the aforesaid embodiments.

In some embodiments, after forming the memory cells MC electrically connected with the transistors T through the vias V2, a plurality of memory units U are rendered. In FIG. 5F, one memory unit U is shown for simplicity. Based on the descriptions of FIG. 1 to FIG. 3 mentioned above, those skilled in the art can understand that multiple memory unit U arranged in an array are formed in the semiconductor device 10. Other details or descriptions (e.g. the positioning configurations, electrical connection relationships, etc.) of the memory unit U have been described in conjunction with FIG. 1 to FIG. 3 above, and will not be iterated herein again. Accordingly, for details or descriptions of the memory unit U not iterated herein, please refer to the aforesaid embodiments. Since in the memory unit U, the electrical connection between the memory cell MC and each corresponding transistor T is provided by the via V2 continuously extending through multiple interlayer dielectric layers (e.g., the interlayer dielectric layers ILD-1 to ILD-6) of the interconnect structure 120, a lot of spaces may be saved between the memory cell MC and the corresponding transistors T for the arrangement of routing lines, which includes, for example, the source lines SL, the rerouting word lines RWL and/or other signal lines. As such, more flexibility is provided for the design of the layout of the semiconductor device 10, and the routing capacity of the semiconductor device 10 is improved. Also, the resistance between the routing lines in each metal layer between the memory cells MC and the transistors T can be reduced, thereby improving performance of signals flowing between the routing lines in each metal layer.

Continue referring to FIG. 4F and FIG. 5F, after rendering the memory units U, an interlayer dielectric layer ILD-7 is formed over the interlayer dielectric layer ILD-6 to laterally surround the memory cells MC. The material of the interlayer dielectric layer ILD-7 is similar to the material of the interlayer dielectric layer ILD-1 described above, so the details are not iterated herein. In some embodiments, the interlayer dielectric layer ILD-7 is deposited by CVD, PECVD, PVD, or spin coating. In some embodiments, the interlayer dielectric layer ILD-7 is deposited to have a top surface above the top surface of the memory cells MC. The interlayer dielectric layer ILD-7 is subsequently planarized, for example, by a CMP process and/or a recess etch using the top electrodes TE of the memory cells MC as a polishing and/or etch stop layer. After the planarization, the interlayer dielectric layer ILD-7 has a surface substantially flush or coplanar with the illustrated top surfaces of the top electrodes TE.

Figure 4G:
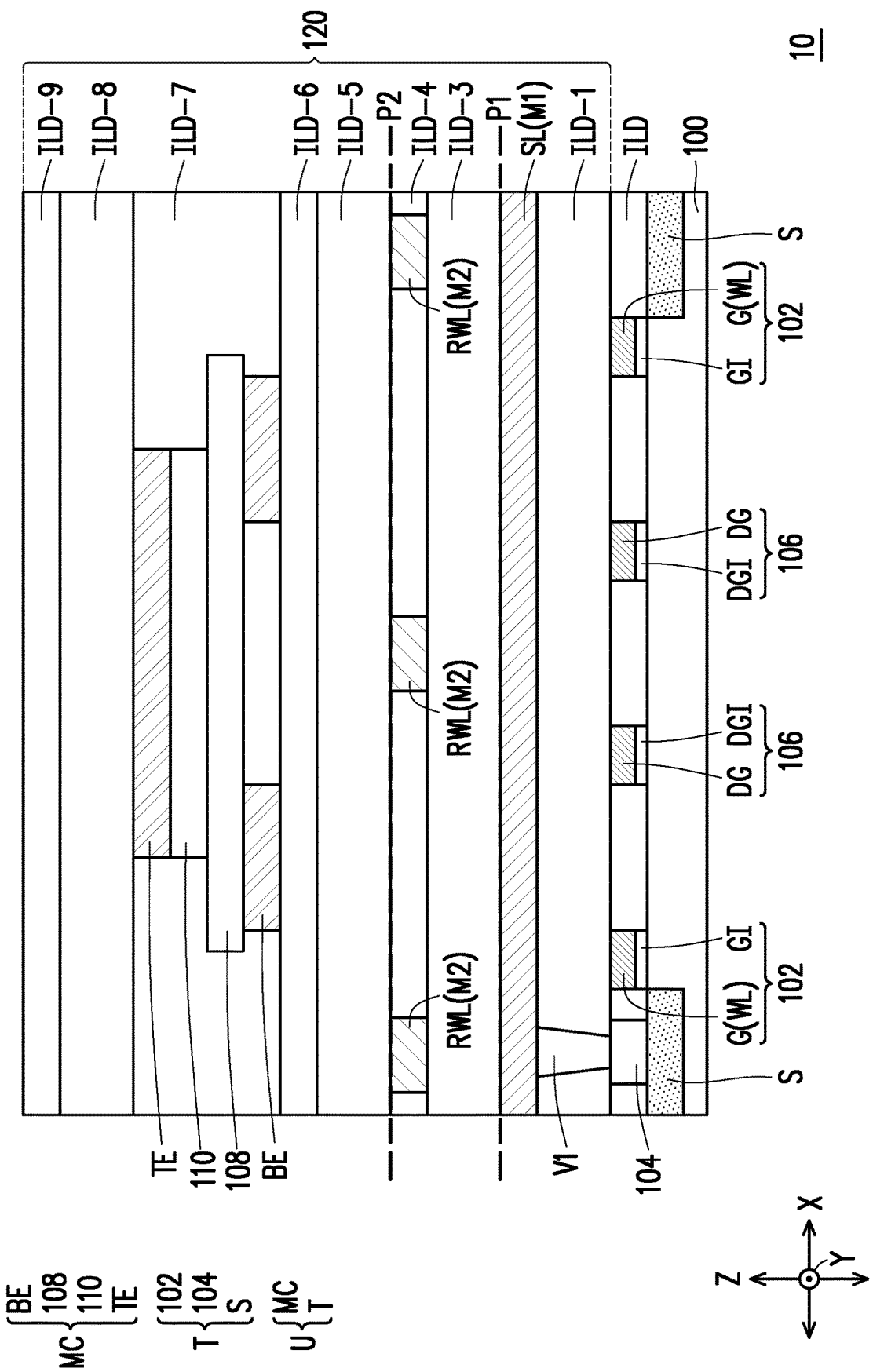
Figure 5G:
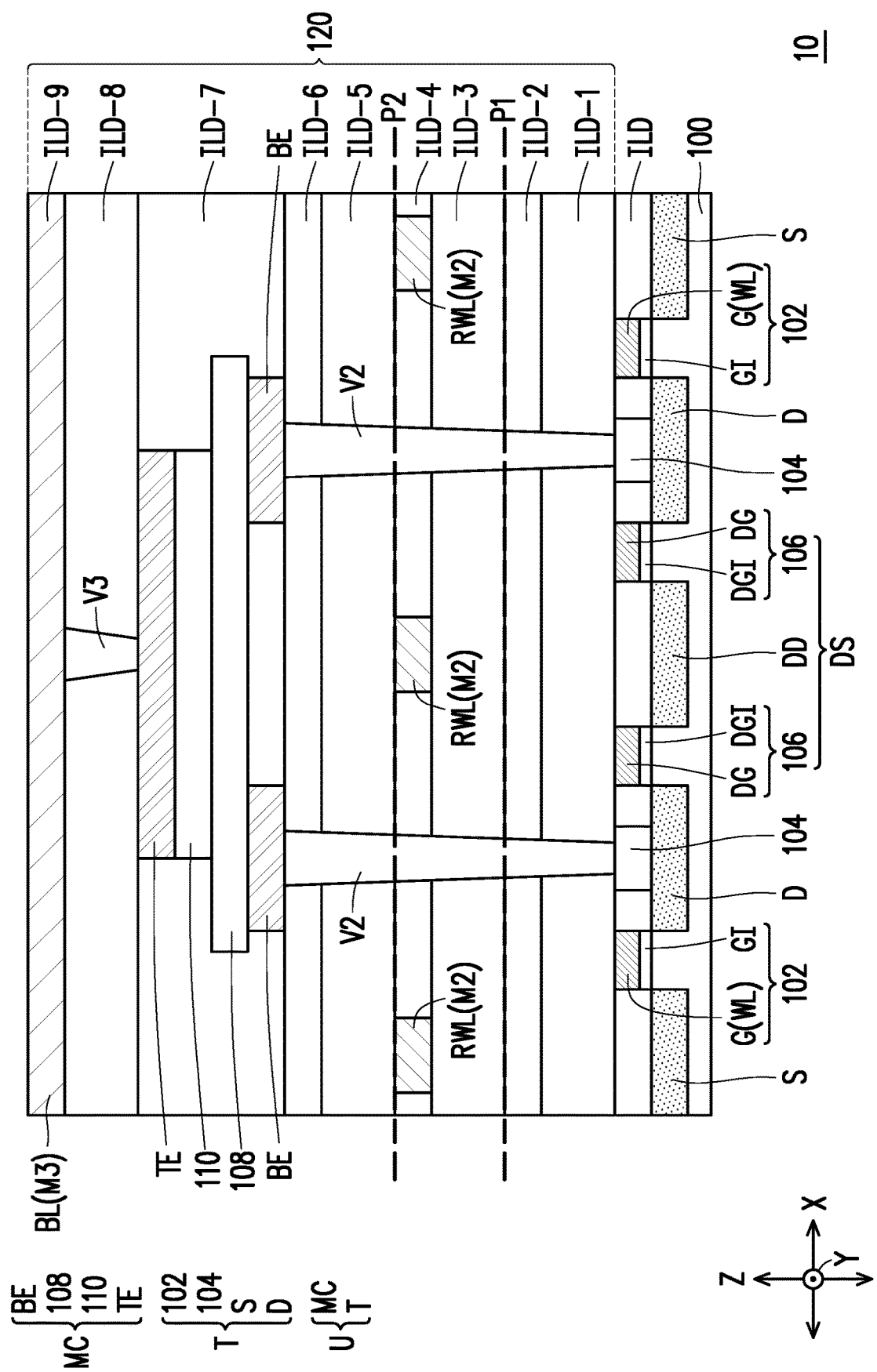

Referring to FIG. 4G and FIG. 5G, an interlayer dielectric layer ILD-8 is formed over the interlayer dielectric layer ILD-7. The material and the fabrication process of the interlayer dielectric layer ILD-8 are similar to those of the interlayer dielectric layer ILD-1 described above, so the details are not iterated herein. After forming the interlayer dielectric layer ILD-8, the interlayer dielectric layer ILD-8 is patterned to form via openings for exposing portions of the top electrodes TE of the memory cells MC. In some embodiments, the operation of forming the via openings in the interlayer dielectric layer ILD-8 includes removing portions of the interlayer dielectric layer ILD-8 by using an etching technique, such as dry etching method, photolithographic and etching method, directional etching method, or cyclotron resonance plasma etching method. Then, metallic material fills into the via openings in the interlayer dielectric layer ILD-8 to form vias V3 in contact with the exposed portions of the top electrodes TE of the memory cells MC. In some embodiments, the method of filling metallic material into the via openings in the interlayer dielectric layer ILD-8 includes LPCVD, PECVD, ALD, non-conformal PVD (such as PLD), sputtering, evaporative deposition, cathodic arc deposition, e-beam physical vapor deposition, or other suitable process. In some embodiments, a planarization process is performed to remove the metallic material outside the via openings in the interlayer dielectric layer ILD-8. In this way, the illustrated top surface of the via V3 and the illustrated top surface of the interlayer dielectric layer ILD-8 are substantially flush or coplanar with each other. In some embodiments, the planarization process includes a CMP process or a mechanical grinding process. In FIG. 5G, one via V3 is shown for simplicity. Based on the descriptions of FIG. 1 to FIG. 3 mentioned above, those skilled in the art can understand that multiple vias V3 corresponding to the memory cells MC are formed within the interlayer dielectric layer ILD-8.

In some embodiments, the via V3 is a through via that penetrate through the interlayer dielectric layer ILD-8. That is to say, the via V3 continuously extends through the interlayer dielectric layer ILD-8 along the thickness direction Z. In other words, the via V3 is embedded in and laterally surrounded by the interlayer dielectric layer ILD-8. Other details or descriptions (e.g. the materials, positioning configurations, electrical connection relationships, etc.) of the via V3 have been described in conjunction with FIG. 1 to FIG. 3 above, and will not be iterated herein again. Accordingly, for details or descriptions of the via V3 not iterated herein, please refer to the aforesaid embodiments. Although not shown, in some embodiments, other vias also are formed in the interlayer dielectric layer ILD-8. The material and the fabrication process of the other vias are similar to those of the vias V1 described above, so the details are not iterated herein. The formation of the other vias and the vias V3 may be carried out in the same chamber or in different chambers through a wafer translation mechanism.

Continue referring to FIG. 4G and FIG. 5G, after forming the vias V3 in the interlayer dielectric layer ILD-8, an interlayer dielectric layer ILD-9 is formed over the interlayer dielectric layer ILD-8. Since the interlayer dielectric layers ILD-2 to ILD-8 are located between the interlayer dielectric layer ILD-1 (i.e., the bottommost interlayer dielectric layer of the interconnect structure 120) and the interlayer dielectric layer ILD-9, the interlayer dielectric layer ILD-9 is referred to as a topmost interlayer dielectric layer of the interconnect structure 120, and the interlayer dielectric layers ILD-2 to ILD-8 are referred to as middle interlayer dielectric layers of the interconnect structure 120. The material and the fabrication process of the interlayer dielectric layer ILD-9 are similar to those of the interlayer dielectric layer ILD-1 described above, so the details are not iterated herein.

After forming the interlayer dielectric layer ILD-9, the interlayer dielectric layer ILD-9 is patterned to form trenches to be filled by metallic material to form a metal layer M3. In some embodiments, the patterning technique is photolithographic and etching method such as DUV photolithography using a mask and plasma etching. In some embodiments, the method of filling metallic material into the trenches in the interlayer dielectric layer ILD-9 includes LPCVD, PECVD, ALD, non-conformal PVD (such as PLD), sputtering, evaporative deposition, cathodic arc deposition, e-beam physical vapor deposition, or other suitable process. In some embodiments, a planarization process is performed to remove the metallic material outside the trenches in the interlayer dielectric layer ILD-9, such that the illustrated top surface of the metal layer M3 and the illustrated top surface of the interlayer dielectric layer ILD-9 are substantially flush or coplanar with each other. With such configuration, the metal layer M3 is embedded in the interlayer dielectric layer ILD-9. In some embodiments, the planarization process includes a CMP process or a mechanical grinding process.

In some embodiments, the metal layer M3 includes a plurality of bit lines BL. In FIG. 5G, one bit line BL is shown for simplicity. Based on the descriptions of FIG. 1 to FIG. 3 mentioned above, those skilled in the art can understand that multiple bit lines BL are formed within the interlayer dielectric layer ILD-9. In some embodiments, as shown in FIG. 5G, the bit line BL extends horizontally on the illustrated top surface of the interlayer dielectric layer ILD-9 along the direction X. Other details or descriptions (e.g. the materials, positioning configurations, electrical connection relationships, etc.) of the bit line BL have been described in conjunction with FIG. 1 to FIG. 3 above, and will not be iterated herein again. Accordingly, for details or descriptions of the bit line BL not iterated herein, please refer to the aforesaid embodiments. Although not shown, in some embodiments, the metal layer M3 further includes other routing lines (including other signal lines), conductive pads or a combination thereof.

As shown in FIG. 4G and FIG. 5G, after the metal layer M3 in the interlayer dielectric layer ILD-9 (i.e., the topmost interlayer dielectric layer of the interconnect structure 120) is formed, the semiconductor device 10 integrated with memory device is accomplished. Since the memory cell MC includes the SOT layer 108 and the MTJ stack 110, the semiconductor device 10 is a semiconductor device integrated with MRAM device. In some embodiments, as shown in FIG. 4G and FIG. 5G, the memory cells MC of the semiconductor device 10 are provided between the metal layer (not shown) in the interlayer dielectric layer ILD-6 and the metal layer M3 in the interlayer dielectric layer ILD-9. However, the disclosure is not limited thereto. In alternative embodiments, upon the process requirements, the memory cells MC of the semiconductor device 10 may be provided between two adjacent metal layers, such as between the metal layer M2 in the interlayer dielectric layer ILD-4 and the metal layer (not shown) in the interlayer dielectric layer ILD-6. Further, in some embodiments, the semiconductor device 10 is a semiconductor die.

Figure 6:
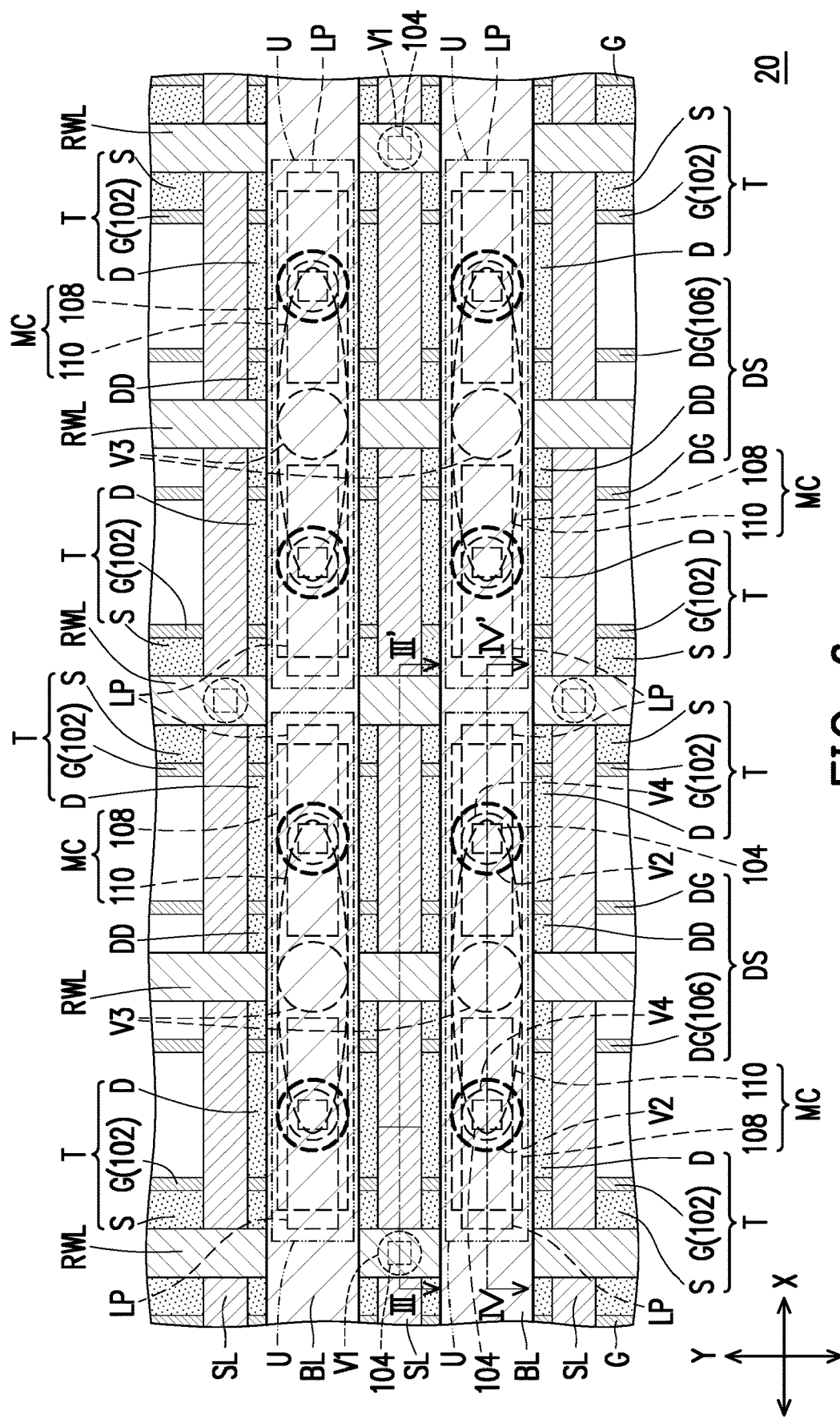
FIG. 6 is a schematic top view of a semiconductor device in accordance with some alternative embodiments of the disclosure.
Figure 7:
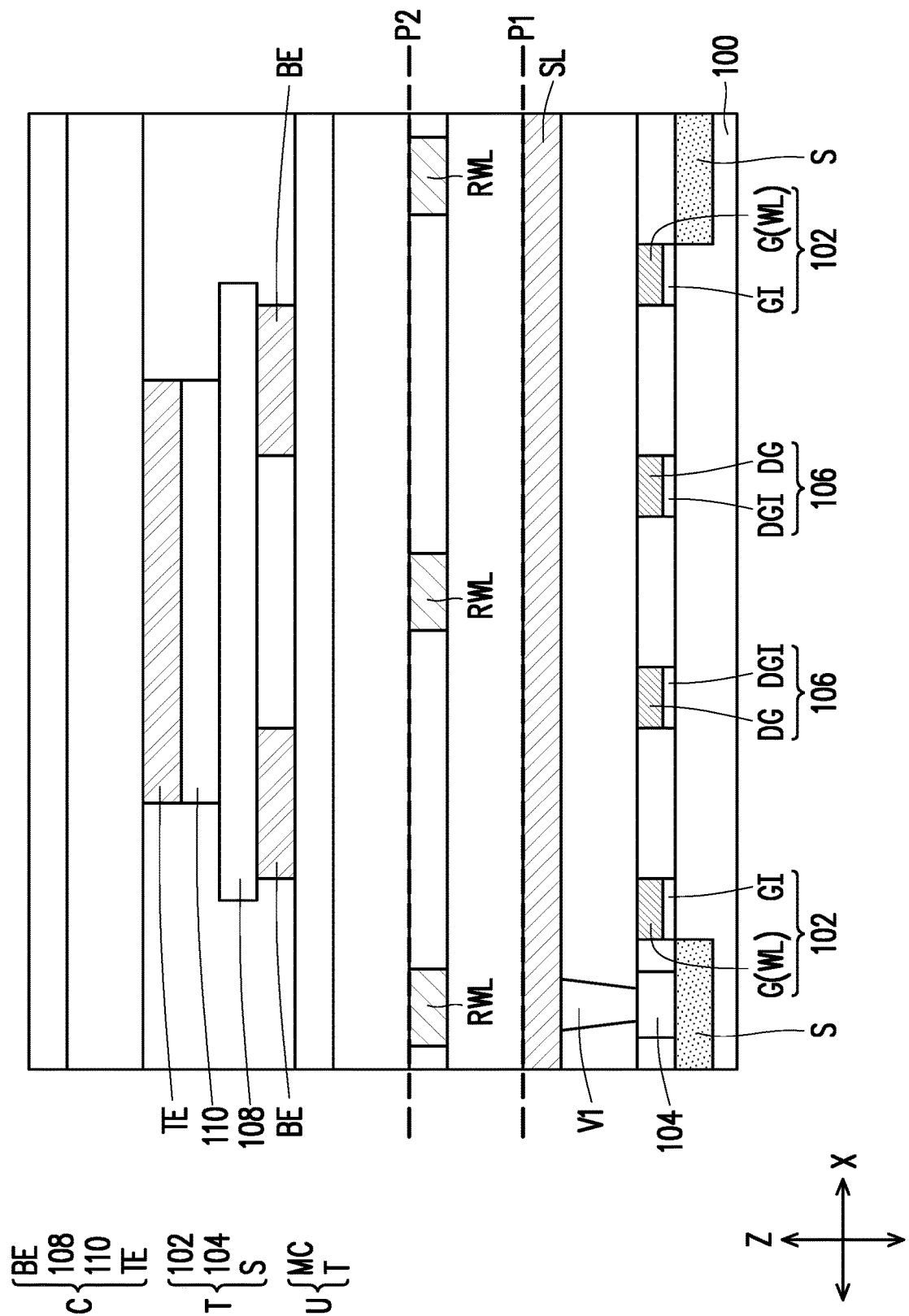
FIG. 7 is a schematic cross-sectional view of a semiconductor device in accordance with some alternative embodiments of the disclosure.
Figure 8:
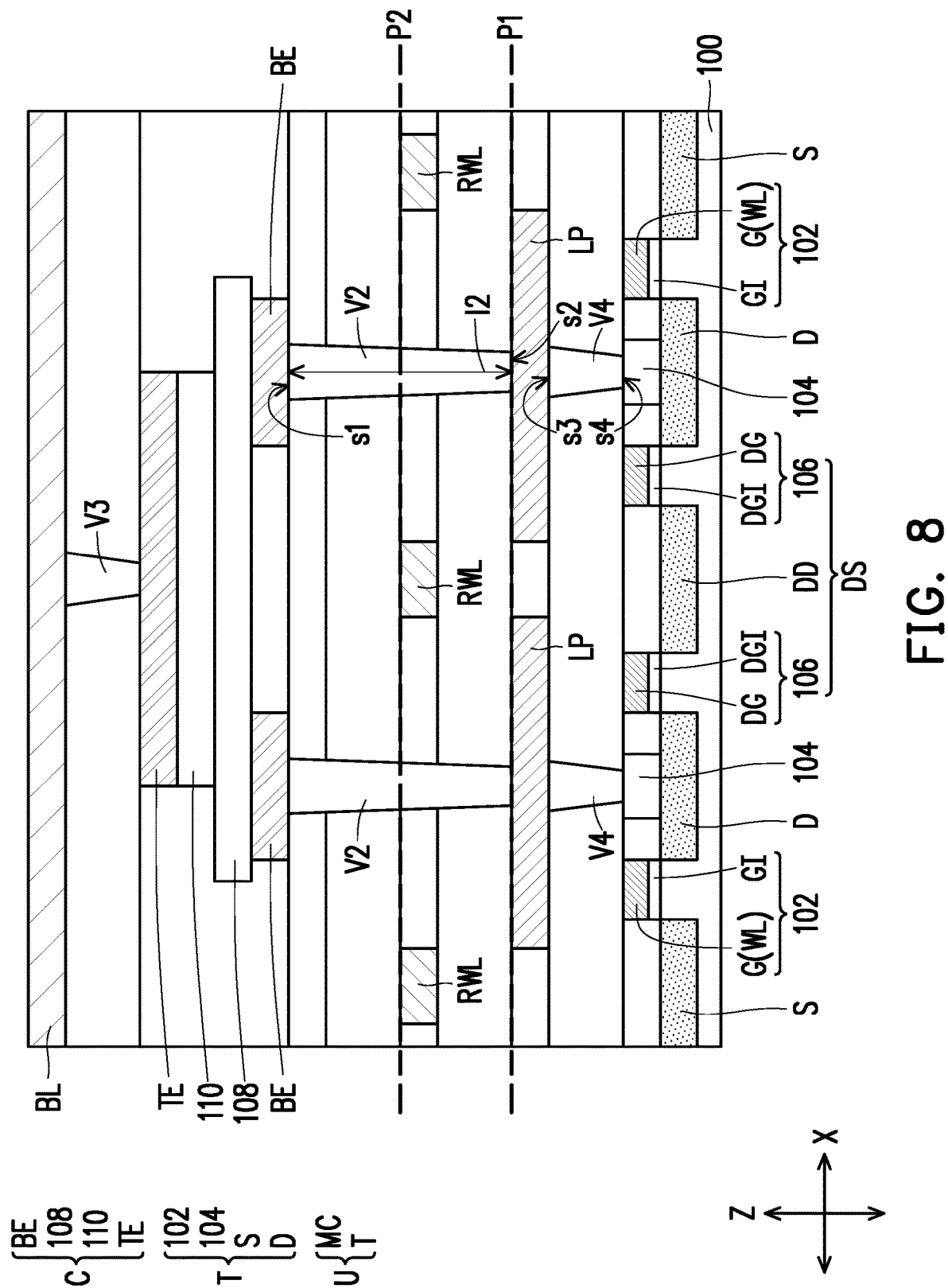
FIG. 8 is a schematic cross-sectional view of a semiconductor device in accordance with some alternative embodiments of the disclosure.

FIG. 6 is a schematic top view of a semiconductor device 20 in accordance with some alternative embodiments of the disclosure, having a cross-section line III-III' and a cross-section line IV-IV' in the direction X. FIG. 7 is a schematic cross-sectional view of a semiconductor device 20 in accordance with some alternative embodiments of the disclosure. FIG. 8 is a schematic cross-sectional view of a semiconductor device 20 in accordance with some alternative embodiments of the disclosure. FIG. 7 is a schematic cross-sectional view taken along the cross-section line III-III' of FIG. 6, and FIG. 8 is a schematic cross-sectional view taken along the cross-section line IV-IV' of FIG. 6. It should be noted that the semiconductor device 20 of the disclosure is not limited by the illustration of FIG. 6, and those skilled in the art should understand that the semiconductor device 20 includes other elements, such as driving elements, not shown in FIG. 6. It should be noted that for simplicity and clarity of illustration, some elements of the semiconductor device 20 are omitted in the simplified top view of FIG. 6, such as dielectric layers, electrodes of the memory cell, gate dielectric layers.

Referring to FIGS. 6-8 along with FIGS. 1-3, the semiconductor device 20 illustrated in FIGS. 6-8 is similar to the semiconductor device 10 illustrated in FIGS. 1-3, hence the same reference numerals are used to refer to the same or liked parts, and its detailed description will be omitted herein. The differences between the semiconductor device 20 illustrated in FIGS. 6-8 and the semiconductor device 10 illustrated in FIGS. 1-3 will be described below.

Referring to FIG. 6 and FIG. 8, the semiconductor device 20 further includes a plurality of landing pads LP corresponding to the memory units U. In some embodiments, as shown in FIG. 6, each of the landing pads LP extends along the direction X, and the landing pads LP are substantially paralleled with the source lines SL and the bit lines BL. From another point of view, as shown in FIG. 6, the landing pads LP are disposed between any two adjacent source lines SL. Although eight landing pads LP are presented in FIG. 6 for illustrative purposes, those skilled in the art can understand that number of the may be more than what is depicted in FIG. 1, and may be designated based on demand and/or design layout. In some embodiments, as shown in FIG. 7 and FIG. 8, the virtual plane P1 extending from the illustrated top surface of the source line SL is substantially flush or coplanar with the illustrated top surface of the landing pad LP. That is to say, the source lines SL and the landing pads LP are located at the same level height. From another point of view, as shown in FIG. 6 to FIG. 8, the landing pads LP are located between the rerouting word lines RWL and the semiconductor substrate 100. In some embodiments, the material of the landing pad LP includes a metal material. The metal material may include Al, Cu, AlCu, Au, Ti, TiN, Ta, TaN, W, WN, Co or a combination thereof. In some embodiments, the material of the landing pad LP is the same as the material of the source line SL. In some alternative embodiments, the material of the landing pad LP is different from the material of the source line SL.

In some embodiments, the landing pads LP are electrically connected with the contact layer 104 disposed on the drain regions D through vias V4. As shown in FIG. 8, the via V4 continuously extends from the landing pad LP toward the contact layer 104 disposed on the corresponding drain region D to render an electrical connection between the landing pad LP and the corresponding drain region D. In other words, the via V4 is in direct and physical contact with the corresponding landing pad LP and the contact layer 104 disposed on the corresponding drain region D. However, the disclosure is not limited thereto. In some embodiments that the contact layer 104 is omitted from the transistor T, the via V4 is in direct and physical contact with the corresponding drain region D. In some embodiments, as shown in FIG. 1, the via V4 has a circular shape from a top view. However, the disclosure is not limited thereto. In some alternative embodiments, from a top view, the via V4 may have an elliptical shape, a polygonal shape or other suitable shapes. In some embodiments, the material of the via V4 includes a metal material. The metal material may include Al, Cu, AlCu, Au, Ti, TiN, Ta, TaN, W, WN, Co or a combination thereof.

In some embodiments, as shown in FIG. 6 and FIG. 8, in the memory unit U, each of the two vias V2 continuously extends from the memory cell MC toward the corresponding landing pad LP to render an electrical connection between the memory cell MC and the corresponding landing pad LP. Since the landing pad LP is electrically connected with the corresponding transistor T through the corresponding via V4, in the memory unit U of the semiconductor device 20, an electrical connection between the memory cell MC and the corresponding transistors T is provided by the two vias V2, the two landing pads LP and the two vias V4. Further, since the memory cell MC is electrically connected with each corresponding transistor T through the via V2 continuously extending between the memory cell MC and the corresponding landing pad LP, a lot of spaces may be saved between the memory cell MC and the corresponding landing pads LP for the arrangement of routing lines, which includes, for example, the rerouting word lines RWL and/or other signal lines. As such, more flexibility is provided for the design of the layout of the semiconductor device 20, and the routing capacity of the semiconductor device 20 is improved.

In detail, as shown in FIG. 8, the illustrated top surface s1 of the via V2 is in direct and physical contact with the corresponding bottom electrode BE of the memory cell MC, and the illustrated bottom surface s2 of the via V2 is in direct and physical contact with the corresponding landing pad LP. That is to say, in the memory unit U, each of the two vias V2 is connected to one of the bottom electrodes BE of the memory cell MC in a one-to-one relationship, and also is connected to one of the two landing pads LP in a one-to-one relationship. From another point of view, the illustrated bottom surface s2 of the via V2 is in direct and physical contact with the illustrated top surface of the landing pad LP, and thus the illustrated bottom surface s2 of the via V2 is also in direct and physical contact with the virtual plane P1 extending from the illustrated top surface of the source line SL. Further, as shown in FIG. 8, the illustrated top surface s3 of the via V4 is in direct and physical contact with the corresponding landing pad LP, and the illustrated bottom surface s4 of the via V4 is in direct and physical contact with the semiconductor layer 104 disposed on the corresponding drain region D. That is to say, in the memory unit U, each of the two vias V4 is connected to one of the two landing pads LP in a one-to-one relationship, and also is connected to one of the two transistors T in a one-to-one relationship. As such, in the memory unit U, the landing pad LP is disposed between the corresponding via V2 and the corresponding transistor T. In some embodiments, in the semiconductor device 20, the via V2 has a length 12 of about 140 nm to about 280 nm.

In some embodiments, as shown in FIG. 6, in the memory unit U, along the thickness direction Z, the vertical projection of the via V2 is partially overlapped with the vertical projection of the corresponding landing pad LP. However, the disclosure is not limited thereto. In some alternative embodiments, in the memory unit U, along the thickness direction Z, the whole vertical projection of the via V2 may be overlapped with the vertical projection of the corresponding landing pad LP. Further, as shown in FIG. 6 and FIG. 8, in the memory unit U, the via V2 is vertically aligned with the corresponding via V4. However, the disclosure is not limited thereto. In some alternative embodiments, in the memory unit U, the via V2 is staggered with the corresponding via V4. That is to say, in the memory unit U, the via V2 is vertically misaligned with the corresponding via V4.

The method of manufacturing the semiconductor device 20 will be described in details below with reference to FIG. 9A to FIG. 9G and FIG. 10A to FIG. 10G. FIGS. 9A-9G are schematic cross-sectional views of structures produced at various stages of a fabricating method of the semiconductor device 20 in accordance with some embodiments of the disclosure. FIGS. 10A-10G are schematic cross-sectional views of structures produced at various stages of a fabricating method of the semiconductor device 20 in accordance with some embodiments of the disclosure. FIGS. 9A-9G are schematic cross-sectional views taken along the cross-section line III-III' of FIG. 6, and FIGS. 10A-10G are schematic cross-sectional views taken along the cross-section line IV-IV' of FIG. 6.

Figure 9A:
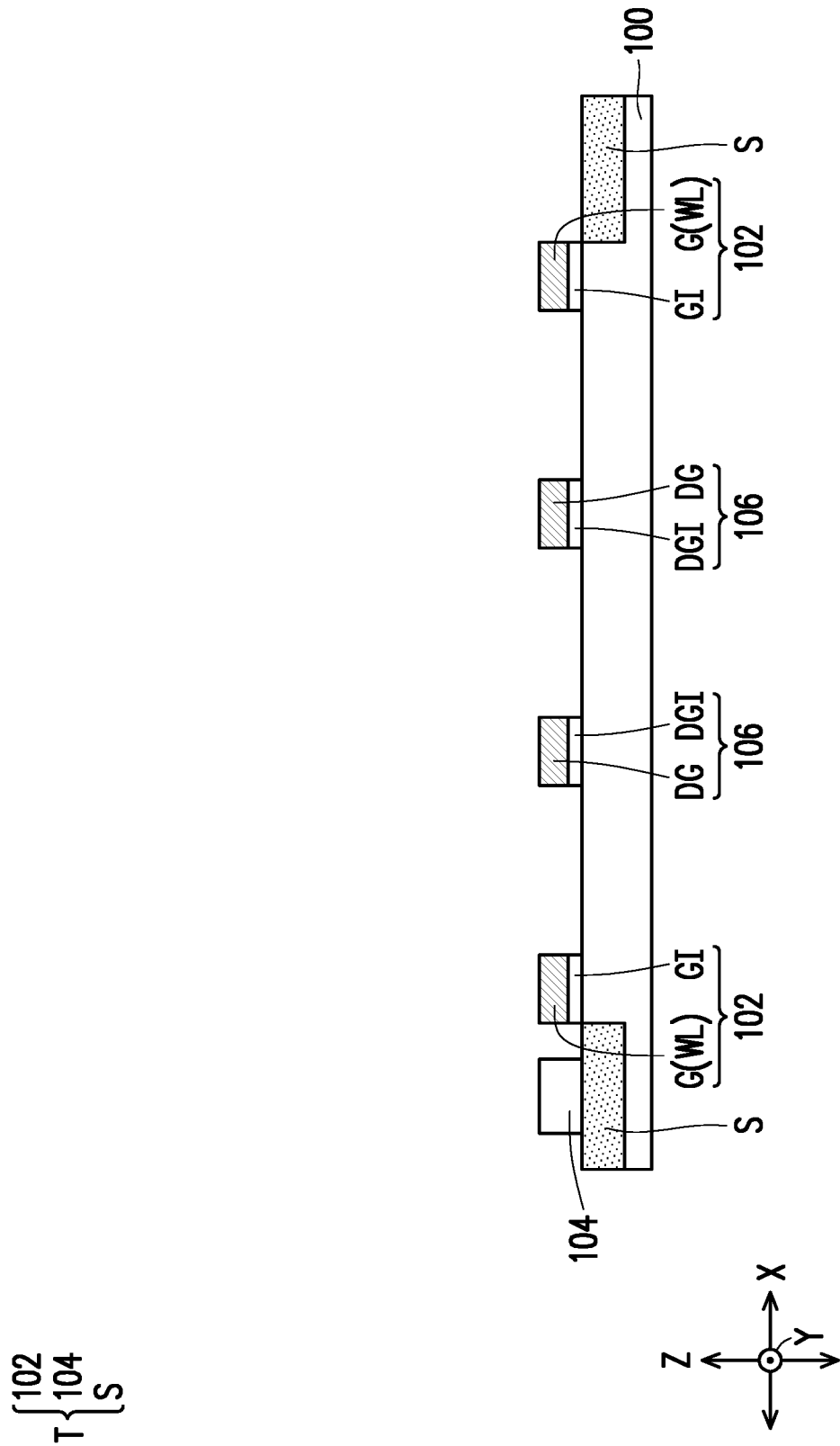
FIG. 9A through FIG. 9G are schematic cross-sectional views of structures produced at various stages of a fabricating method of a semiconductor device in accordance with some alternative embodiments of the disclosure.

Referring to FIG. 9A and 10A, the step described herein is similar to the step of FIG. 4A and FIG. 5A, so the detailed description thereof is omitted herein. Accordingly, for details or descriptions of the steps described in FIG. 9A and FIG. 10A not iterated herein, please refer to the aforesaid embodiments.

Figure 9B:
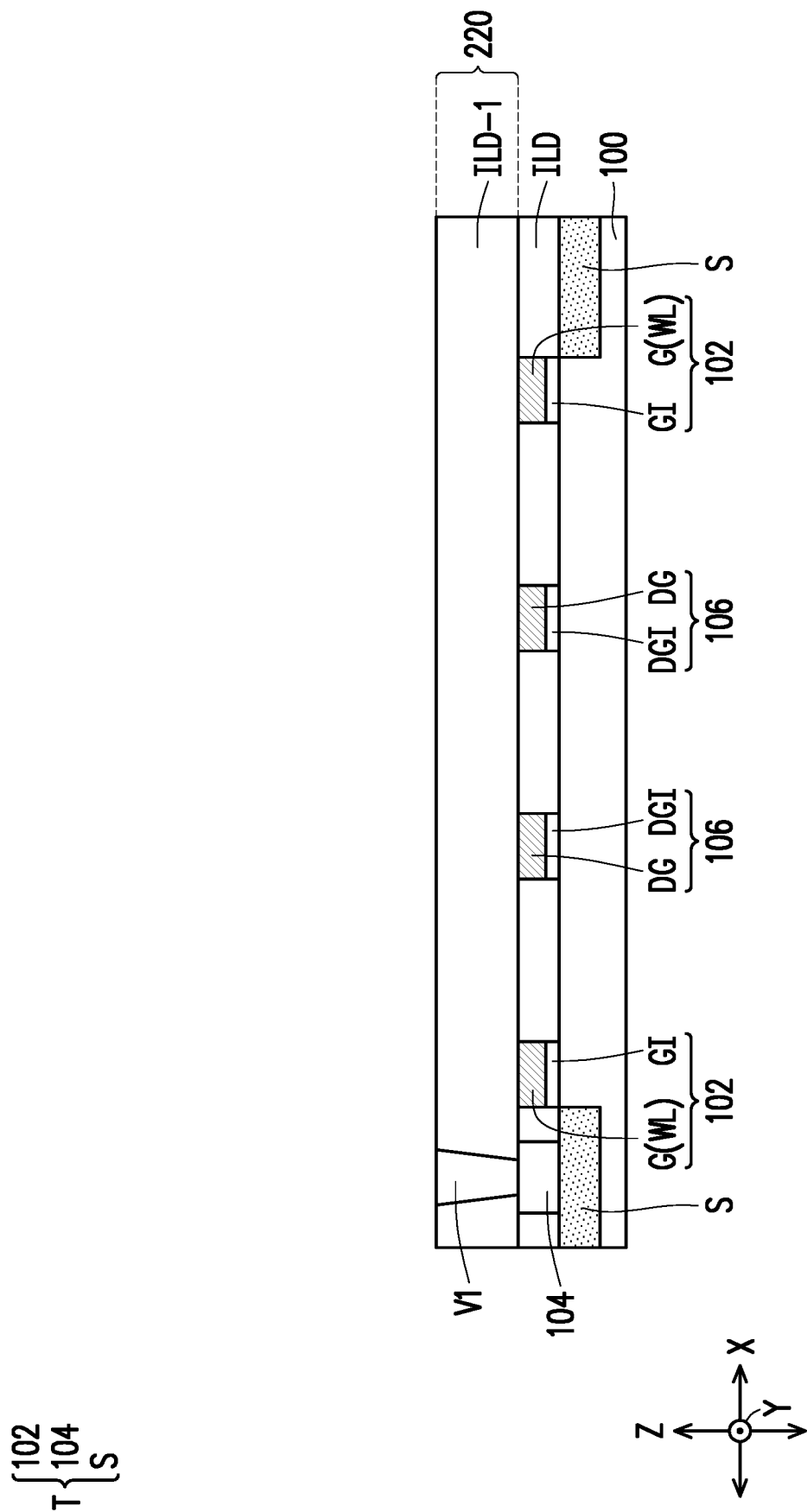
Figure 10B:
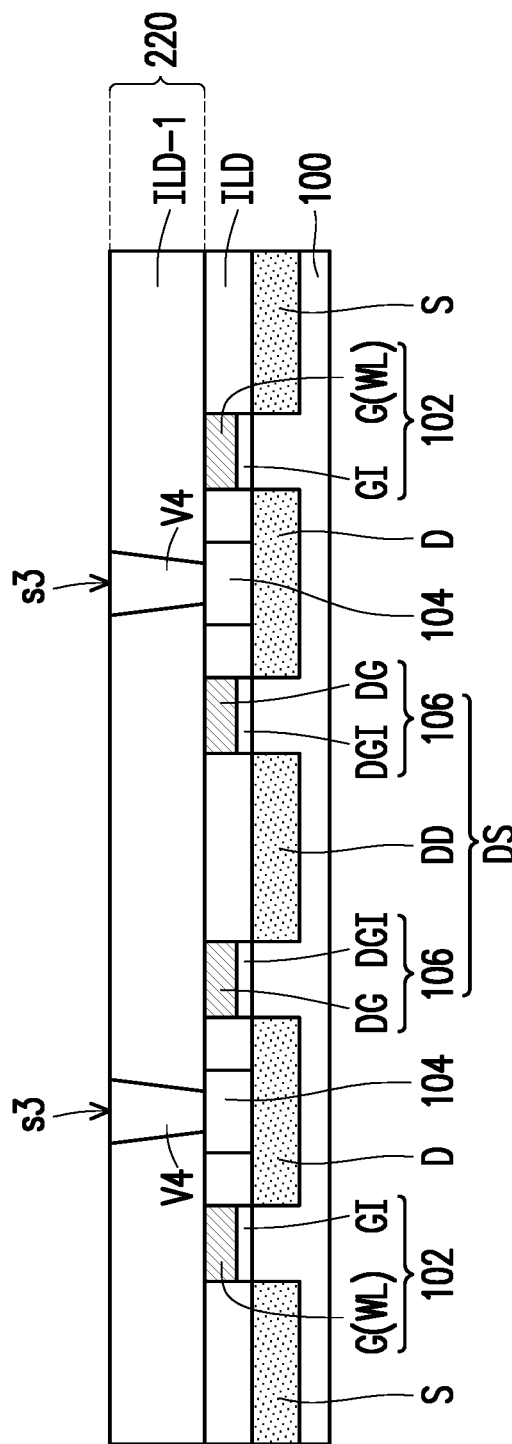

Referring to FIG. 6, FIG. 9B and FIG. 10B, after providing the semiconductor substrate 100, an interlayer dielectric layer ILD is formed over the semiconductor substrate 100. The details or descriptions (e.g. the materials, formation processes, positioning configurations, etc.) of the interlayer dielectric layer ILD have been described in conjunction with FIG. 4B and FIG. 5B above, and will not be iterated herein again. Accordingly, for details or descriptions of the interlayer dielectric layer ILD not iterated herein, please refer to the aforesaid embodiments.

After the interlayer dielectric layer ILD is formed over the semiconductor substrate 100, an interconnect structure 220 is formed over the semiconductor substrate 100 and the interlayer dielectric layer ILD. The method of forming the interconnect structure 220 will be described in details below with reference to FIG. 9B to FIG. 9G and FIG. 10B to FIG. 10G.

Continue referring to FIG. 9B and FIG. 10B, after forming the interlayer dielectric layer ILD, an interlayer dielectric layer ILD-1 is formed to cover the interlayer dielectric layer ILD. The details or descriptions (e.g. the materials, formation processes, positioning configurations, etc.) of the interlayer dielectric layer ILD-1 have been described in conjunction with FIG. 4B and FIG. 5B above, and will not be iterated herein again. Accordingly, for details or descriptions of the interlayer dielectric layer ILD-1 not iterated herein, please refer to the aforesaid embodiments.

After forming the interlayer dielectric layer ILD-1, the interlayer dielectric layer ILD-1 is patterned to form via openings for exposing portions of the contact layer 104 disposed on the source regions S and exposing portions of the contact layer 104 disposed on the drain regions D. In some embodiments, the operation of forming the via openings in the interlayer dielectric layer ILD-1 includes removing portions of the interlayer dielectric layer ILD-1 by using an etching technique, such as dry etching method, photolithographic and etching method, directional etching method, or cyclotron resonance plasma etching method. Then, metallic material fills into the via openings in the interlayer dielectric layer ILD-1 to form vias V1 in contact with the exposed portions of the contact layer 104 disposed on the source regions S and vias V4 in contact with the exposed portions of the contact layer 104 disposed on the drain regions D. In some embodiments, the method of filling metallic material into the via openings in the interlayer dielectric layer ILD-1 includes LPCVD, PECVD, ALD, non-conformal PVD (such as PLD), sputtering, evaporative deposition, cathodic arc deposition, e-beam physical vapor deposition, or other suitable process. In some embodiments, a planarization process is performed to remove the metallic material outside the via openings in the interlayer dielectric layer ILD-1. In this way, the illustrated top surface of the via V1, the illustrated top surface s3 of the via V4 and the illustrated top surface of the interlayer dielectric layer ILD-1 are substantially flush or coplanar with one another. In some embodiments, the planarization process includes a CMP process or a mechanical grinding process. In some embodiments, the formation of the vias V1 and the vias V4 is carried out in the same chamber. In some alternative embodiments, the formation of the vias V1 and the vias V4 is carried out in different chambers through a wafer translation mechanism. In some embodiments, the material of the vias V1 is the same as the material of the vias V4. In some alternative embodiments, the material of the vias V1 is different from the material of the vias V4. Other details or descriptions (e.g. the materials, positioning configurations, electrical connection relationships, etc.) of the via V1 have been described in conjunction with FIG. 1 to FIG. 3, FIG. 4B and FIG. 5B above, and will not be iterated herein again. Accordingly, for details or descriptions of the via V1 not iterated herein, please refer to the aforesaid embodiments.

In FIG. 10B, two vias V4 are shown for simplicity. Based on the descriptions of FIG. 6 to FIG. 8 mentioned above, those skilled in the art can understand that more than two vias V4 corresponding to the drain regions D are formed within the interlayer dielectric layer ILD-1. In some embodiments, the via V4 is a through via that penetrate through the interlayer dielectric layer ILD-1. That is to say, the via V4 continuously extends through the interlayer dielectric layer ILD-1 along the thickness direction Z. In other words, the via V4 is embedded in and laterally surrounded by the interlayer dielectric layer ILD-1. Other details or descriptions (e.g. the materials, positioning configurations, electrical connection relationships, etc.) of the via V4 have been described in conjunction with FIG. 6 to FIG. 8 above, and will not be iterated herein again. Accordingly, for details or descriptions of the via V4 not iterated herein, please refer to the aforesaid embodiments. Although not shown, in some embodiments, other vias also are formed in the interlayer dielectric layer ILD-1. The material and the fabrication process of the other vias are similar to those of the vias V1 described above, so the details are not iterated herein. The formation of the other vias and the vias V1 may be carried out in the same chamber or in different chambers through a wafer translation mechanism.

Figure 9C:
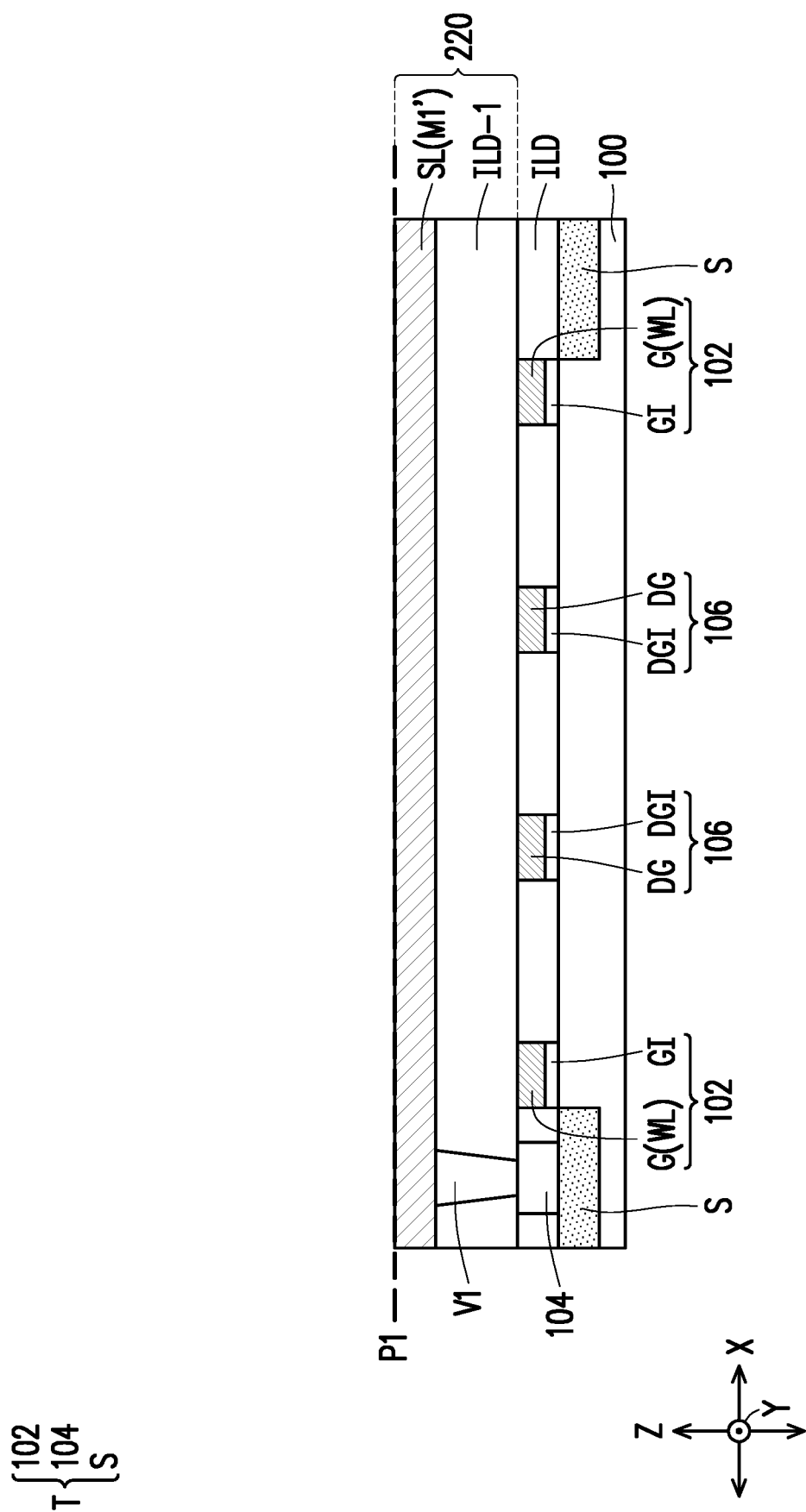
Figure 10C:
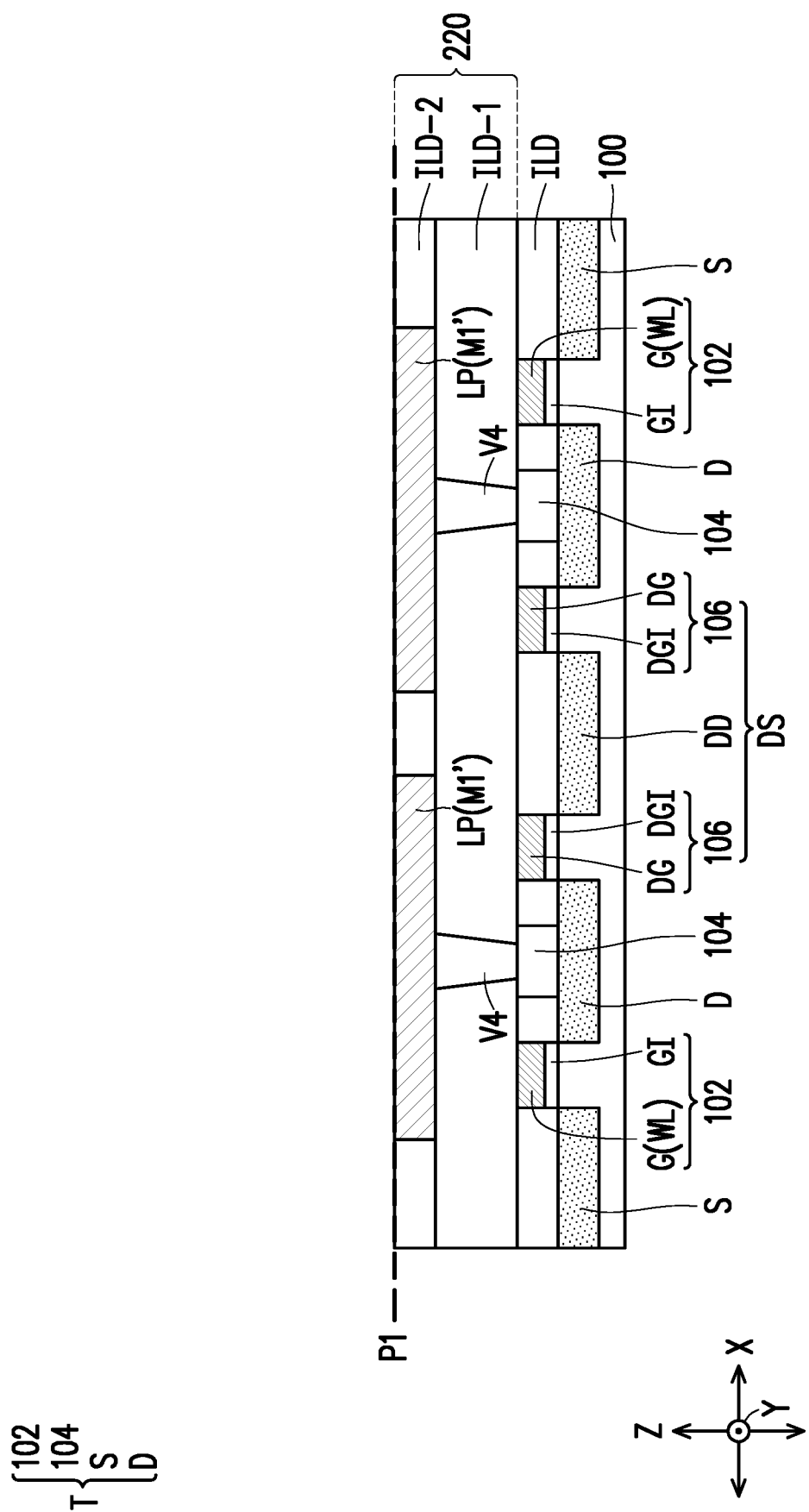

Referring to FIG. 9C and FIG. 10C, an interlayer dielectric layer ILD-2 is formed over the interlayer dielectric layer ILD-1. Since the interlayer dielectric layer ILD-1 is located between the interlayer dielectric layer ILD-2 and the interlayer dielectric layer ILD, the interlayer dielectric layer ILD-1 is referred to as a bottommost interlayer dielectric layer of the interconnect structure 220. The details or descriptions (e.g. the materials, formation processes, positioning configurations, etc.) of the interlayer dielectric layer ILD-2 have been described in conjunction with FIG. 4C and FIG. 5C above, and will not be iterated herein again. Accordingly, for details or descriptions of the interlayer dielectric layer ILD-2 not iterated herein, please refer to the aforesaid embodiments.

After forming the interlayer dielectric layer ILD-2, the interlayer dielectric layer ILD-2 is patterned to formed trenches to be filled by metallic material to form a metal layer M1'. In some embodiments, the patterning technique is photolithographic and etching method such as DUV photolithography using a mask and plasma etching. In some embodiments, the method of filling metallic material into the trenches in the interlayer dielectric layer ILD-2 includes LPCVD, PECVD, ALD, non-conformal PVD (such as PLD), sputtering, evaporative deposition, cathodic arc deposition, e-beam physical vapor deposition, or other suitable process. In some embodiments, a planarization process is performed to remove the metallic material outside the trenches in the interlayer dielectric layer ILD-2, such that the illustrated top surface of the metal layer M1' and the illustrated top surface of the interlayer dielectric layer ILD-2 are substantially flush or coplanar with each other. With such configuration, the metal layer M1' is embedded in the interlayer dielectric layer ILD-2. From another point of view, a virtual plane P1 extending from the illustrated top surface of the metal layer M1' is substantially flush or coplanar with the illustrated top surface of the interlayer dielectric layer ILD-2. In some embodiments, the planarization process includes a CMP process or a mechanical grinding process. In some embodiments, as shown in FIG. 9B to FIG. 9C and FIG. 10B to FIG. 10C, the metal layer M1' and the vias in the interlayer dielectric layer ILD-1 (e.g., vias V1 and vias V4) are formed in separate processes. In such embodiments, the formation of the metal layer M1' and the vias in the interlayer dielectric layer ILD-1 may be carried out in the same chamber or in different chambers through a wafer translation mechanism. However, the disclosure is not limited thereto. In some alternative embodiments, a dual damascene method is applied to form the metal layer M1' and the vias in the interlayer dielectric layer ILD-1. In such case, the trenches for the metal layer M1' are patterned in the interlayer dielectric layer ILD-2 before filling the via openings to form the vias in the interlayer dielectric layer ILD-1, so that the metal layer M1' and the vias in the interlayer dielectric layer ILD-1 are formed at the same time. In some embodiments, the material of the metal layer M1' is the same as the material of the vias in the interlayer dielectric layer ILD-1. In some alternative embodiments, the material of the metal layer M1' is different from the material of the vias in the interlayer dielectric layer ILD-1.

In some embodiments, the metal layer M1' includes a plurality of source lines SL and a plurality of landing pads LP. Other details or descriptions (e.g. the materials, positioning configurations, electrical connection relationships, etc.) of the source line SL have been described in conjunction with FIG. 1 to FIG. 3, FIG. 4C and FIG. 5C above, and will not be iterated herein again. Accordingly, for details or descriptions of the source line SL not iterated herein, please refer to the aforesaid embodiments.

In FIG. 10C, two landing pads LP are shown for simplicity. Based on the descriptions of FIG. 6 to FIG. 8 mentioned above, those skilled in the art can understand that more than two landing pads LP are formed within the interlayer dielectric layer ILD-2. In some embodiments, as shown in FIG. 10C, the landing pad LP extends horizontally on the illustrated top surface of the interlayer dielectric layer ILD-2 along the direction X. Other details or descriptions (e.g. the materials, positioning configurations, electrical connection relationships, etc.) of the landing pad LP have been described in conjunction with FIG. 6 to FIG. 8 above, and will not be iterated herein again. Accordingly, for details or descriptions of the landing pad LP not iterated herein, please refer to the aforesaid embodiments. Although not shown, in some embodiments, the metal layer M1' further includes other routing lines (including other signal lines), conductive pads or a combination thereof.

Figure 9D:
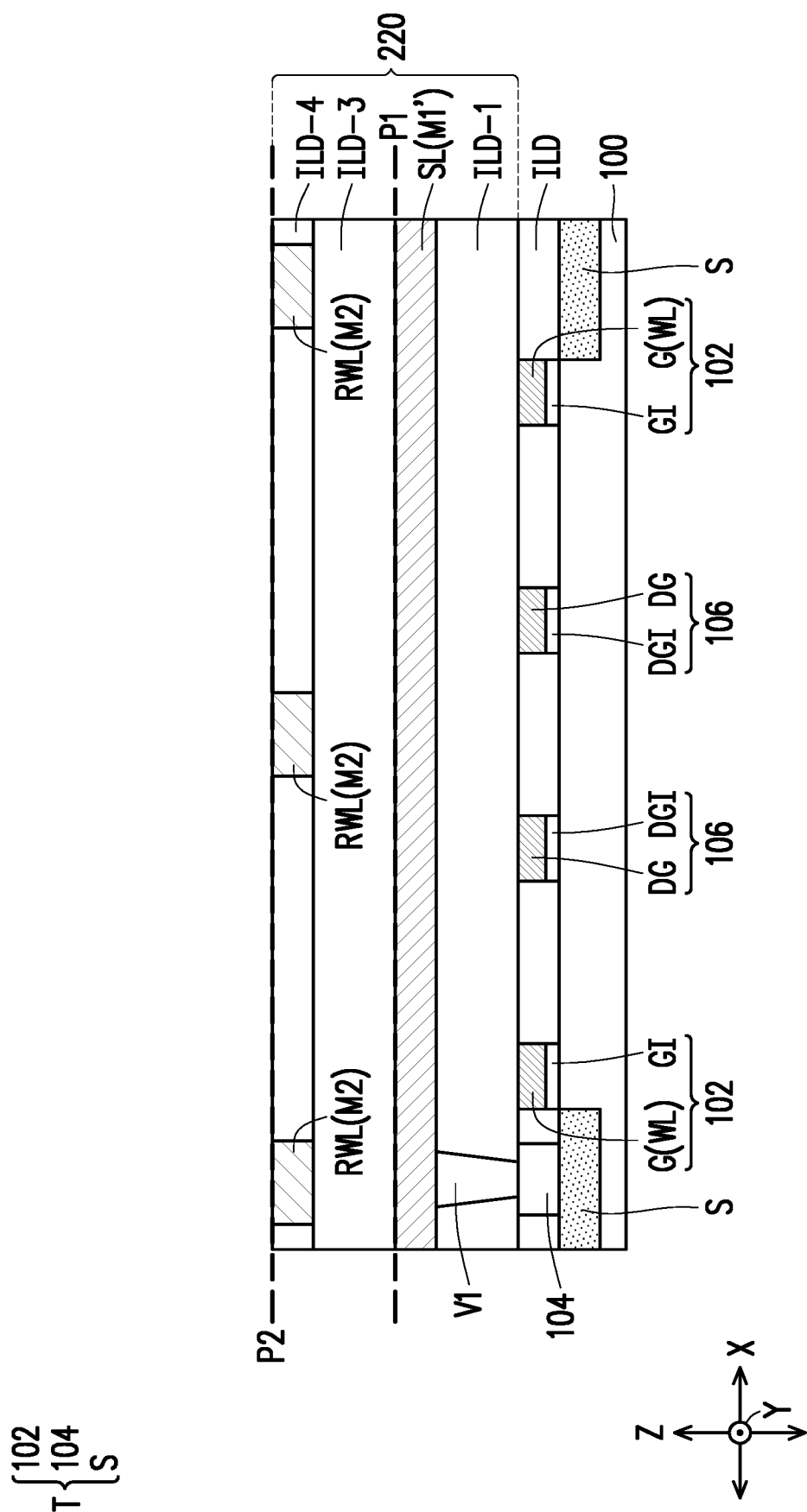
Figure 10D:
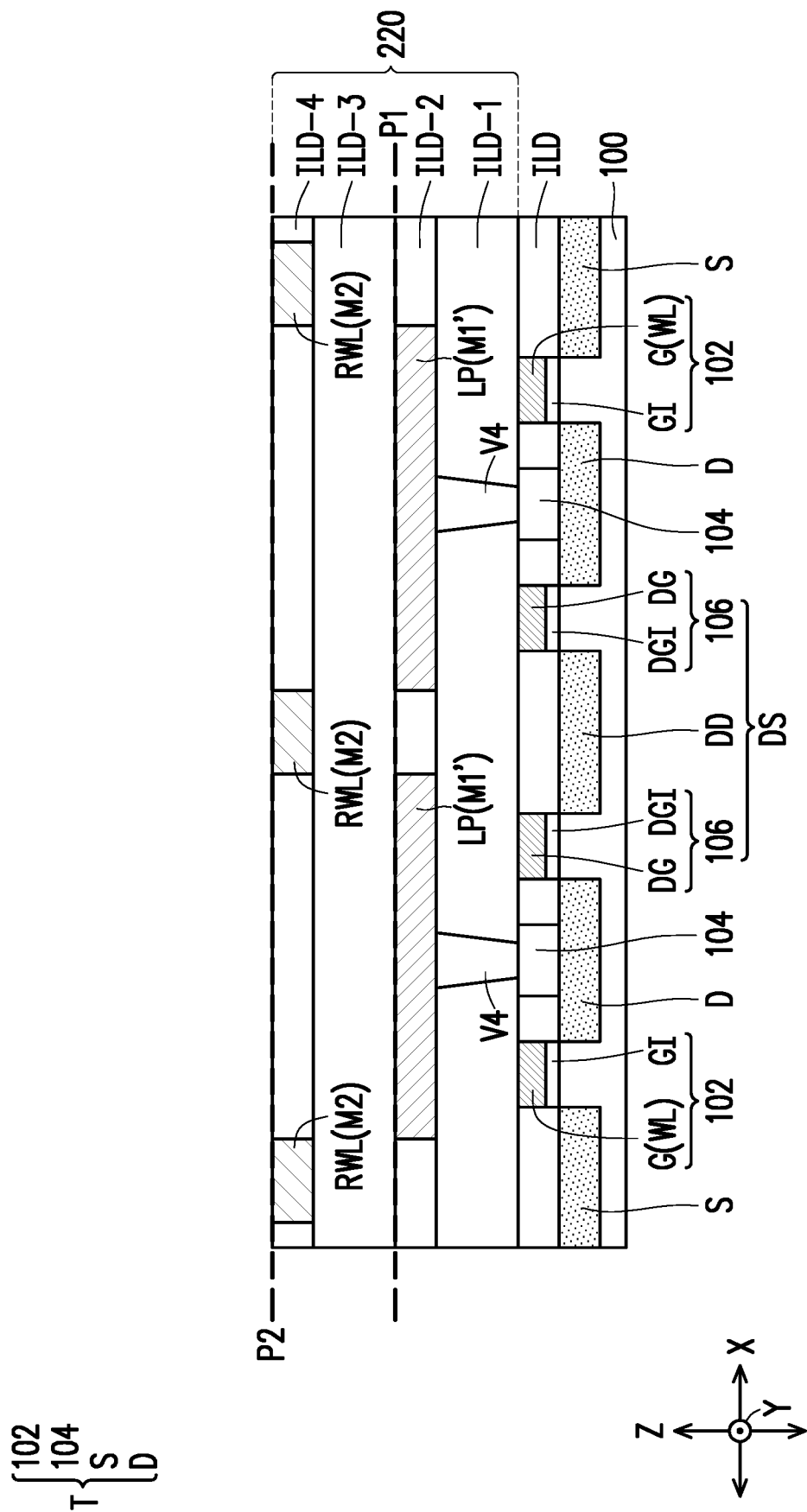

Referring to FIG. 9D and FIG. 10D, the steps described herein are similar to the steps of FIG. 4D and FIG. 5D, so the detailed description thereof is omitted herein. Accordingly, for details or descriptions of the steps described in FIG. 9D and FIG. 10D not iterated herein, please refer to the aforesaid embodiments.

Figure 9E:
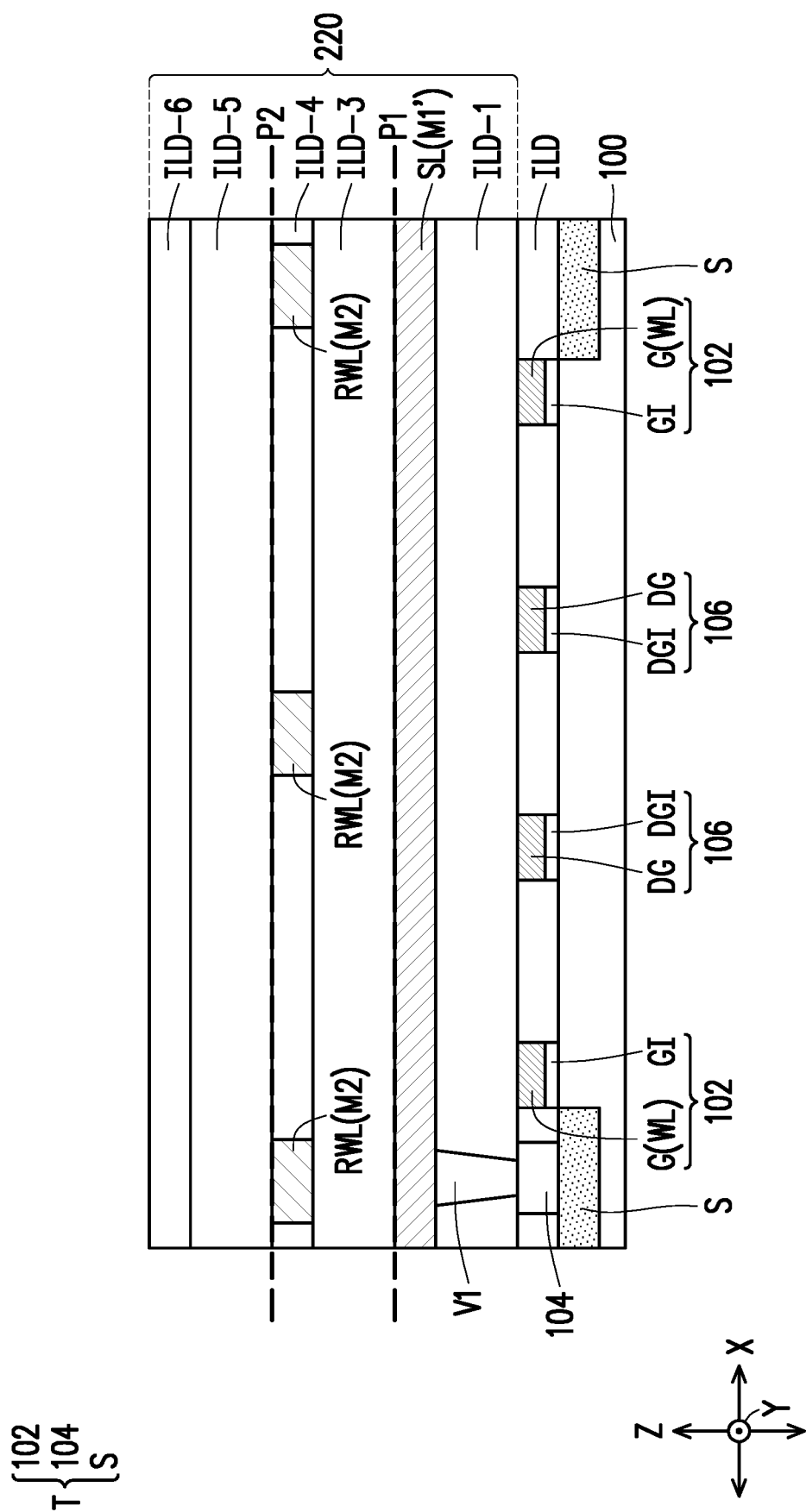
Figure 10E:
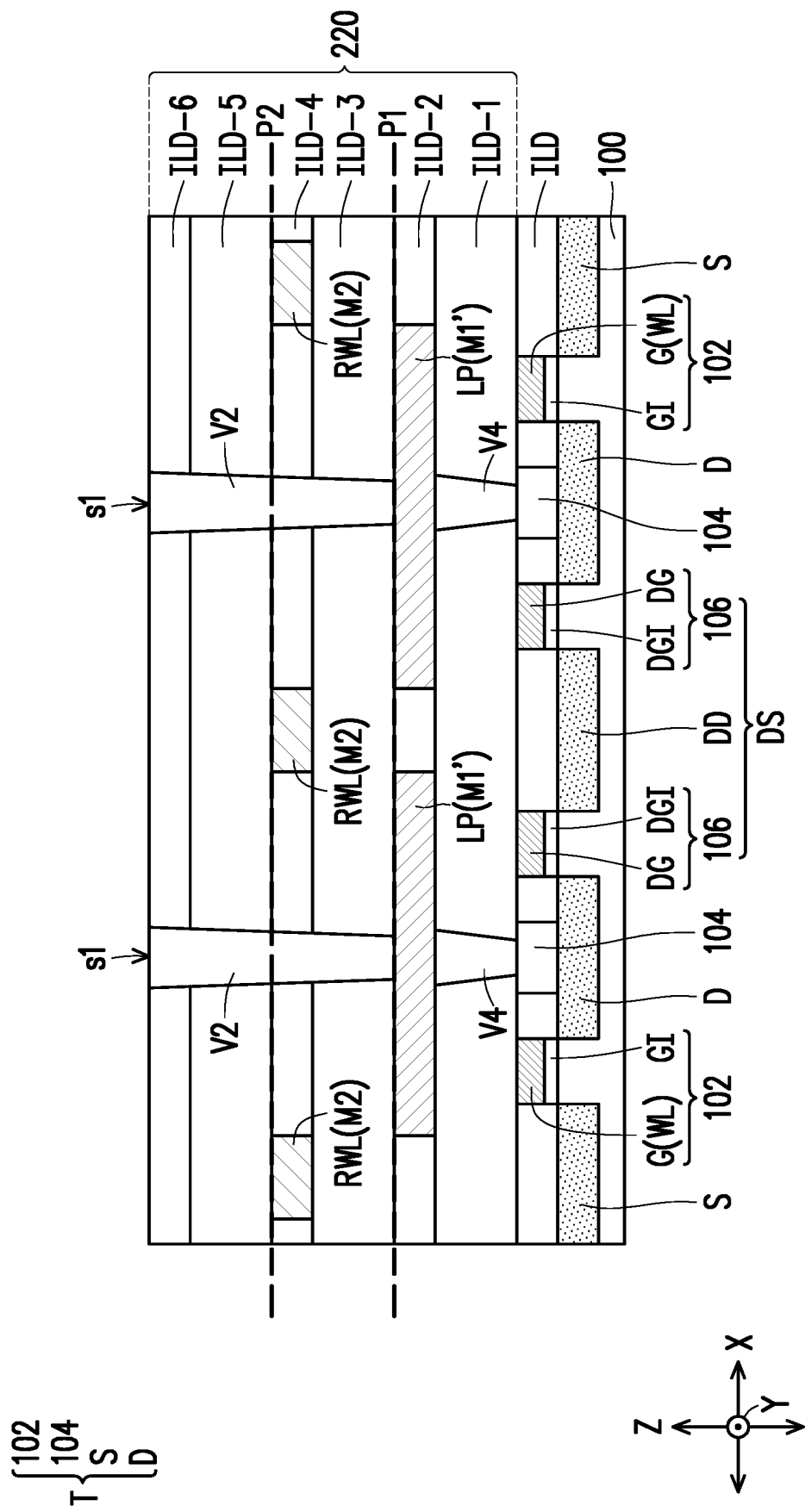

Referring to FIG. 9E and FIG. 10E, an interlayer dielectric layer ILD-5 is formed over the interlayer dielectric layer ILD-4. The details or descriptions (e.g. the materials, formation processes, positioning configurations, etc.) of the interlayer dielectric layer ILD-5 have been described in conjunction with FIG. 4E and FIG. 5E above, and will not be iterated herein again. Accordingly, for details or descriptions of the interlayer dielectric layer ILD-5 not iterated herein, please refer to the aforesaid embodiments.

Continue referring to FIG. 9E and FIG. 10E, after forming the interlayer dielectric layer ILD-5, an interlayer dielectric layer ILD-6 is formed to cover the interlayer dielectric layer ILD-5. The details or descriptions (e.g. the materials, formation processes, positioning configurations, etc.) of the interlayer dielectric layer ILD-6 have been described in conjunction with FIG. 4E and FIG. 5E above, and will not be iterated herein again. Accordingly, for details or descriptions of the interlayer dielectric layer ILD-6 not iterated herein, please refer to the aforesaid embodiments.

After forming the interlayer dielectric layer ILD-6, the interlayer dielectric layer ILD-6, the interlayer dielectric layer ILD-5, the interlayer dielectric layer ILD-4 and the interlayer dielectric layer ILD-3 are patterned to form via openings for exposing portions of the landing pads LP. In some embodiments, the operation of forming the via openings includes removing portions of the interlayer dielectric layers ILD-3 to ILD-6 by using an etching technique, such as dry etching method, photolithographic and etching method, directional etching method, or cyclotron resonance plasma etching method. Then, metallic material fills into the via openings in the interlayer dielectric layers ILD-3 to ILD-6 to form vias V2 in contact with the exposed portions of the landing pads LP. In some embodiments, the method of filling metallic material into the via openings in the interlayer dielectric layers ILD-3 to ILD-6 includes LPCVD, PECVD, ALD, non-conformal PVD (such as PLD), sputtering, evaporative deposition, cathodic arc deposition, e-beam physical vapor deposition, or other suitable process. In some embodiments, a planarization process is performed to remove the metallic material outside the via openings in the interlayer dielectric layers ILD-3 to ILD-6. In this way, the illustrated top surface s1 of the via V2 and the illustrated top surface of the interlayer dielectric layer ILD-6 are substantially flush or coplanar with each other. In some embodiments, the planarization process includes a CMP process or a mechanical grinding process. In FIG. 10E, two vias V2 are shown for simplicity. Based on the descriptions of FIG. 6 to FIG. 8 mentioned above, those skilled in the art can understand that more than two vias V2 are formed within the interlayer dielectric layers ILD-3 to ILD-6.

In some embodiments, the via V2 is a through via that penetrate through the interlayer dielectric layers ILD-3 to ILD-6. That is to say, the via V2 continuously extends through four interlayer dielectric layers of the interconnect structure 220 along the thickness direction Z. In other words, the via V2 is embedded in and laterally surrounded by four interlayer dielectric layers of the interconnect structure 220. Although the via V2 presented in FIG. 10E penetrates through four interlayer dielectric layers of the interconnect structure 220 for illustrative purposes, the disclosure is not limited thereto. The number of the interlayer dielectric layers through which the via V2 penetrates is not limited thereto, and may be equal to or greater than 2 based on design requirements. In some embodiments, as shown in FIG. 6, FIG. 9D to FIG. 9E and FIG. 10D to FIG. 10E, the via V2 embedded in the interlayer dielectric layers ILD-3 to ILD-6 is spaced apart from the rerouting word line RWL by the interlayer dielectric layer ILD-4 along the direction X. Further, as shown in FIG. 10E, the illustrated bottom surface s2 of the via V2 is in contact with the exposed portion at the illustrated top surface of the landing pad LP, and thus the landing pad LP is located below the interlayer dielectric layers through which the via V2 penetrates (e.g., the interlayer dielectric layers ILD-3 to ILD-6). Other details or descriptions (e.g. the materials, positioning configurations, electrical connection relationships, etc.) of the via V2 have been described in conjunction with FIG. 1 to FIG. 3 and FIG. 6 to FIG. 8 above, and will not be iterated herein again. Accordingly, for details or descriptions of the via V2 not iterated herein, please refer to the aforesaid embodiments.

Figure 9F:
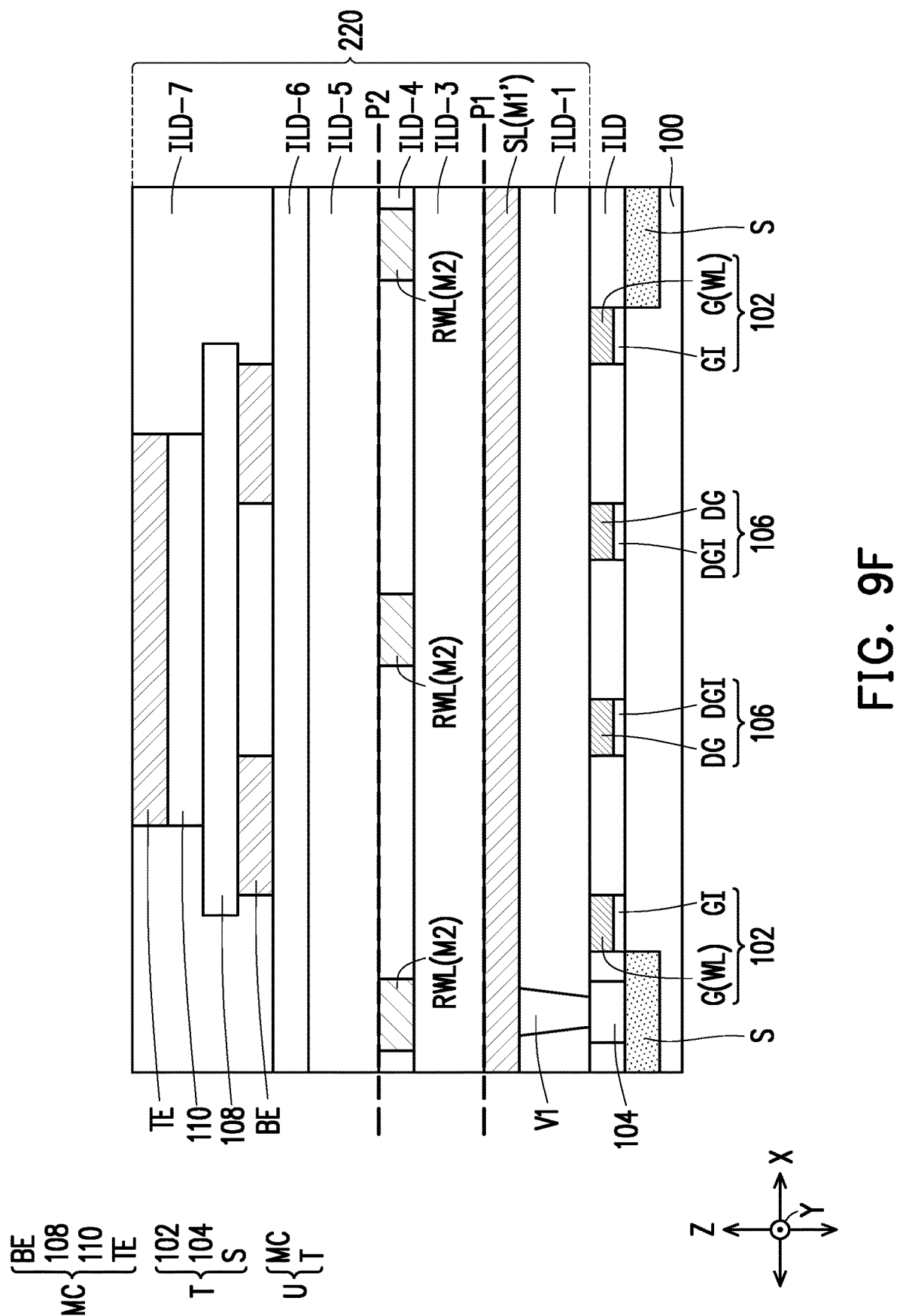
Figure 10F:
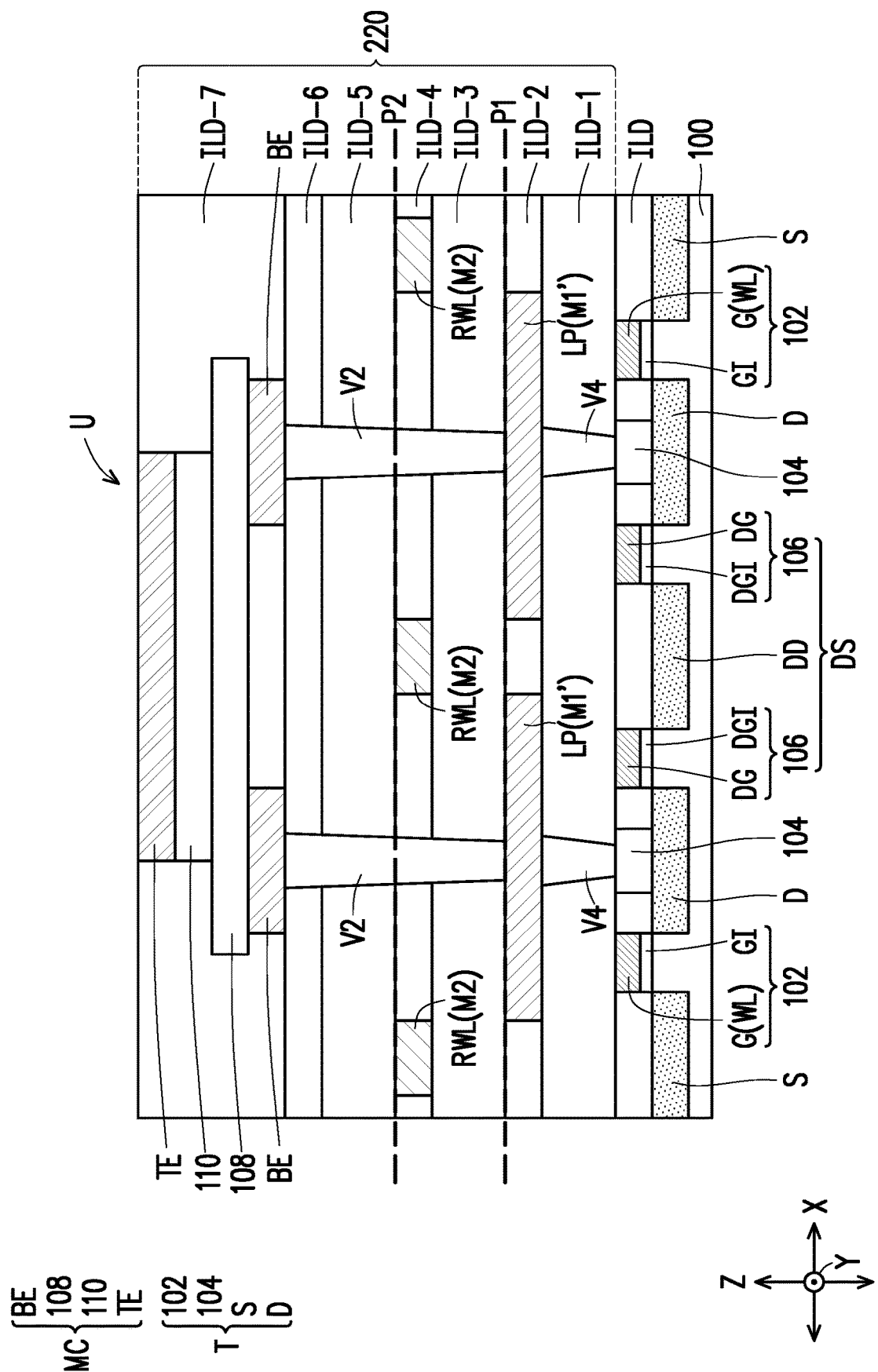

Referring to FIG. 9F and FIG. 10F, the steps described herein are similar to the steps of FIG. 4F and FIG. 5F, so the detailed description thereof is omitted herein. Accordingly, for details or descriptions of the steps described in FIG. 9F and FIG. 10F not iterated herein, please refer to the aforesaid embodiments. As shown in FIG. 6 and FIG. 10F, since in the memory unit U, the memory cell MC is electrically connected with each corresponding transistor T through the via V2 continuously extending through multiple interlayer dielectric layers (e.g., the interlayer dielectric layers ILD-3 to ILD-6) of the interconnect structure 220, a lot of spaces may be saved between the memory cell MC and the corresponding landing pads LP for the arrangement of routing lines, which includes, for example, the rerouting word lines RWL and/or other signal lines. As such, more flexibility is provided for the design of the layout of the semiconductor device 20, and the routing capacity of the semiconductor device 20 is improved. Also, the resistance between the routing lines in each metal layer between the memory cells MC and the landing pads LP can be reduced, thereby improving performance of signals flowing between the routing lines in each metal layer.

Figure 9G:
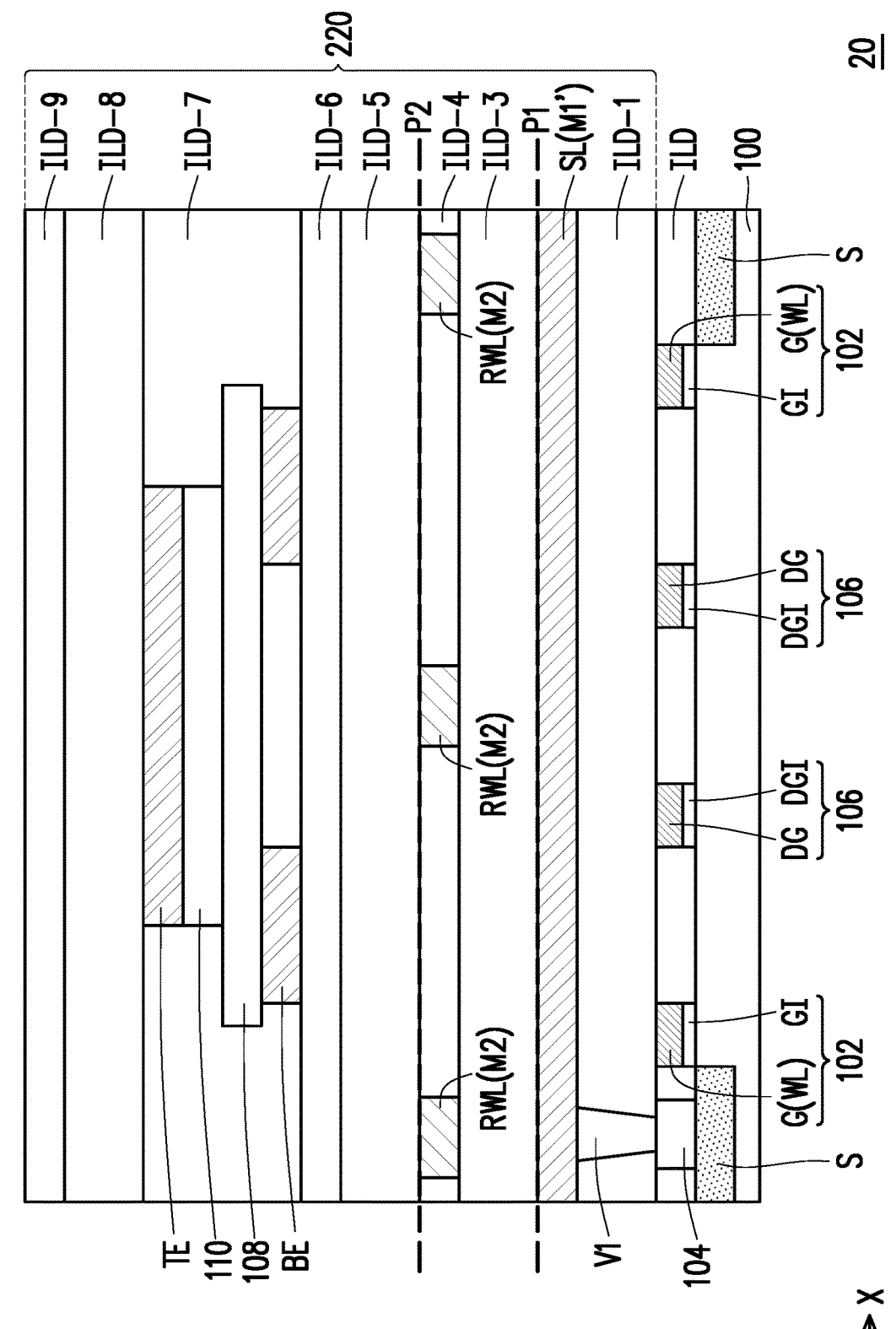
Figure 10G:
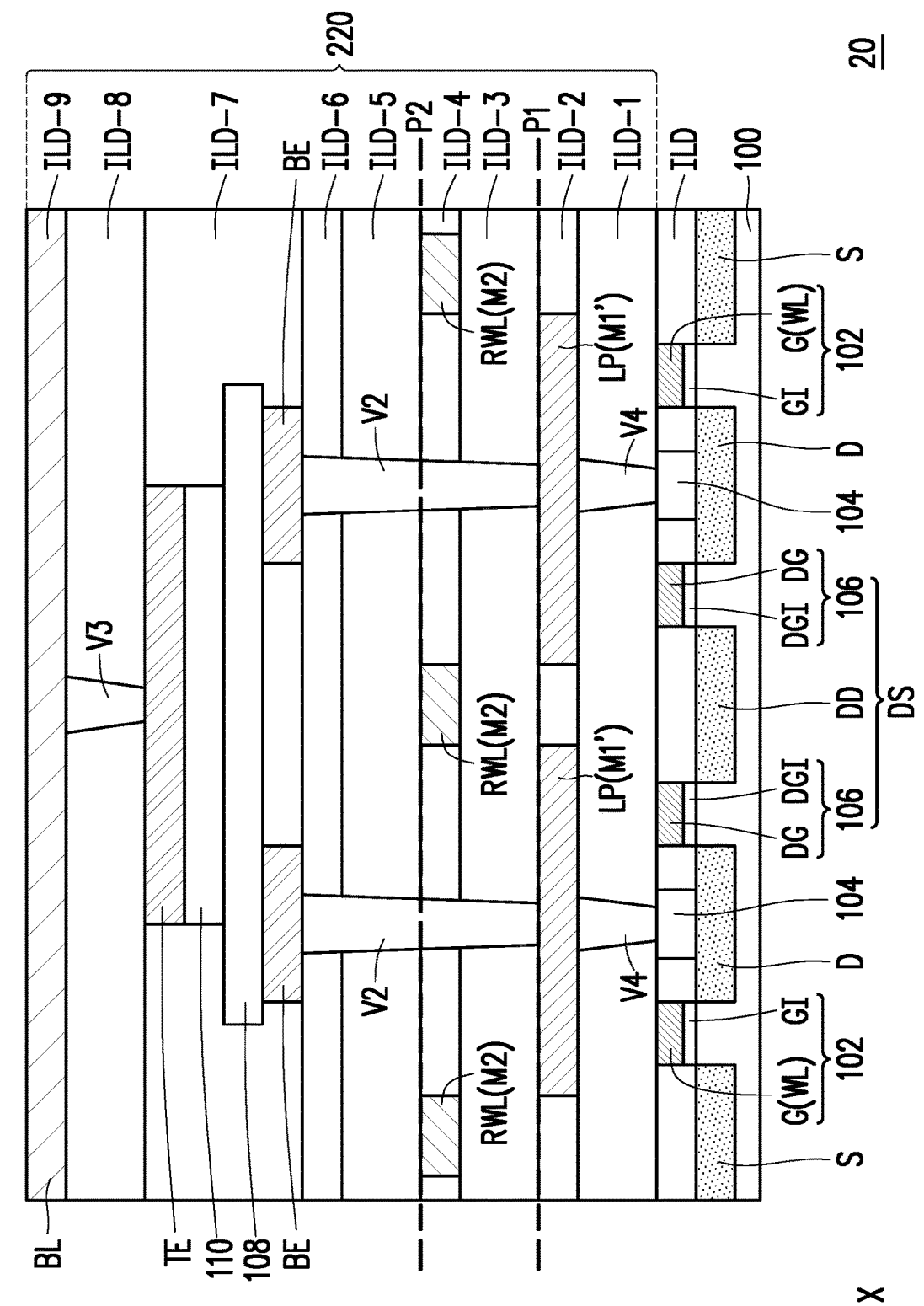

Referring to FIG. 9G and FIG. 10G, the steps described herein are similar to the steps of FIG. 4G and FIG. 5G, so the detailed description thereof is omitted herein. Accordingly, for details or descriptions of the steps described in FIG. 9G and FIG. 10G not iterated herein, please refer to the aforesaid embodiments. Since the interlayer dielectric layers ILD-2 to ILD-8 are located between the interlayer dielectric layer ILD-1 (i.e., the bottommost interlayer dielectric layer of the interconnect structure 220) and the interlayer dielectric layer ILD-9, the interlayer dielectric layer ILD-9 is referred to as a topmost interlayer dielectric layer of the interconnect structure 220, and the interlayer dielectric layers ILD-2 to ILD-8 are referred to as middle interlayer dielectric layers of the interconnect structure 220. As shown in FIG. 9G and FIG. 10G, after the metal layer M3 in the interlayer dielectric layer ILD-9 (i.e., the topmost interlayer dielectric layer of the interconnect structure 220) is formed, the semiconductor device 20 integrated with memory device is accomplished. Since the memory cell MC includes the SOT layer 108 and the MTJ stack 110, the semiconductor device 20 is a semiconductor device integrated with MRAM device. In some embodiments, as shown in FIG. 9G and FIG. 10G, the memory cells MC of the semiconductor device 20 are provided between the metal layer (not shown) in the interlayer dielectric layer ILD-6 and the metal layer M3 in the interlayer dielectric layer ILD-9. However, the disclosure is not limited thereto. In alternative embodiments, upon the process requirements, the memory cells MC of the semiconductor device 20 may be provided between two adjacent metal layers, such as between the metal layer M2 in the interlayer dielectric layer ILD-4 and the metal layer (not shown) in the interlayer dielectric layer ILD-6. Further, in some embodiments, the semiconductor device 20 is a semiconductor die.

An embodiment of the present invention relates to a semiconductor device including a semiconductor substrate and an interconnect structure. The semiconductor substrate includes a transistor, wherein the transistor has a source region and a drain region. The interconnect structure is disposed over the semiconductor substrate, wherein the interconnect structure includes a plurality of interlayer dielectric layers, a first via and a memory cell. The plurality of interlayer dielectric layers are over the semiconductor substrate. The first via is embedded in at least two interlayer dielectric layers among the plurality of interlayer dielectric layers and electrically connected with the drain region of the transistor. The memory cell is disposed over the at least two interlayer dielectric layers among the plurality of interlayer dielectric layers and electrically connected with the first via.

Another embodiment of the present invention relates to a memory device including a first transistor, a second transistor, a plurality of dielectric layers, a first via, a second via and a memory cell. The plurality of dielectric layers are over the first transistor and the second transistor. The first via extends through the plurality of dielectric layers along a first direction. The second via extends through the plurality of interlayer dielectric layers along the first direction. The memory cell is disposed over the plurality of dielectric layers, wherein the memory cell is electrically connected with a first drain region of the first transistor through the first via, and electrically connected with a second drain region of the second transistor through the second via.

Still another embodiment of the present invention relates to a method of manufacturing a semiconductor device including the followings. A semiconductor substrate having at least two transistors is provided. An interconnect structure over the semiconductor substrate is formed including the followings. A plurality of interlayer dielectric layers are formed over the semiconductor substrate. At least two vias surrounded by the plurality of interlayer dielectric layers over drain regions of the at least two transistors are formed. At least one memory cell over the at least two vias and electrically connected with the at least two vias is formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate comprising a transistor, wherein the transistor has a source region and a drain region; and
   an interconnect structure disposed over the semiconductor substrate, wherein the interconnect structure comprises:
     a plurality of interlayer dielectric layers over the semiconductor substrate;
     a first via embedded in at least two interlayer dielectric layers among the plurality of interlayer dielectric layers and electrically connected with the drain region of the transistor;
     a memory cell disposed over the at least two interlayer dielectric layers among the plurality of interlayer dielectric layers and electrically connected with the first via; and
     a first signal line embedded in a first middle interlayer dielectric layer among the plurality of interlayer dielectric layers, wherein the first signal line extends on the semiconductor substrate along a first direction, and along a thickness direction perpendicular to the first direction, a vertical projection of the first signal line is spaced apart from a vertical projection of the memory cell.

2. The semiconductor device according to claim 1, wherein the transistor has a gate structure disposed between the source region and the drain region and extending along a second direction perpendicular to the first direction and the thickness direction.

3. The semiconductor device according to claim 2, wherein the interconnect structure further comprises:
   a second via embedded in a bottommost interlayer dielectric layer among the plurality of interlayer dielectric layers, wherein
   the first middle interlayer dielectric layer is located over the bottommost interlayer dielectric layer among the plurality of interlayer dielectric layers, wherein the second via and the first signal line are electrically connected with the source region of the transistor, the first signal line extends on the bottommost interlayer dielectric layer along the first direction.

4. The semiconductor device according to claim 3, wherein the first via penetrates through the bottommost interlayer dielectric layer and the first middle interlayer dielectric layer.

5. The semiconductor device according to claim 3, wherein the first via is located over the first middle interlayer dielectric layer.

6. The semiconductor device according to claim 5, wherein the interconnect structure further comprises:
   a third via embedded in the bottommost interlayer dielectric layer among the plurality of interlayer dielectric layers; and
   a landing pad embedded in the first middle interlayer dielectric layer among the plurality of interlayer dielectric layers, wherein the third via and the landing pad are electrically connected with the drain region of the transistor, the landing pad extends on the bottommost interlayer dielectric layer along the first direction.

7. The semiconductor device according to claim 6, wherein the first via is electrically connected with the landing pad.

8. The semiconductor device according to claim 3, wherein the interconnect structure further comprises:
   a second signal line embedded in a second middle interlayer dielectric layer among the plurality of interlayer dielectric layers, wherein the second middle interlayer dielectric layer is located over the first middle interlayer dielectric layer, the second middle interlayer dielectric layer is located within the at least two interlayer dielectric layers, the second signal line is electrically connected with the gate structure of the transistor, the second signal line extends over the first middle interlayer dielectric layer along the second direction.

9. The semiconductor device according to claim 8, wherein the interconnect structure further comprises:
   a third signal line embedded in a topmost interlayer dielectric layer among the plurality of interlayer dielectric layers, wherein the topmost interlayer dielectric layer is located over the at least two interlayer dielectric layers, the third signal line is electrically connected with the memory device, and the third signal line extends over the at least two interlayer dielectric layers along the first direction.

10. A memory device, comprising:
   a first transistor and a second transistor;
   a plurality of dielectric layers over the first transistor and the second transistor;

a first via extending through the plurality of dielectric layers along a first direction;

a second via extending through the plurality of dielectric layers along the first direction; and a memory cell disposed over the plurality of dielectric layers, wherein the memory cell is electrically connected with a first drain region of the first transistor through the first via, and electrically connected with a second drain region of the second transistor through the second via.

11. The memory device according to claim 10, wherein the first transistor has a first gate structure aside the first drain region, the second transistor has a second gate structure aside the second drain region, the first gate structure is substantially parallel with the second gate structure, and the first gate structure extends along a second direction perpendicular to the first direction.

12. The memory device according to claim 11, further comprising:

a first source line and a second source line disposed between the first transistor and the memory cell, wherein the first source line and the second source line are arranged along the second direction, the first source line is substantially parallel with the second source line, the first source line extends along a third direction perpendicular to the first direction and intersected with the second direction, the first source line is electrically connected with a first source region of the first transistor, and the second source line is electrically connected with a second source region of the second transistor.

13. The memory device according to claim 12, wherein the first source line and the second source line are disposed aside the first via and the second via, and are embedded in the plurality of dielectric layers.

14. The memory device according to claim 12, wherein the first source line and the second source line are disposed under the plurality of dielectric layers.

15. The memory device according to claim 12, further comprising:

a first rerouting word line and a second rerouting word line disposed aside the first via and the second via and between the first source line and the memory cell, wherein the first rerouting word line and the second rerouting word line arranged along the third direction, the first rerouting word line is substantially parallel with the second rerouting word line, the first rerouting word line extends along the second direction, the first rerouting word line is electrically connected with the first gate structure, and the second source line is electrically connected with the second gate structure.

16. The memory device according to claim 12, further comprising:

a bit line disposed over the memory unit and overlapped with the memory cell, the first via and the second via, wherein the bit line extends along the third direction, the bit line is electrically connected with the memory cell.

17. The memory device according to claim 12, further comprising:

at least one dummy transistor disposed between the first transistor and the second transistor, wherein the at least one dummy transistor has a dummy gate structure substantially parallel with the first gate structure and disposed between the first gate structure and the second gate structure.

18. A method of manufacturing a semiconductor device, comprising:

providing a semiconductor substrate having at least two transistors; and forming an interconnect structure over the semiconductor substrate comprising:

forming a plurality of interlayer dielectric layers over the semiconductor substrate;

forming at least two vias surrounded by the plurality of interlayer dielectric layers over drain regions of the at least two transistors; and forming at least one memory cell over the at least two vias and electrically connected with the at least two vias.

19. The method according to claim 18, wherein the step of forming the interconnect structure over the semiconductor substrate further comprises:

forming at least two landing pads between the drain regions of the at least two transistors and the at least two vias, the at least two vias overlapping the at least two landing pads.

20. The method according to claim 18, wherein the step of forming the interconnect structure over the semiconductor substrate further comprises:

forming at least one signal line over the at least one memory cell, the at least one signal line overlapping the at least one memory cell and the at least two vias.

* * * * *